United States Patent
Okajima et al.

(10) Patent No.: US 11,900,986 B2
(45) Date of Patent: Feb. 13, 2024

(54) SEMICONDUCTOR MEMORY DEVICE WITH A PLURALITY OF MEMORY UNITS

(71) Applicant: Kioxia Corporation, Tokyo (JP)

(72) Inventors: Mutsumi Okajima, Yokkaichi Mie (JP); Mamoru Ishizaka, Hiratsuka Kanagawa (JP)

(73) Assignee: Kioxia Corporation, Tokyo (JP)

( * ) Notice: Subject to any disclaimer, the term of this patent is extended or adjusted under 35 U.S.C. 154(b) by 130 days.

(21) Appl. No.: 17/549,262

(22) Filed: Dec. 13, 2021

(65) Prior Publication Data

US 2022/0406363 A1 Dec. 22, 2022

(30) Foreign Application Priority Data

Jun. 21, 2021 (JP) ................................ 2021-102803

(51) Int. Cl.
   *G11C 11/4091* (2006.01)
   *G11C 5/02* (2006.01)
   *H01L 23/48* (2006.01)

(52) U.S. Cl.
   CPC .......... *G11C 11/4091* (2013.01); *G11C 5/025* (2013.01); *H01L 23/481* (2013.01)

(58) Field of Classification Search
   CPC .......................... G11C 11/4091; G11C 5/025
   USPC ....................................................... 365/149
   See application file for complete search history.

(56) References Cited

U.S. PATENT DOCUMENTS

| | | | |
|---|---|---|---|
| 9,514,792 B2 | 12/2016 | Kajigaya | |
| 9,806,082 B2 | 10/2017 | Tanaka et al. | |
| 10,692,869 B2 | 6/2020 | Takemura et al. | |
| 10,784,272 B2 | 9/2020 | Lee et al. | |
| 2019/0006422 A1* | 1/2019 | Park | H10B 63/24 |
| 2019/0087324 A1* | 3/2019 | Takeda | G06F 3/0647 |
| 2019/0108119 A1* | 4/2019 | Gholamipour | G06F 3/0616 |
| 2019/0252386 A1 | 8/2019 | Lee et al. | |
| 2020/0083225 A1 | 3/2020 | Ma et al. | |
| 2020/0105330 A1 | 4/2020 | Kimura et al. | |
| 2020/0211631 A1 | 7/2020 | Karda et al. | |
| 2020/0227416 A1 | 7/2020 | Lilak et al. | |
| 2020/0227418 A1 | 7/2020 | Kim et al. | |
| 2020/0251151 A1 | 8/2020 | Kang et al. | |
| 2020/0388625 A1 | 12/2020 | Lee et al. | |
| 2021/0091108 A1* | 3/2021 | Naruke | H01L 23/5226 |

* cited by examiner

*Primary Examiner* — Connie C Yoha
(74) *Attorney, Agent, or Firm* — Foley & Lardner LLP

(57) ABSTRACT

A semiconductor memory device includes: memory units arranged in a first direction; first semiconductor layers arranged in the first direction and electrically connected to the memory units; first gate electrodes arranged in the first direction and opposed to the first semiconductor layers; a first wiring extending in the first direction and connected to the first semiconductor layers; second wirings arranged in the first direction, and connected to the first gate electrodes; second semiconductor layers arranged in the first direction and disposed at first end portions of the second wirings; second gate electrodes arranged in the first direction and opposed to the second semiconductor layers; third semiconductor layers arranged in the first direction and disposed at second end portions of the second wirings; and third gate electrodes arranged in the first direction and opposed to the third semiconductor layers.

19 Claims, 71 Drawing Sheets

SEMICONDUCTOR MEMORY DEVICE WITH A PLURALITY OF MEMORY UNITS

CROSS-REFERENCE TO RELATED APPLICATIONS

This application is based upon and claims the benefit of Japanese Patent Application No. 2021-102803, filed on Jun. 21, 2021, the entire contents of which are incorporated herein by reference.

BACKGROUND

Field

Embodiments described herein relate generally to a semiconductor memory device.

Description of the Related Art

In association with high integration of semiconductor memory devices, three-dimensional semiconductor memory devices have been examined.

DETAILED DESCRIPTION

Figure 1:
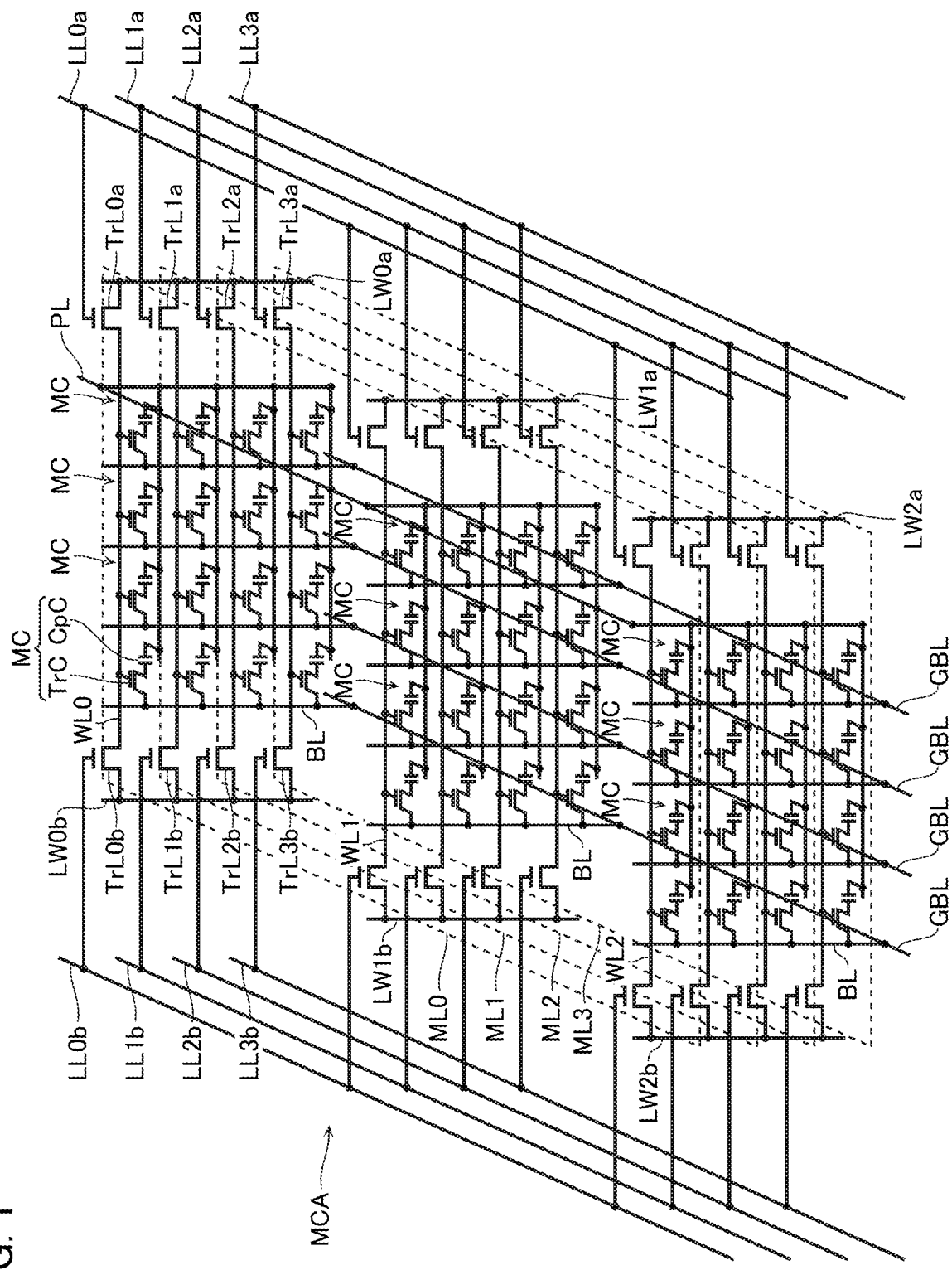
FIG. 1 is a schematic circuit diagram illustrating a configuration of a semiconductor memory device according to a first embodiment.

A semiconductor memory device according to one embodiment comprises: a plurality of memory units arranged in a first direction; a plurality of first semiconductor layers arranged in the first direction and electrically connected to the plurality of memory units; a plurality of first gate electrodes arranged in the first direction and opposed to the plurality of first semiconductor layers; a first wiring extending in the first direction and connected to the plurality of first semiconductor layers; a plurality of second wirings arranged in the first direction, extending in a second direction intersecting with the first direction, and connected to the plurality of first gate electrodes; a plurality of second semiconductor layers arranged in the first direction and disposed at first end portions in the second direction of the plurality of second wirings; a plurality of second gate electrodes arranged in the first direction and opposed to the plurality of second semiconductor layers; a plurality of third semiconductor layers arranged in the first direction and disposed at second end portions in the second direction of the plurality of second wirings; and a plurality of third gate electrodes arranged in the first direction and opposed to the plurality of third semiconductor layers.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Circuit Configuration]

FIG. 1 is a schematic circuit diagram illustrating a configuration of a semiconductor memory device according to the first embodiment. As illustrated in FIG. 1, the semiconductor memory device according to the embodiment includes a memory cell array MCA. The memory cell array MCA includes a plurality of memory layers ML0 to ML3, a plurality of bit lines BL connected to these plurality of memory layers ML0 to ML3, a plurality of global bit lines GBL electrically connected to the plurality of bit lines BL, and a plate line PL connected to the plurality of memory layers ML0 to ML3.

The memory layers ML0 to ML3 each include a plurality of word lines WL0 to WL2 and a plurality of memory cells MC connected to these plurality of word lines WL0 to WL2. The memory cells MC each include a transistor TrC and a capacitor CpC. The transistor TrC has a source electrode connected to the bit line BL. The transistor TrC has a drain electrode connected to the capacitor CpC. The transistor TrC has a gate electrode connected to any of the word lines WL0 to WL2. One electrode of the capacitor CpC is connected to the drain electrode of the transistor TrC. The other electrode of the capacitor CpC is connected to the plate line PL.

Each of the bit lines BL is connected to a plurality of the memory cells MC corresponding to the plurality of memory layers ML0 to ML3. Each of the bit lines BL is connected to the global bit line GBL.

The memory layers ML0 to ML3 respectively include a plurality of transistors TrL0a and TrL0b, TrL1a and TrL1b, TrL2a and TrL2b, and TrL3a and TrL3b (hereinafter referred to as "transistor TrL" in some cases) disposed corresponding to each of a plurality of the word lines WL0 to WL2. Drain electrodes of the transistors TrL are each connected to any of the word lines WL0 to WL2. Source electrodes of the transistors TrL are each connected to any of word line select lines LW0a, LW0b, LW1a, LW1b, LW2a, and LW2b (hereinafter referred to as "word line select line LW" in some cases). Gate electrodes of the transistors TrL are each connected to any of layer select lines LL0a, LL0b, LL1a, LL1b, LL2a, LL2b, LL3a, and LL3b (hereinafter referred to as "layer select line LL" in some cases).

The word line select line LW is connected to a plurality of the transistors TrL corresponding to a plurality of the memory layers ML0 to ML3. The layer select lines LL0a, LL1a, LL2a, and dLL3a are respectively connected commonly to all of the transistors TrL0a, TrL1a, TrL2a, and TrL3a corresponding to the memory layers ML0 to ML3. Similarly, the layer select lines LL0b, LL1b, LL2b, LL3b are respectively connected commonly to all of the transistors TrL0b, TrL1b, TrL2b, TrL3b corresponding to the memory layers ML0 to ML3.

[Read Operation]

Figure 2:
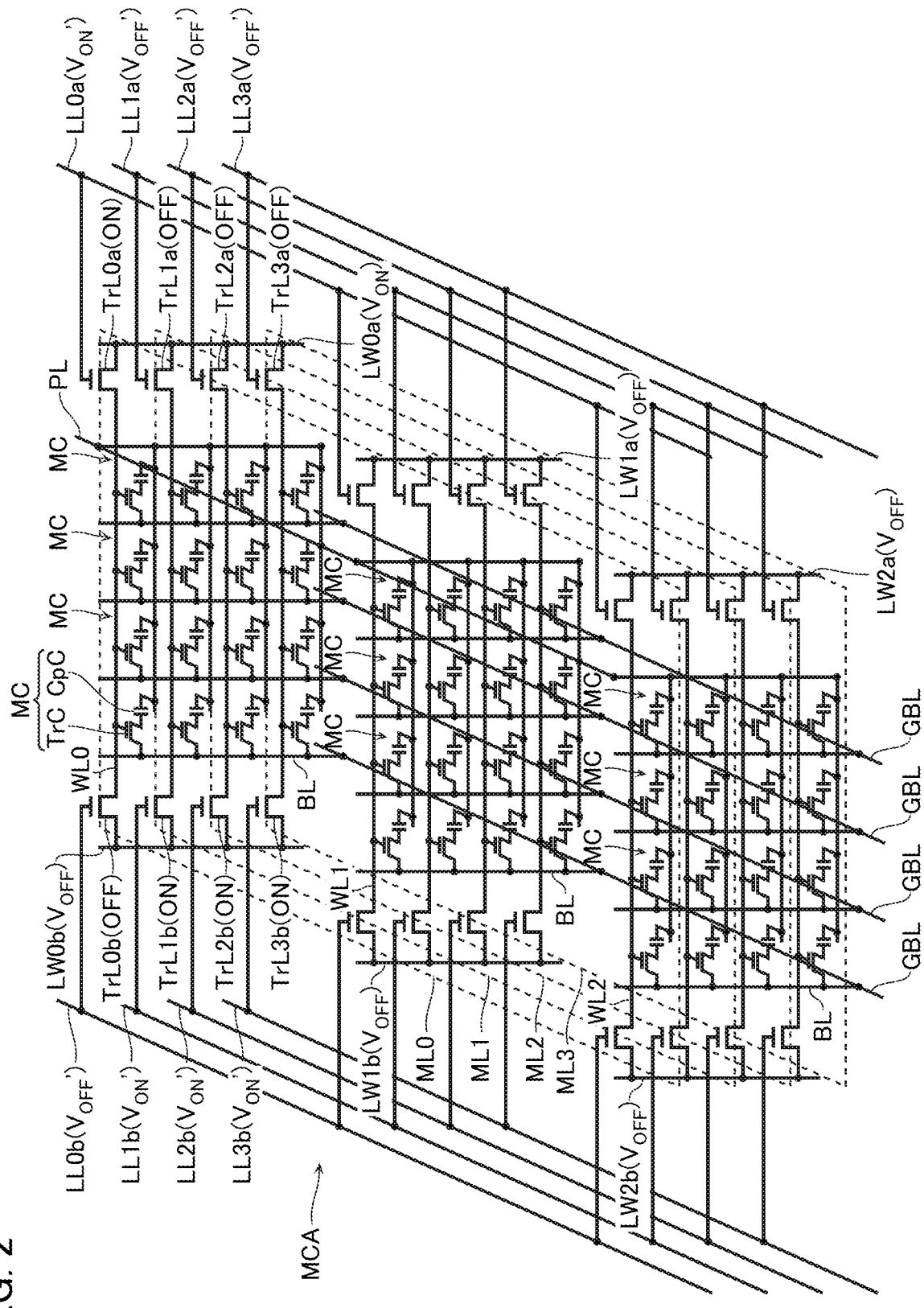
FIG. 2 is a schematic circuit diagram for describing a read operation of the semiconductor memory device.

FIG. 2 is a schematic circuit diagram for describing a read operation of the semiconductor memory device according to the first embodiment.

In the read operation, one of the plurality of memory layers ML0 to ML3 is selected. In the illustrated example, the memory layer ML0 is selected. In the selection of the memory layers ML0 to ML3, for example, a voltage $V_{ON}'$ is applied to the layer select line LL0a corresponding to the memory layer ML0 as a target of the read operation among the plurality of layer select lines LL0a, LL1a, LL2a, and LL3a, and a voltage $V_{OFF}'$ is applied to the other layer select lines LL1a, LL2a, and LL3a. For example, the voltage $V_{OFF}'$ is applied to the layer select line LL0b corresponding to the memory layer ML0 as a target of the read operation among the plurality of layer select lines LL0b, LL1b, LL2b, and LL3b, and the voltage $V_{ON}'$ is applied to the other layer select lines LL1b, LL2b, and LL3b.

The voltage $V_{ON}'$ has a magnitude, for example, enough to turn ON the transistor TrL. The voltage $V_{OFF}'$ has a magnitude, for example, enough to turn OFF the transistor TrL. For example, when the transistor TrL is an NMOS transistor, the voltage $V_{ON}'$ is larger than the voltage $V_{OFF}'$. For example, when the transistor TrL is a PMOS transistor, the voltage $V_{ON}'$ is smaller than the voltage $V_{OFF}'$. The example in which the transistor TrL is an NMOS transistor will be described below.

In the read operation, one of the plurality of word lines WL0 to WL2 is selected. In the illustrated example, the word line WL0 is selected. In the selection of the word lines WL0 to WL2, for example, a voltage $V_{ON}$ is applied to the word line select line LW0a corresponding to the word line WL0 as a target of the read operation among the plurality of word line select lines LW0a, LW1a, and LW2a, and a voltage $V_{OFF}$ is applied to the other layer select lines LW1a, LW2a. For example, the voltage $V_{OFF}$ is applied to the plurality of word line select lines LW0b, LW1b, and LW2b.

The voltage $V_{ON}$ has a magnitude, for example, enough to turn ON the transistor TrC. The voltage $V_{OFF}$ has a magnitude, for example, enough to turn OFF the transistor TrC. For example, when the transistor TrC is an NMOS transistor, the voltage $V_{ON}$ is larger than the voltage $V_{OFF}$. For example, when the transistor TrC is a PMOS transistor, the voltage $V_{ON}$ is smaller than the voltage $V_{OFF}$. The example in which the transistor TrC is an NMOS transistor will be described below.

Here, the voltage $V_{ON}$ is applied to the word line WL0 (hereinafter referred to as "selected word line WL0") connected to the memory cell MC (hereinafter referred to as "selected memory cell MC") as a target of the read operation via the transistor TrL0a. Accordingly, the transistor TrC in the selected memory cell MC turns ON. In association with this, a voltage of the global bit line GBL fluctuates, or a current flows in the global bit line GBL. By detecting this voltage fluctuation or current, data stored in the selected memory cell MC can be read out.

The voltage $V_{OFF}$ is applied to the word lines WL1, WL2 (hereinafter referred to as "unselected word lines WL1, WL2" or the like) other than the selected word line WL0 corresponding to the memory layer ML0 the same as the selected memory cell MC via the transistors TrL0a. Accordingly, the transistors TrC in the memory cells MC turn OFF.

The voltage $V_{OFF}$ is applied to the unselected word lines WL0, WL1, and WL2 corresponding to the memory layers ML1, ML2, and ML3 different from the selected memory cell MC via the transistors TrL1b, TrL2b, and TrL3b. Accordingly, the transistors TrC in the memory cells MC turn OFF.

Figure 3:
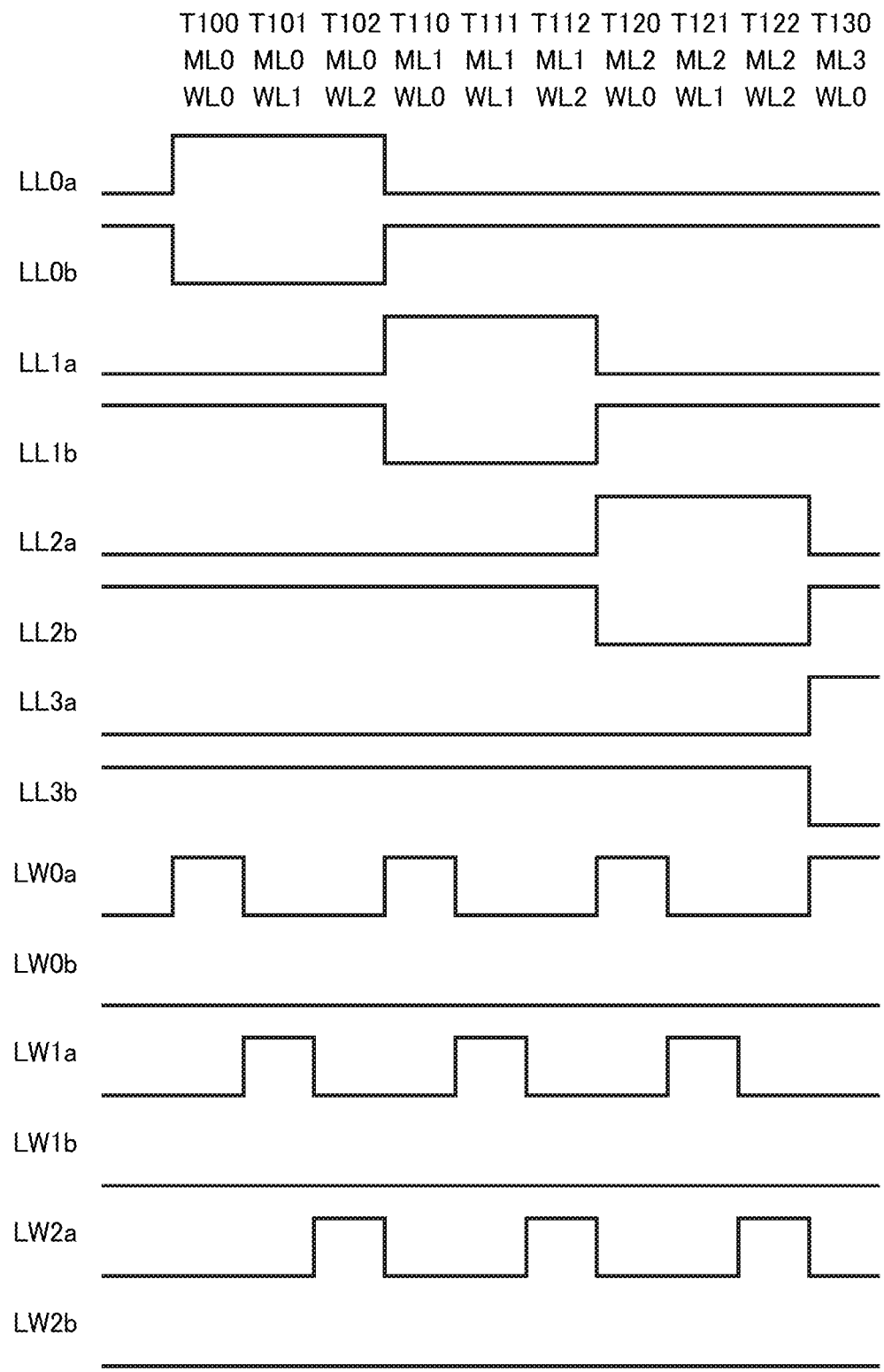
FIG. 3 is a schematic waveform diagram for describing the read operation of the semiconductor memory device.

FIG. 3 is a schematic waveform diagram for describing an example of executing the read operation. In the example of FIG. 3, the read operations corresponding to the plurality of word lines WL0 to WL2 included in the memory layer ML0 are sequentially executed, the read operations corresponding to the plurality of word lines WL0 to WL2 included in the memory layer ML1 are sequentially executed, the read operations corresponding to the plurality of word lines WL0 to WL2 included in the memory layer ML2 are sequentially executed, and further, the read operation corresponding to the word line WL0 included in the memory layer ML3 is executed.

That is, in the example of FIG. 3, the read operation on the plurality of memory cells MC connected to the word line WL0 included in the memory layer ML0 is executed in a time period T100. The read operation on the plurality of memory cells MC connected to the word line WL1 included in the memory layer ML0 is executed in a time period T101. The read operation on the plurality of memory cells MC connected to the word line WL2 included in the memory layer ML0 is executed in a time period T102.

The read operation on the plurality of memory cells MC connected to the word line WL0 included in the memory layer ML1 is executed in a time period T110. The read operation on the plurality of memory cells MC connected to the word line WL1 included in the memory layer ML1 is executed in a time period T111. The read operation on the plurality of memory cells MC connected to the word line WL2 included in the memory layer ML1 is executed in a time period T112.

The read operation on the plurality of memory cells MC connected to the word line WL0 included in the memory layer ML2 is executed in a time period T120. The read operation on the plurality of memory cells MC connected to the word line WL1 included in the memory layer ML2 is executed in a time period T121. The read operation on the plurality of memory cells MC connected to the word line WL2 included in the memory layer ML2 is executed in a time period T122.

The read operation on the plurality of memory cells MC connected to the word line WL0 included in the memory layer ML3 is executed in a time period T130.

Figure 4:
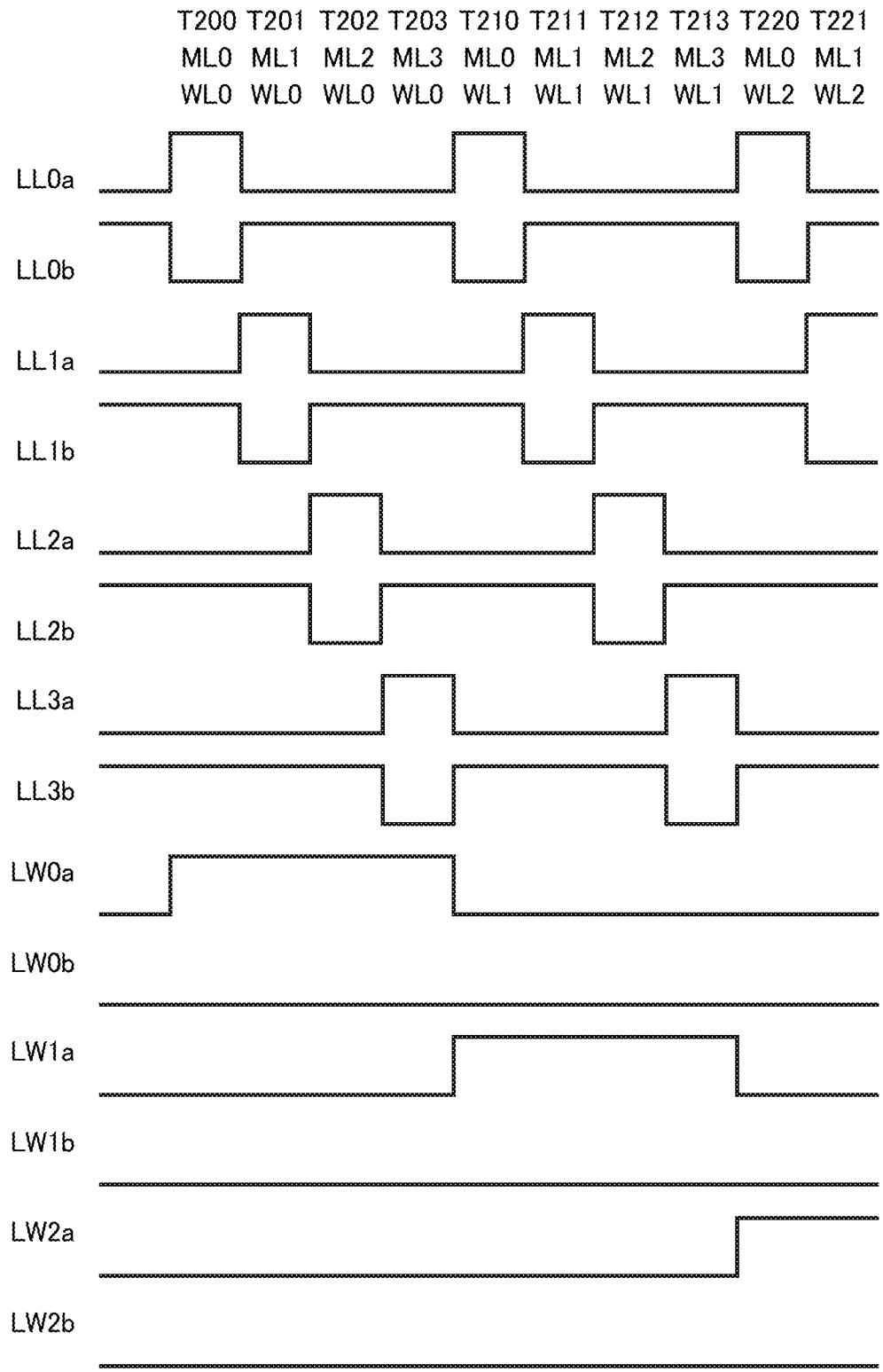
FIG. 4 is a schematic waveform diagram for describing the read operation of the semiconductor memory device.

FIG. 4 is a schematic waveform diagram for describing another example of executing the read operation. In the example of FIG. 4, the read operations corresponding to the word lines WL0 included in the respective memory layers ML0 to ML3 are sequentially executed, the read operations corresponding to the word lines WL1 included in the respective memory layers ML0 to ML3 are sequentially executed, and further, the read operations corresponding to the word lines WL2 included in the respective memory layers ML0, ML1 are sequentially executed.

That is, in the example of FIG. 4, the read operation on the plurality of memory cells MC connected to the word line WL0 included in the memory layer ML0 is executed in a time period T200. The read operation on the plurality of memory cells MC connected to the word line WL0 included in the memory layer ML1 is executed in a time period T201. The read operation on the plurality of memory cells MC connected to the word line WL0 included in the memory layer ML2 is executed in a time period T202. The read operation on the plurality of memory cells MC connected to the word line WL0 included in the memory layer ML3 is executed in a time period T203.

The read operation on the plurality of memory cells MC connected to the word line WL1 included in the memory layer ML0 is executed in a time period T210. The read operation on the plurality of memory cells MC connected to the word line WL1 included in the memory layer ML1 is executed in a time period T211. The read operation on the plurality of memory cells MC connected to the word line WL1 included in the memory layer ML2 is executed in a time period T212. The read operation on the plurality of memory cells MC connected to the word line WL1 included in the memory layer ML3 is executed in a time period T213.

The read operation on the plurality of memory cells MC connected to the word line WL2 included in the memory layer ML0 is executed in a time period T220. The read operation on the plurality of memory cells MC connected to the word line WL2 included in the memory layer ML1 is executed in a time period T221.

FIG. 3 and FIG. 4 illustrate an example in which the voltage is applied to the word lines WL0 to WL2 in the memory layers ML0 to ML3 as the targets of the read operations via the transistors TrL0a, TrL1a, TrL2a, and TrL3a. FIG. 3 and FIG. 4 illustrate the example in which the voltage is applied to the other word lines WL0 to WL2 in the memory layers ML0 to ML3 via the transistors TrL0b, TrL1b, TrL2b, and TrL3b. However, for example, the voltage applied to the transistors TrL0a, TrL1a, TrL2a, and TrL3a in the example of FIG. 3 and FIG. 4 may be applied to the transistors TrL0b, TrL1b, TrL2b, and TrL3b, and the voltage applied to the transistors TrL0b, TrL1b, TrL2b, and TrL3b in the example of FIG. 3 and FIG. 4 may be applied to the transistors TrL0a, TrL1a, TrL2a, and TrL3a.

[Structure]

Figure 5:
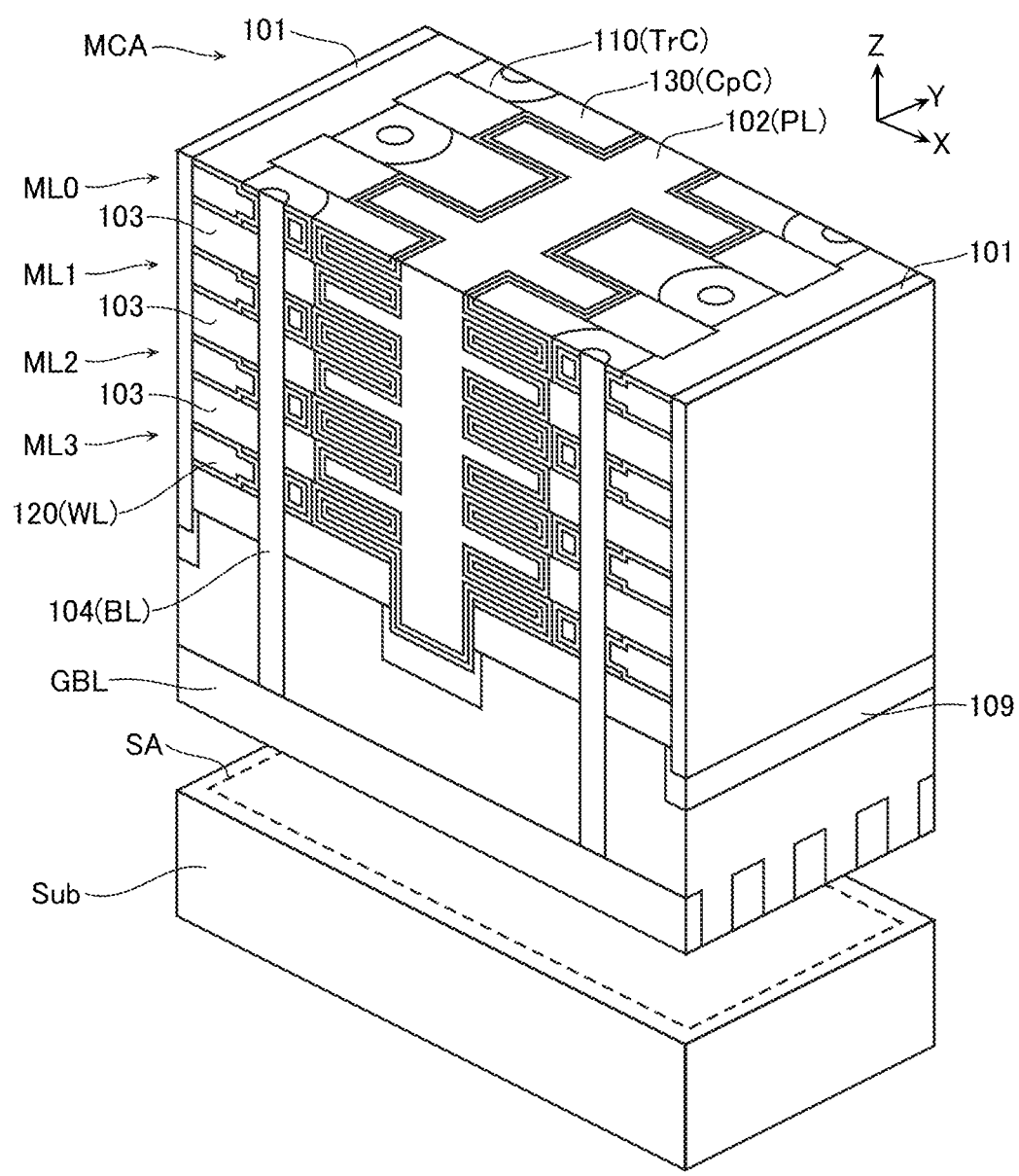
FIG. 5 is a schematic perspective view illustrating a part of the configuration of the semiconductor memory device.
Figure 6:
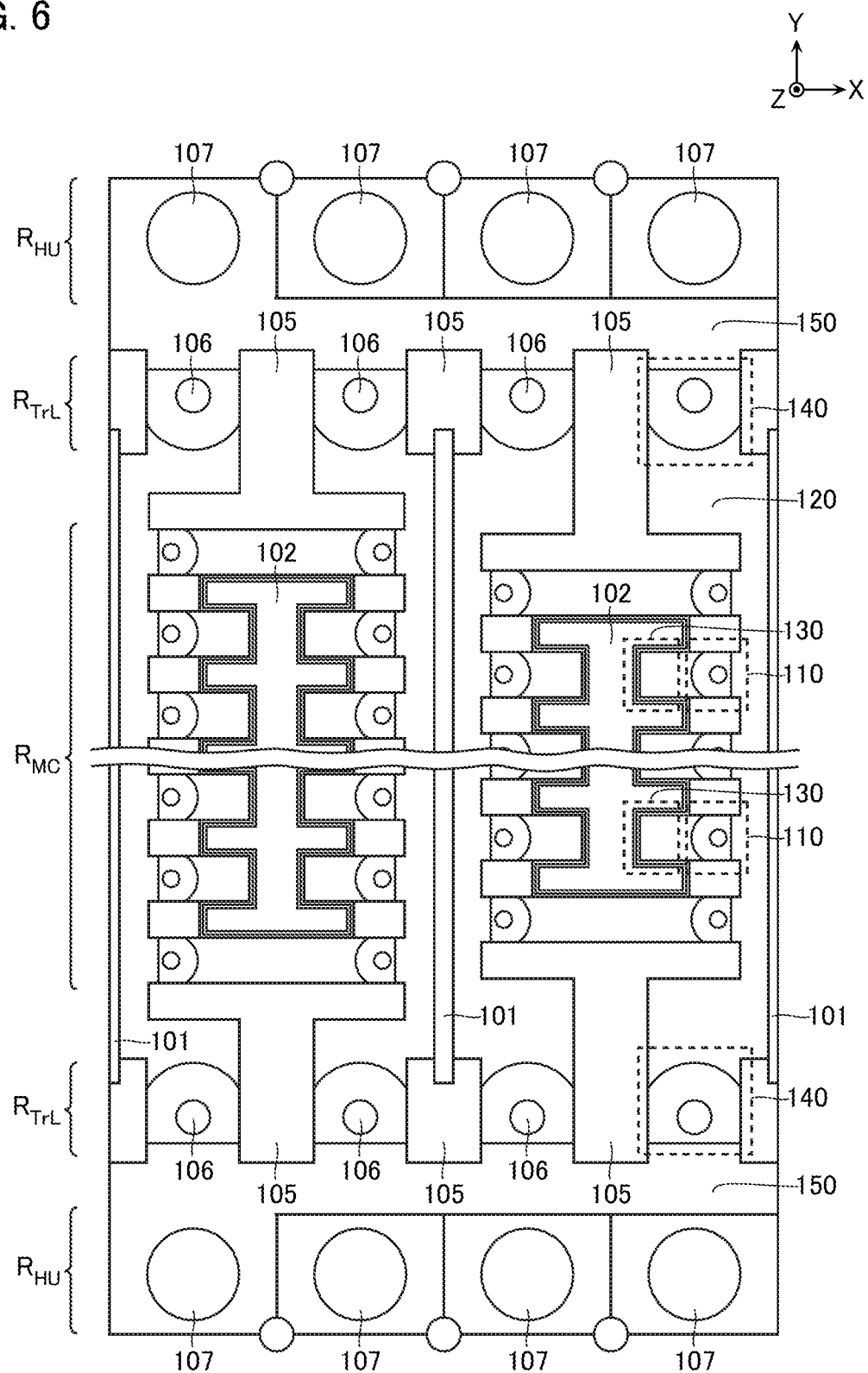
FIG. 6 is a schematic X-Y cross-sectional view illustrating a part of the configuration of the semiconductor memory device.
Figure 7:
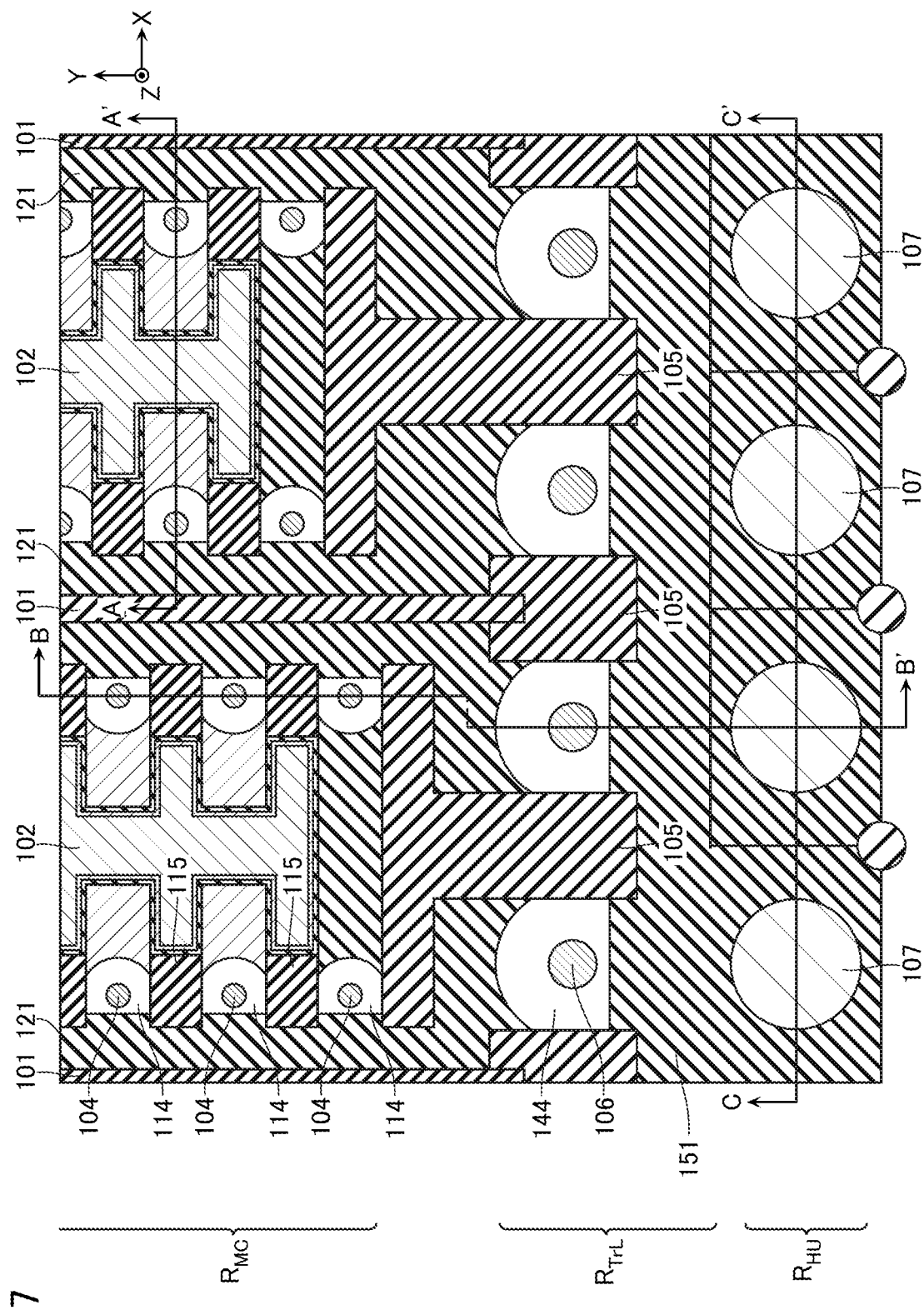
FIG. 7 is a schematic X-Y cross-sectional view illustrating a part of the configuration of the semiconductor memory device.
Figure 8:
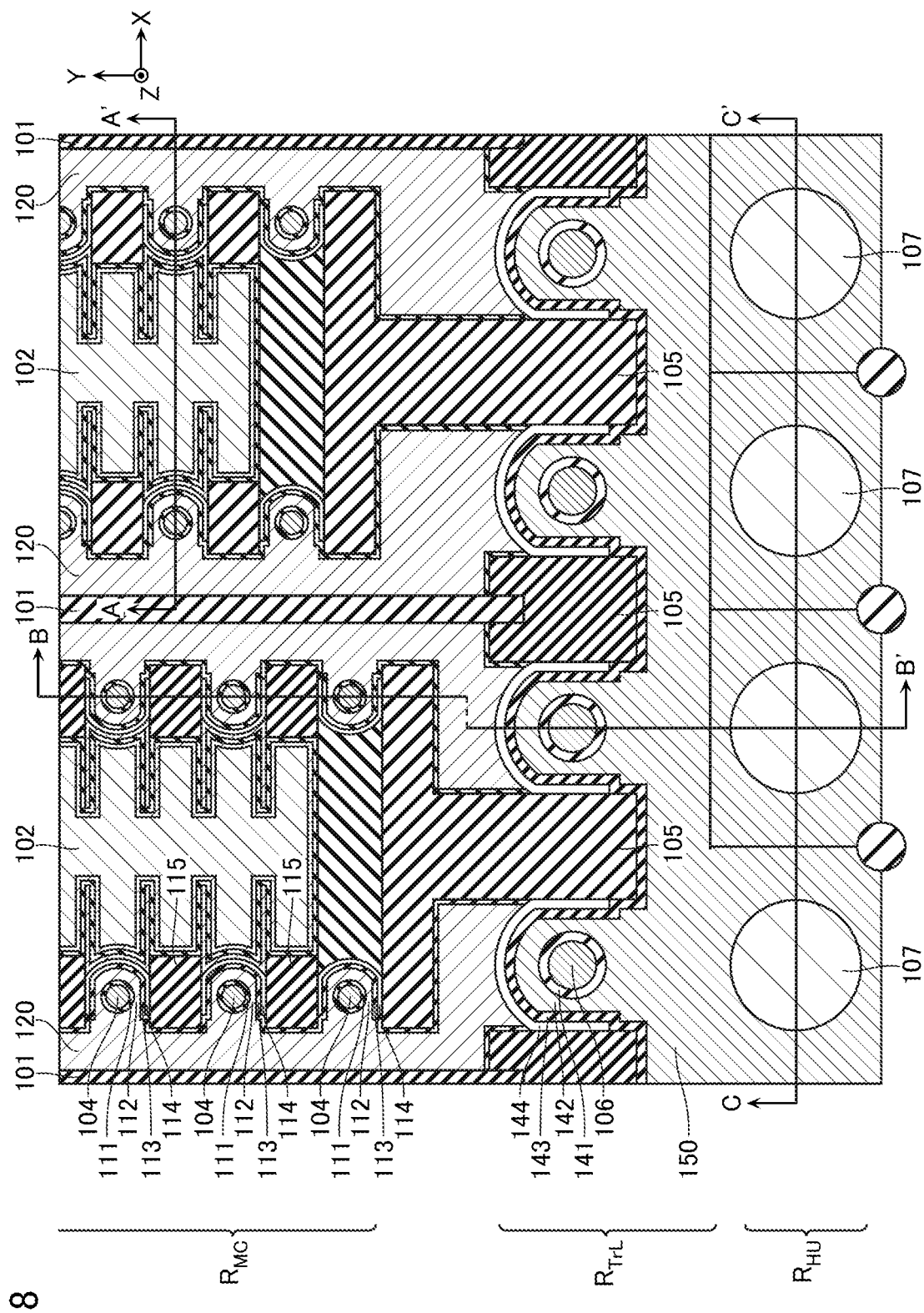
FIG. 8 is a schematic X-Y cross-sectional view illustrating a part of the configuration of the semiconductor memory device.
Figure 9:
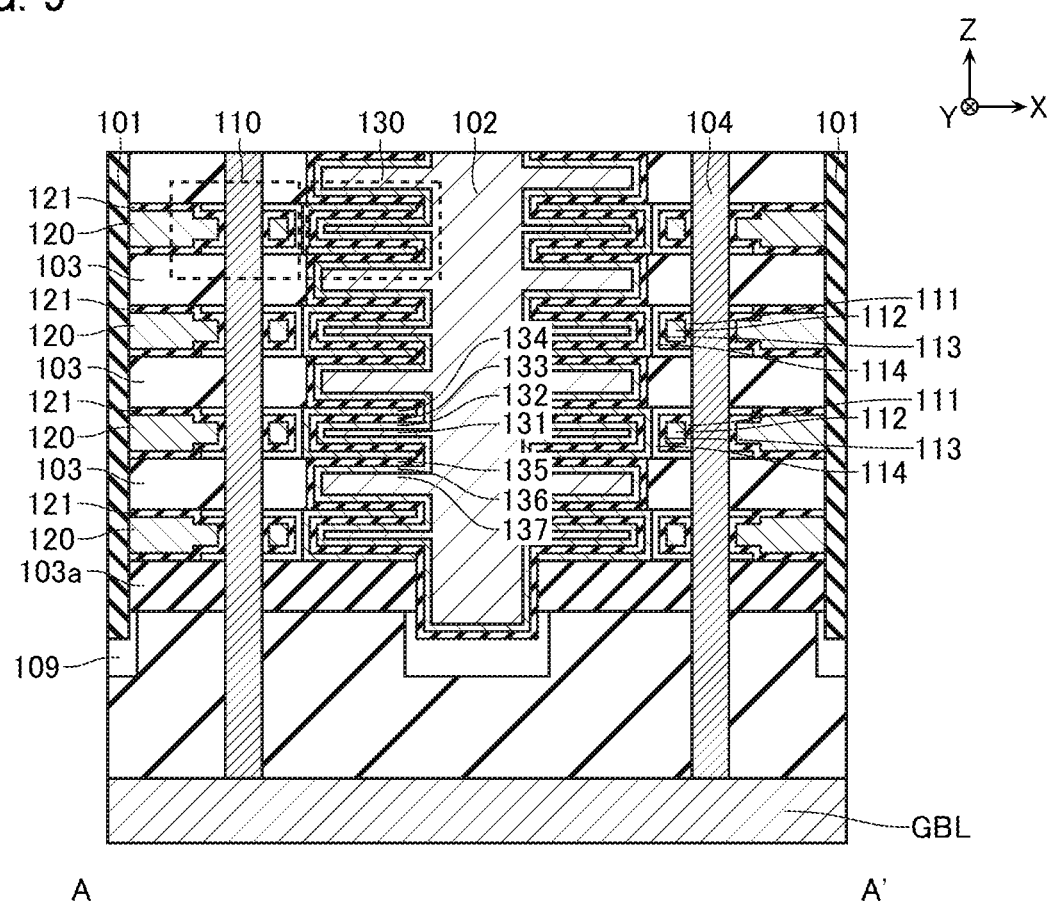
FIG. 9 is a schematic X-Z cross-sectional view of the configuration illustrated in FIG. 7 and FIG. 8 taken along a line A-A' viewed in an arrow direction.
Figure 10:
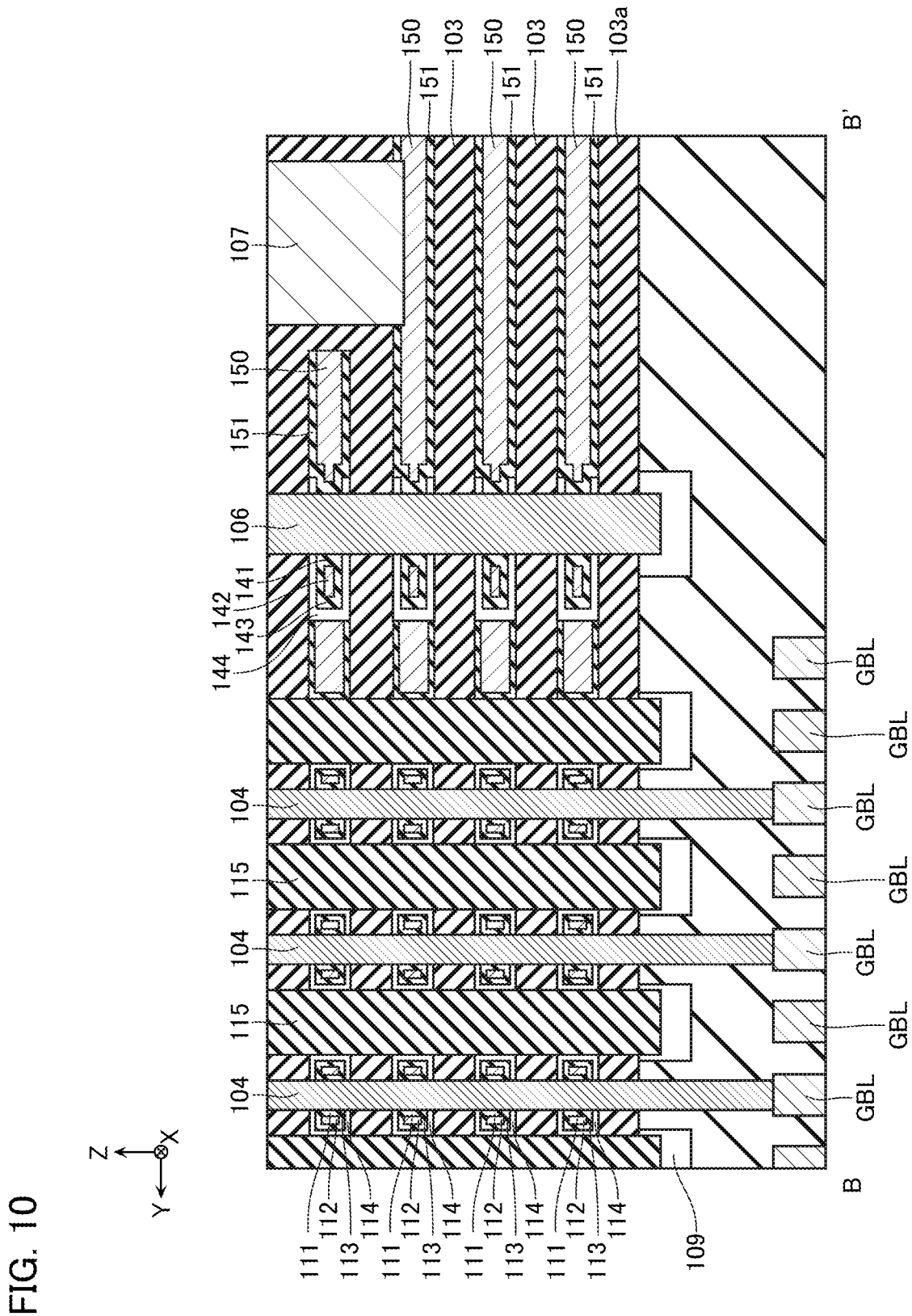
FIG. 10 is a schematic Y-Z cross-sectional view of the configuration illustrated in FIG. 7 and FIG. 8 taken along a line B-B' viewed in an arrow direction.
Figure 11:
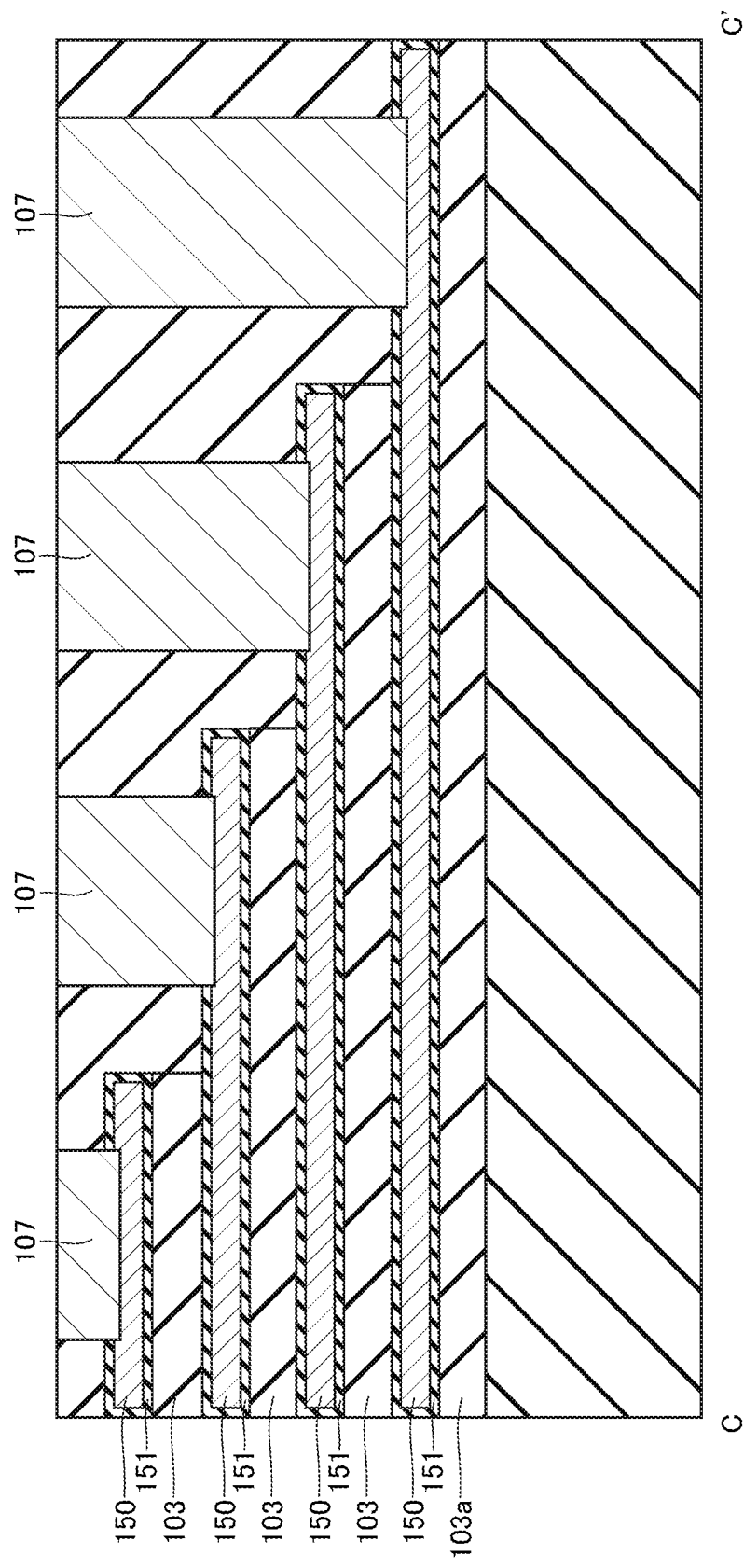
FIG. 11 is a schematic X-Z cross-sectional view of the configuration illustrated in FIG. 7 and FIG. 8 taken along a line C-C' viewed in an arrow direction.

FIG. 5 is a schematic perspective view illustrating a part of the configuration of the semiconductor memory device according to the first embodiment. FIG. 6 is a schematic X-Y cross-sectional view illustrating a part of the configuration of the semiconductor memory device. In FIG. 6, a part of the configuration (insulating layers 121, 151 described later) is omitted. FIG. 7 and FIG. 8 are schematic X-Y cross-sectional views illustrating a part of the configuration of the semiconductor memory device. FIG. 7 and FIG. 8 illustrate the X-Y cross-sectional surfaces at different height positions. FIG. 9 is a schematic X-Z cross-sectional view of the configuration illustrated in FIG. 7 and FIG. 8 taken along a line A-A' viewed in an arrow direction. FIG. 10 is a schematic Y-Z cross-sectional view of the configuration illustrated in FIG. 7 and FIG. 8 taken along a line B-B' viewed in an arrow direction. FIG. 11 is a schematic X-Z cross-sectional view of the configuration illustrated in FIG. 7 and FIG. 8 taken along a line C-C' viewed in an arrow direction.

FIG. 5 illustrates a part of a semiconductor substrate Sub and the memory cell array MCA disposed above the semiconductor substrate Sub.

The semiconductor substrate Sub is, for example, a semiconductor substrate of silicon (Si) or the like containing P-type impurities, such as boron (B). An insulating layer and an electrode layer (not illustrated) are disposed on an upper surface of the semiconductor substrate Sub. The upper surface of the semiconductor substrate Sub and the not illustrated insulating layer and electrode layer constitute a control circuit for controlling the semiconductor memory device according to the first embodiment. For example, in a region immediately below the memory cell array MCA, a sense amplifier circuit SA is disposed. The sense amplifier circuit SA is connected to the global bit lines GBL. The sense amplifier circuit SA can read out the data stored in the selected memory cell MC by detecting the voltage fluctuation or the current in the global bit line GBL in the read operation.

The memory cell array MCA includes the plurality of memory layers ML0 to ML3 arranged in the Z-direction and a plurality of global bit lines GBL disposed below them. Insulating layers 103 of silicon oxide ($SiO_2$) or the like are each disposed between the plurality of memory layers ML0 to ML3.

As illustrated in FIG. 6, the memory layers ML0 to ML3 each include a memory cell region $R_{MC}$, and transistor regions $R_{TrL}$ and hook-up regions $R_{HU}$ each disposed on one side and the other side of the memory cell region $R_{MC}$ in the Y-direction. Each of the transistor regions $R_{TrL}$ is disposed between the memory cell region $R_{MC}$ and the hook-up region $R_{HU}$.

In the memory cell region $R_{MC}$, a plurality of insulating layers 101 and a plurality of conductive layers 102 alternately arranged in the X-direction are disposed. As illustrated in FIG. 5, these plurality of insulating layers 101 and plurality of conductive layers 102 extend in the Y-direction and the Z-direction, and separate the memory layers ML0 to ML3 in the X-direction.

The insulating layer 101 contains, for example, silicon oxide ($SiO_2$).

The conductive layer 102 has, for example, a stacked structure of titanium nitride (TiN) and tungsten (W). The conductive layer 102 functions as, for example, a plate line PL (FIG. 1).

The memory cell region $R_{MC}$ includes a plurality of conductive layers 104 disposed between the insulating layers 101 and the conductive layers 102. The plurality of conductive layers 104 are arranged in the Y-direction, and penetrate the plurality of memory layers ML0 to ML3 to extend in the Z-direction.

The conductive layer 104 has, for example, a stacked structure of indium tin oxide (ITO), titanium nitride (TiN), and tungsten (W). The conductive layer 104 functions as, for example, a bit line BL (FIG. 1). A plurality of the bit lines BL are disposed corresponding to the plurality of transistors TrC included in the memory layers ML0 to ML3.

In the memory cell region $R_{MC}$, the memory layers ML0 to ML3 each include a plurality of transistor structures 110 disposed corresponding to the plurality of conductive layers 104, conductive layers 120 disposed between the plurality of transistor structures 110 and the insulating layers 101, and a plurality of capacitor structures 130 disposed between the plurality of transistor structures 110 and the conductive layers 102.

For example, as illustrated in FIG. 8 and FIG. 9, the transistor structure 110 includes an insulating layer 111 disposed on an outer peripheral surface of the conductive layer 104, a conductive layer 112 disposed on an outer peripheral surface of the insulating layer 111, an insulating layer 113 disposed on an upper surface, a lower surface, and an outer peripheral surface of the conductive layer 112, and a semiconductor layer 114 disposed on an upper surface, a lower surface, and an outer peripheral surface of the insulating layer 113.

In the X-Y cross-sectional surface as illustrated in FIG. 8, the outer peripheral surface of the insulating layer 111 may be formed along, for example, a circle having a center position of the conductive layer 104 as the center. Side surfaces of the conductive layer 112, the insulating layer 113, and the semiconductor layer 114 on one side (conductive layer 102 side) in the X-direction may be formed along a circle having the center position of the conductive layer 104 as the center. Both side surfaces of the conductive layer 112, the insulating layer 113, and the semiconductor layer 114 in the Y-direction may be formed linearly along side surfaces of the insulating layers 115.

The insulating layer 111 contains silicon oxide ($SiO_2$) or the like. The insulating layer 111 surrounds the outer peripheral surface of the conductive layer 104 over the whole circumference.

The conductive layer 112 functions as, for example, a gate electrode of the transistor TrC (FIG. 1). The conductive layer 112 has, for example, a stacked structure of titanium nitride (TiN) and tungsten (W). The conductive layer 112 surrounds the outer peripheral surface of the insulating layer 111 over the whole circumference. As illustrated in FIG. 8, a plurality of the conductive layers 112 arranged in the Y-direction are commonly connected to the conductive layer 120 extending in the Y-direction.

The insulating layer 113 functions as, for example, a gate insulating film of the transistor TrC (FIG. 1). The insulating layer 113 contains silicon oxide ($SiO_2$) or the like. The insulating layer 113 covers both side surfaces in the Y-direction and the side surface on one side (conductive layer 102 side) in the X-direction of the conductive layer 112.

The semiconductor layer 114 functions as, for example, a channel region of the transistor TrC (FIG. 1).

For example, the semiconductor layer 114 may be a semiconductor containing at least one element of gallium (Ga) and aluminum (Al), and containing indium (In), zinc (Zn), and oxygen (O), or may be another oxide semiconductor. The semiconductor layer 114 covers both side surfaces in the Y-direction and the side surface on one side (conductive layer 102 side) in the X-direction of the conductive layer 112 via the insulating layer 113. As illustrated in FIG. 9, the plurality of semiconductor layers 114 arranged in the Z-direction are commonly connected to the conductive layer 104 extending in the Z-direction. As illustrated in FIG. 7, an insulating layer 115 of silicon oxide ($SiO_2$) or the like is disposed between the two semiconductor layers 114 mutually adjacent in the Y-direction.

The conductive layer 120 functions as, for example, the word line WL (FIG. 1). For example, as illustrated in FIG. 8, the conductive layer 120 extends in the Y-direction, and is connected to the plurality of conductive layers 112 arranged in the Y-direction. The conductive layer 120 has, for example, a stacked structure of titanium nitride (TiN) and tungsten (W). An upper surface and a lower surface of the conductive layer 120 are covered with an insulating layer 121 of silicon oxide ($SiO_2$) or the like. The insulating layer 121 is connected to the insulating layer 111 and the insulating layer 113.

For example, as illustrated in FIG. 9, the capacitor structure 130 includes a conductive layer 131, a conductive layer 132 disposed on an upper surface, a lower surface, and a side surface in the Y-direction of the conductive layer 131, an insulating layer 133 disposed on an upper surface, a lower surface, and a side surface in the Y-direction of the conductive layer 132, a conductive layer 134 disposed on an upper surface, a lower surface, and a side surface in the Y-direction of the insulating layer 133, an insulating layer 135 disposed on an upper surface, a lower surface, and a side surface in the Y-direction of the conductive layer 134, a conductive layer 136 disposed on an upper surface, a lower surface, and a side surface in the Y-direction of the insulating layer 135, and a conductive layer 137 disposed on an upper surface, a lower surface, and a side surface in the Y-direction of the conductive layer 136.

The conductive layers 131, 132, 136, and 137 function as one electrode of the capacitor CpC (FIG. 1). The conductive layers 131, 137 contain tungsten (W) or the like. The conductive layers 132, 136 contain titanium nitride (TiN) or the like. The conductive layers 131, 132, 136, and 137 are connected to the conductive layer 102.

The insulating layers 133, 135 function as an insulating layer of the capacitor CpC (FIG. 2). The insulating layers 133, 135 may be, for example, alumina ($Al_2O_3$) or another insulating metal oxide.

The conductive layer 134 functions as, for example, the other electrode of the capacitor CpC (FIG. 2). The conductive layer 134 contains indium tin oxide (ITO) or the like. The conductive layer 134 is insulated from the conductive layers 131, 132, 136, and 137 via the insulating layers 133, 135. The conductive layer 134 is connected to a side surface in the X-direction of the semiconductor layer 114.

For example, as illustrated in FIG. 6, the transistor region $R_{TrL}$ includes a plurality of insulating layers 105 arranged in the X-direction. These plurality of insulating layers 105 penetrate the plurality of memory layers ML0 to ML3 and extend in the Z-direction.

The insulating layer 105 contains silicon oxide (SiO$_2$) or the like.

The transistor region R$_{TrL}$ includes a plurality of conductive layers 106 disposed between the insulating layers 105. The plurality of conductive layers 106 are arranged in the X-direction, and penetrate the plurality of memory layers ML0 to ML3 to extend in the Z-direction (see FIG. 10).

The conductive layer 106 has, for example, a stacked structure of indium tin oxide (ITO), titanium nitride (TiN), and tungsten (W). The conductive layer 106 functions as, for example, the word line select line LW (FIG. 1). A plurality of the word line select lines LW are disposed corresponding to the plurality of transistors TrL included in the memory layers ML0 to ML3.

For example, as illustrated in FIG. 6, in the transistor region R$_{TrL}$, the memory layers ML0 to ML3 each include a plurality of transistor structures 140 disposed corresponding to the plurality of conductive layers 106, and a conductive layer 150 extending in the X-direction along these plurality of transistor structures 140.

For example, as illustrated in FIG. 8 and FIG. 10, the transistor structure 140 includes an insulating layer 141 disposed on an outer peripheral surface of the conductive layer 106, a conductive layer 142 disposed on an outer peripheral surface of the insulating layer 141, an insulating layer 143 disposed on an upper surface, a lower surface, and an outer peripheral surface of the conductive layer 142, and a semiconductor layer 144 disposed on an upper surface, a lower surface, and an outer peripheral surface of the insulating layer 143.

In the X-Y cross-sectional surface as illustrated in FIG. 8, the outer peripheral surface of the insulating layer 141 may be formed, for example, along a circle having a center position of the conductive layer 106 as the center. Side surfaces of the conductive layer 142, the insulating layer 143, and the semiconductor layer 144 on one side (conductive layer 120 side) in the Y-direction may be formed along the circle having the center position of the conductive layer 106 as the center. Both side surfaces in the X-direction of the conductive layer 142, the insulating layer 143, and the semiconductor layer 144 may be formed linearly along side surfaces of the insulating layers 105.

The insulating layer 141 contains silicon oxide (SiO$_2$) or the like. The insulating layer 141 surrounds the outer peripheral surface of the conductive layer 106 over the whole circumference.

The conductive layer 142 functions as, for example, a gate electrode of the transistor TrL (FIG. 1). The conductive layer 142 has, for example, a stacked structure of titanium nitride (TiN) and tungsten (W). The conductive layer 142 surrounds the outer peripheral surface of the insulating layer 141 over the whole circumference. As illustrated in FIG. 8, a plurality of the conductive layers 142 arranged in the X-direction are commonly connected to the conductive layer 150 extending in the X-direction.

The insulating layer 143 functions as, for example, a gate insulating film of the transistor TrL (FIG. 1). The insulating layer 143 contains silicon oxide (SiO$_2$) or the like. The insulating layer 143 covers both side surfaces in the X-direction and the side surface on one side (conductive layer 120 side) in the Y-direction of the conductive layer 142.

The semiconductor layer 144 functions as, for example, a channel region of the transistor TrL (FIG. 1). For example, the semiconductor layer 144 may be a semiconductor containing at least one element of gallium (Ga) and aluminum (Al), and containing indium (In), zinc (Zn), and oxygen (O), or may be another oxide semiconductor. The semiconductor layer 144 covers both side surfaces in the X-direction and the side surface on one side (conductive layer 120 side) in the Y-direction of the conductive layer 142 via the insulating layer 143. As illustrated in FIG. 10, the plurality of semiconductor layers 144 arranged in the Z-direction are commonly connected to the conductive layer 106 extending in the Z-direction. As illustrated in FIG. 7, the insulating layer 105 is disposed between the two semiconductor layers 144 mutually adjacent in the X-direction. The semiconductor layer 144 is connected to an end portion of the conductive layer 120 in the Y-direction.

The conductive layer 150 functions as, for example, the layer select line LL (FIG. 1). For example, as illustrated in FIG. 8, the conductive layer 150 extends in the X-direction, and is connected to the plurality of conductive layers 142 arranged in the X-direction. The conductive layer 150 has, for example, a stacked structure of titanium nitride (TiN) and tungsten (W). An upper surface and a lower surface of the conductive layer 150 are covered with an insulating layer 151 of silicon oxide (SiO$_2$) or the like. The insulating layer 151 is connected to the insulating layer 141 and the insulating layer 143.

The hook-up region R$_{HU}$ includes a plurality of contact electrodes 107 arranged in the X-direction. As illustrated in FIG. 11, the contact electrode 107 extends in the Z-direction, and has a lower end connected to the conductive layer 150. The plurality of contact electrodes 107 arranged in the X-direction are connected to the respective conductive layers 150 disposed at different height positions. The contact electrode 107 has, for example, a stacked structure of titanium nitride (TiN) and tungsten (W).

As illustrated in FIG. 5, a plurality of the global bit lines GBL are disposed below the memory layers ML0 to ML3. The global bit lines GBL extend in the X-direction, and are arranged in the Y-direction. The global bit line GBL has, for example, a stacked structure of titanium nitride (TiN) and tungsten (W). The global bit lines GBL are each connected to lower ends of a plurality of the conductive layers 104 arranged in the X-direction.

As illustrated in FIG. 5, etching stoppers 109 are disposed between the memory layers ML0 to ML3 and the plurality of global bit lines GBL. The etching stoppers 109 are disposed corresponding to the insulating layers 101, the conductive layers 102, the insulating layers 105, and the conductive layers 106, and connected to lower ends of them. The etching stoppers 109 have shapes along shapes of the lower ends of the corresponding configurations. For example, the etching stopper 109 corresponding to the insulating layer 101 extends in the Y-direction corresponding to the insulating layer 101. Similarly, the etching stopper 109 corresponding to the conductive layer 102 extends in the Y-direction corresponding to the conductive layer 102.

An insulating layer 103a is disposed between the memory layers ML0 to ML3 and the etching stoppers 109 (see FIG. 9). For example, the insulating layer 103a may contain a material different from that of other insulating layers 103. For example, the insulating layer 103a may contain carbon-containing silicon oxide (SiOC) or the like.

[Manufacturing Method]

Figure 12:
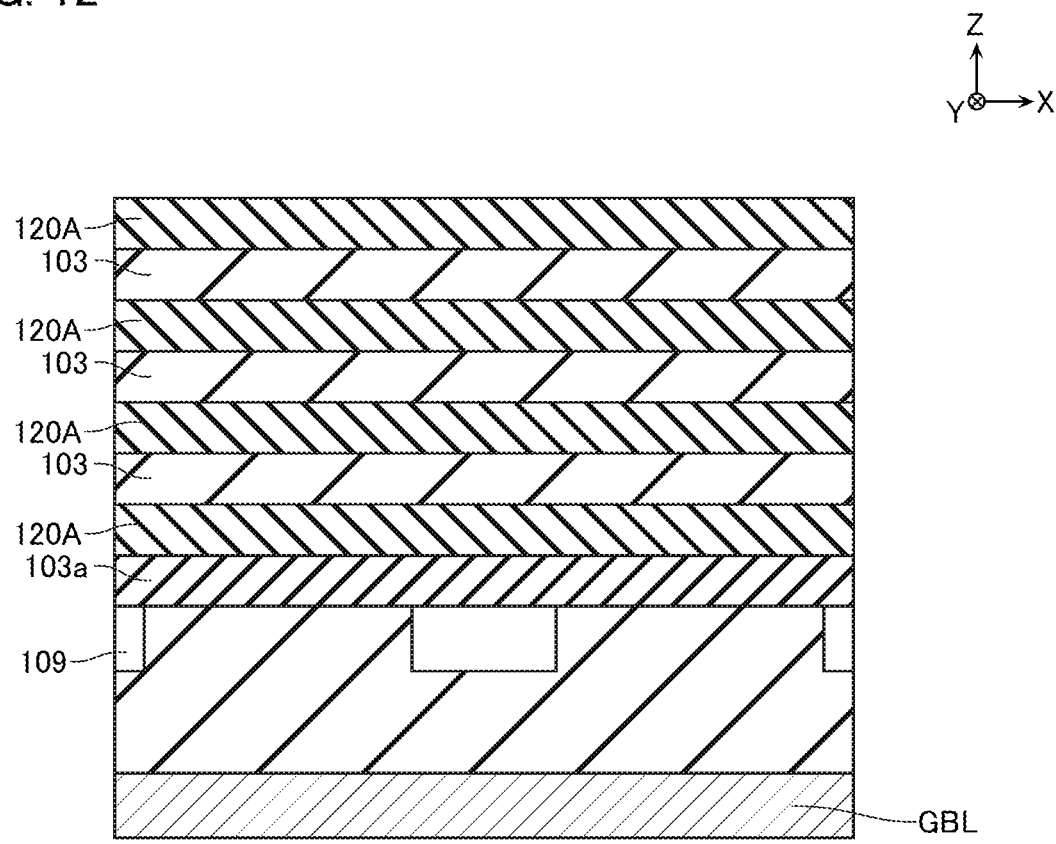
FIG. 12 is a schematic cross-sectional view for describing a method for manufacturing the semiconductor memory device according to the first embodiment.
Figure 65:
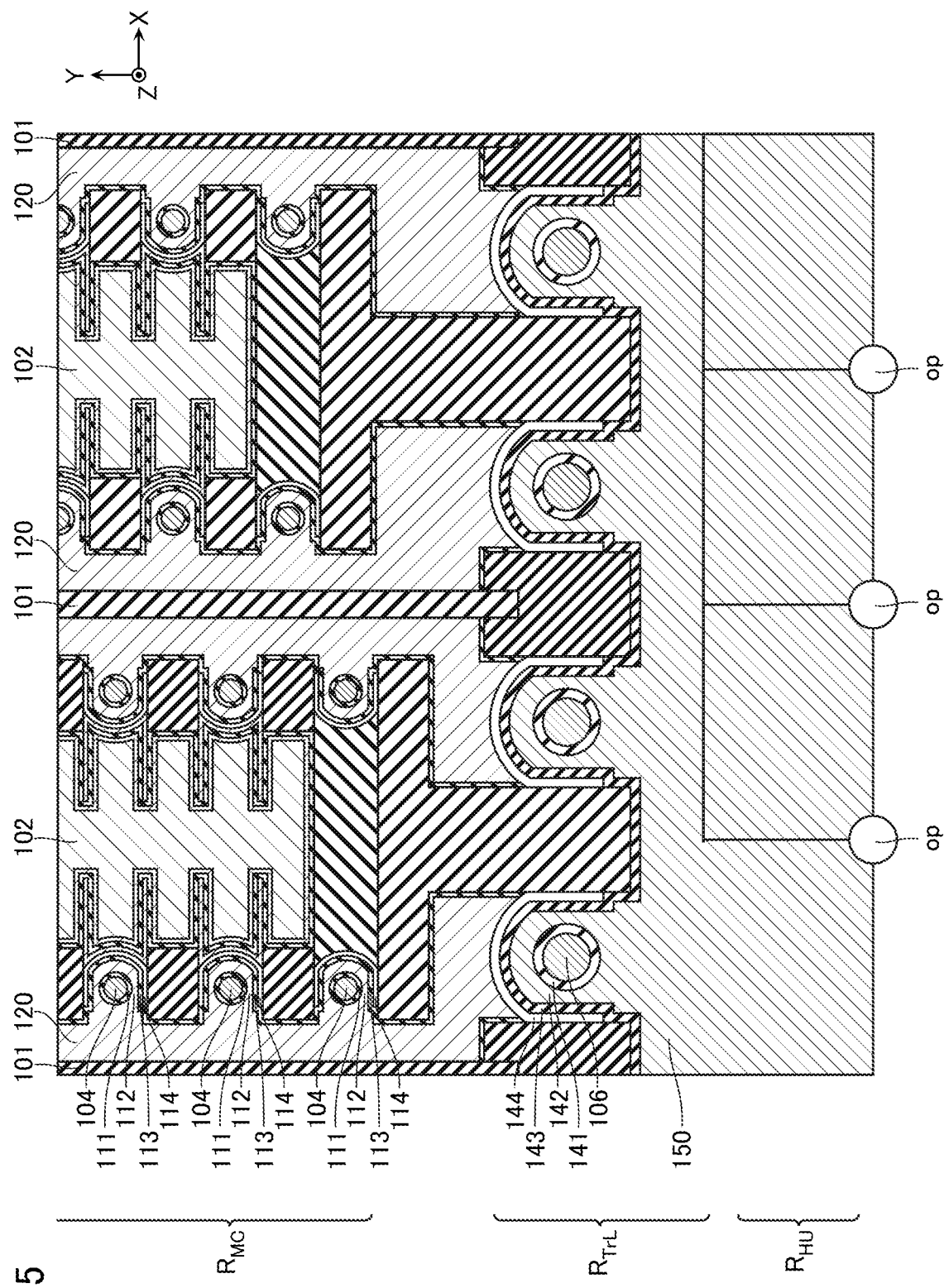
FIG. 65 is a schematic cross-sectional view for describing the manufacturing method.
Figure 66:
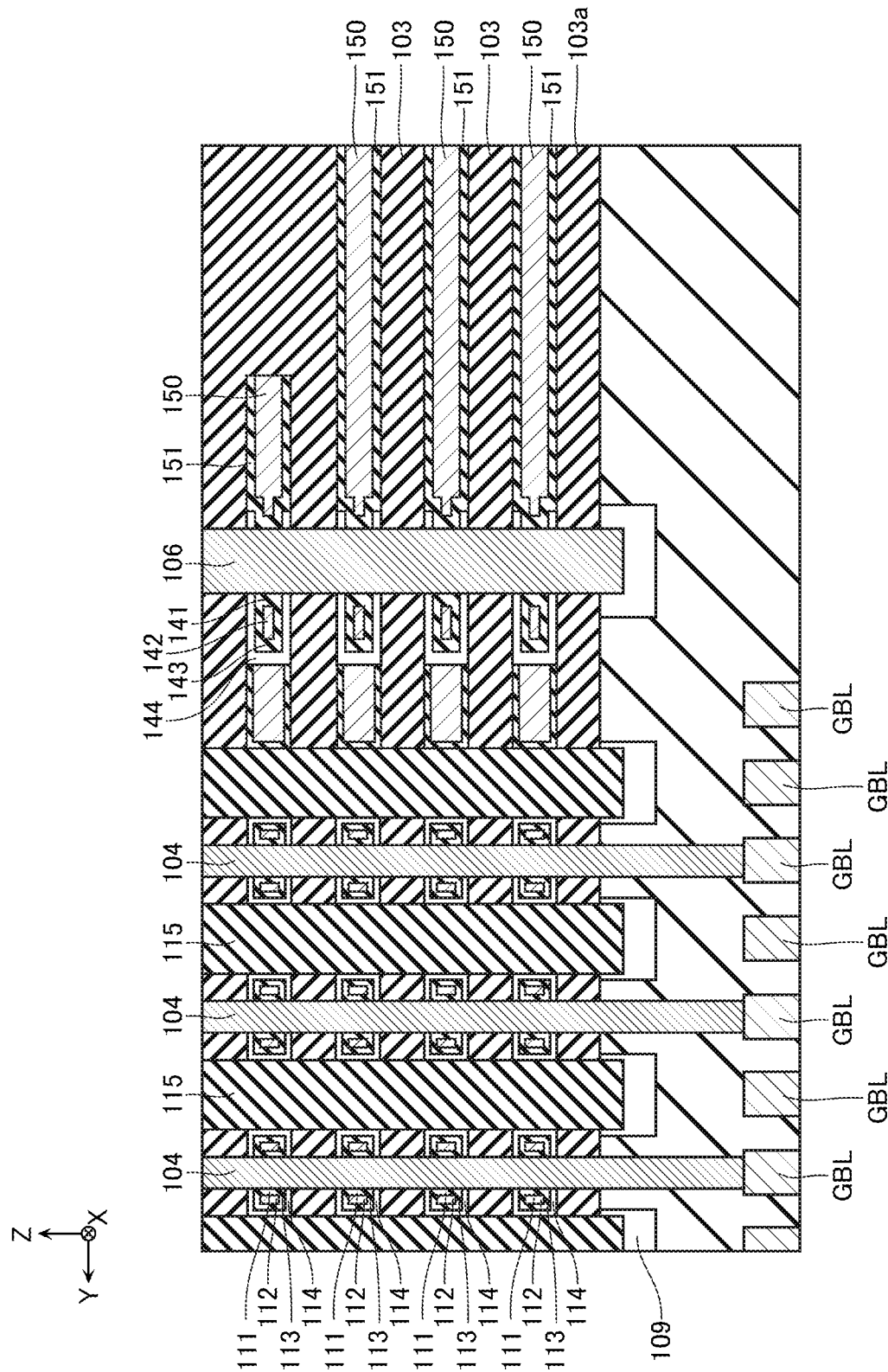
FIG. 66 is a schematic cross-sectional view for describing the manufacturing method.

FIG. 12 to FIG. 66 are schematic cross-sectional views for describing the method for manufacturing the semiconductor memory device according to the first embodiment. FIG. 13, FIG. 14, FIG. 16, FIG. 18, FIG. 20, FIG. 23, FIG. 25, FIG. 28, FIG. 30, FIG. 32, FIG. 34, FIG. 36, FIG. 38, FIG. 43, FIG. 45, FIG. 47, FIG. 49, FIG. 51, FIG. 54, FIG. 58, FIG. 60, FIG. 61, FIG. 63, and FIG. 65 each illustrate a cross-sectional surface corresponding to that in FIG. 8. FIG. 12, FIG. 19, FIG. 21, FIG. 22, FIG. 29, FIG. 31, FIG. 33, FIG. 35, FIG. 37, FIG. 39 to FIG. 42, FIG. 44, FIG. 46, FIG. 48, FIG. 50, and FIG. 52 each illustrate a cross-sectional surface corresponding to that in FIG. 9. FIG. 15, FIG. 17, FIG. 24, FIG. 26, FIG. 27, FIG. 53, FIG. 55 to FIG. 57, FIG. 59, FIG. 62, FIG. 64, and FIG. 66 each illustrate a cross-sectional surface corresponding to that in FIG. 10.

For example, as illustrated in FIG. 12, in the manufacturing method, a plurality of the global bit lines GBL, the etching stoppers 109, the insulating layer 103a, and the like are formed. This process is performed by photolithography, etching, or the like.

Next, for example, as illustrated in FIG. 12, a plurality of the insulating layers 103 and a plurality of sacrifice layers 120A are alternately formed. The sacrifice layer 120A contains silicon nitride ($Si_3N_4$) or the like. This process is performed by Chemical Vapor Deposition (CVD) or the like.

Figure 13:
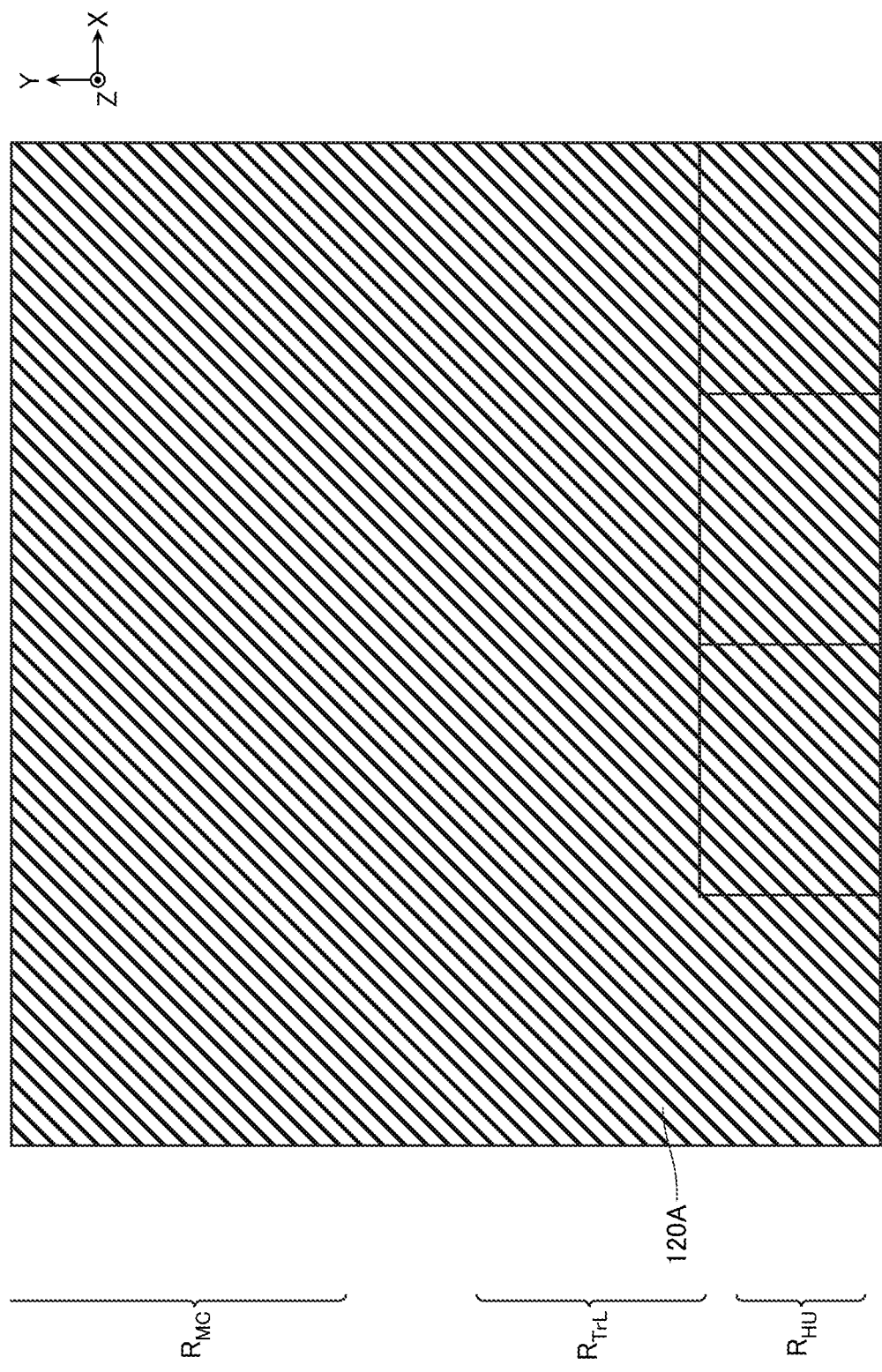
FIG. 13 is a schematic cross-sectional view for describing the manufacturing method.

Next, for example, as illustrated in FIG. 13, in the hook-up region $R_{HU}$, the plurality of insulating layers 103 and the plurality of sacrifice layers 120A are partially removed to form a staircase-shaped structure.

In this process, for example, a resist to expose a part of the hook-up region $R_{HU}$ is formed on an upper surface of the structure as illustrated in FIG. 12. Next, the sacrifice layer 120A is selectively removed by a method such as Reactive Ion Etching (RIE). Next, the insulating layer 103 is selectively removed by the method such as RIE. Thus, a part of an upper surface of the second sacrifice layer 120A counting from above is exposed.

Next, a part of the resist is removed by a method such as wet etching. Next, the sacrifice layer 120A is selectively removed by the method such as RIE. Next, the insulating layer 103 is selectively removed by the method such as RIE. Thus, upper surfaces of the second and third sacrifice layers 120A counting from above are partially exposed.

In the following, similarly, the removal of a part of the resist, the selective removal of the sacrifice layer 120A, and the selective removal of the insulating layer 103 are repeatedly performed. Accordingly, the upper surfaces of all of the sacrifice layers 120A are partially exposed, thus forming the staircase-shaped structure. After the formation of the staircase-shaped structure, the insulating layer 103 is formed on the uppermost sacrifice layer 120A and the upper surface of the staircase-shaped structure.

Figure 14:
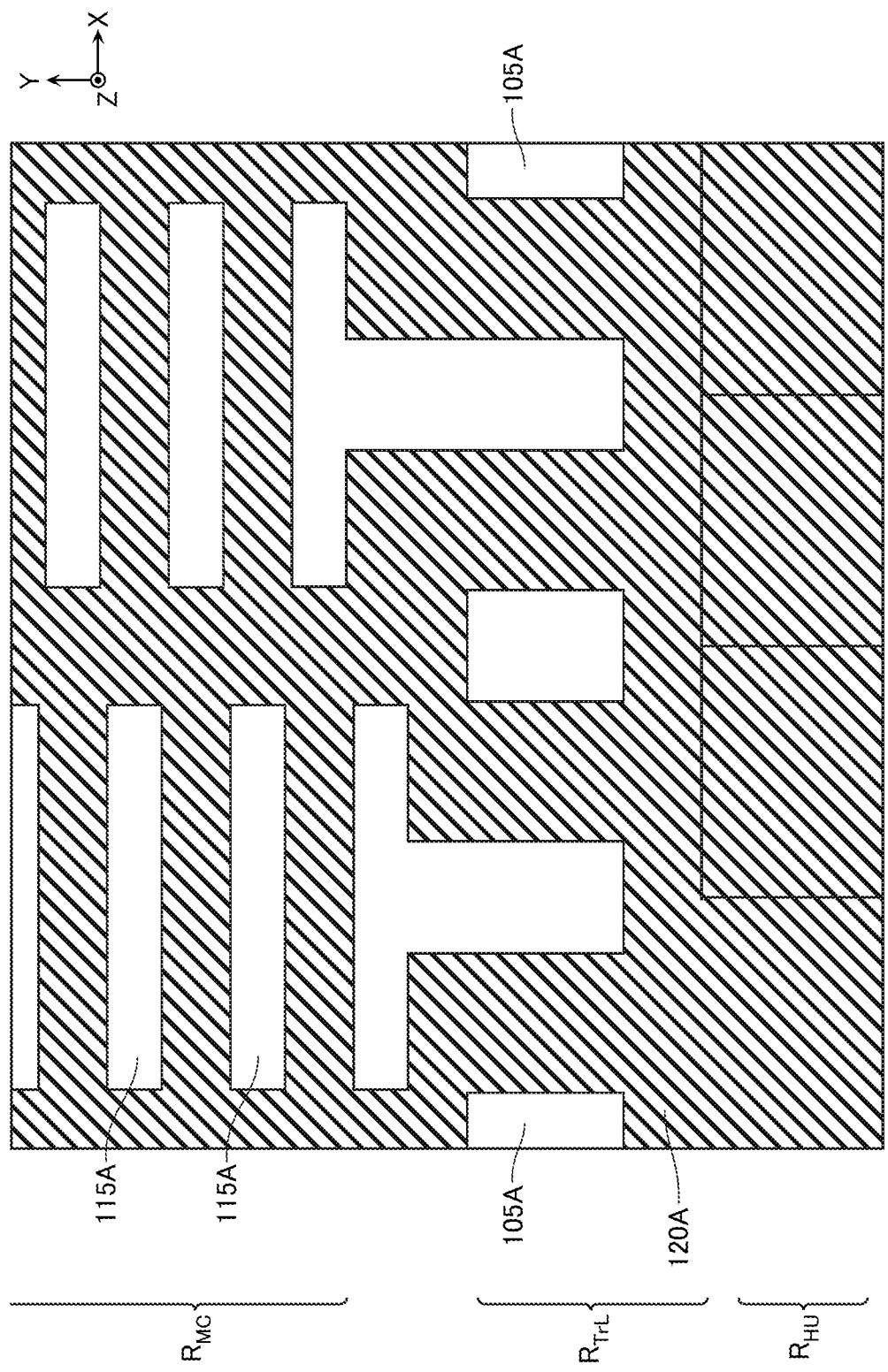
FIG. 14 is a schematic cross-sectional view for describing the manufacturing method.
Figure 15:
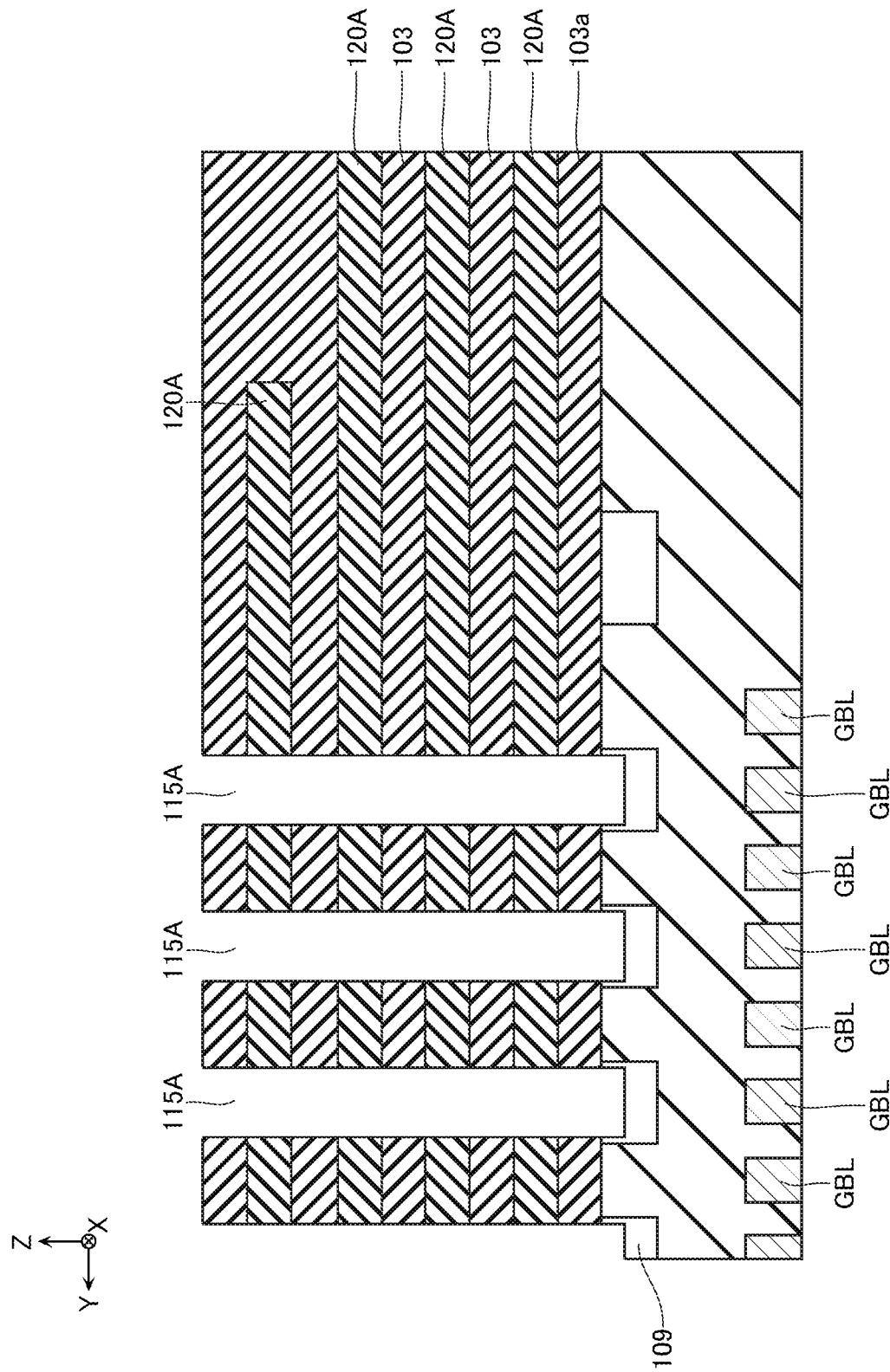
FIG. 15 is a schematic cross-sectional view for describing the manufacturing method.

Next, for example, as illustrated in FIG. 14 and FIG. 15, openings 115A, 105A are formed at positions corresponding to the insulating layers 115, 105. The openings 115A, 105A extend in the Z-direction as illustrated in FIG. 15, and penetrate the plurality of insulating layers 103, the plurality of sacrifice layers 120A, and the insulating layer 103a arranged in the Z-direction, thus exposing the upper surfaces of the etching stoppers 109. This process is performed by RIE or the like.

Figure 16:
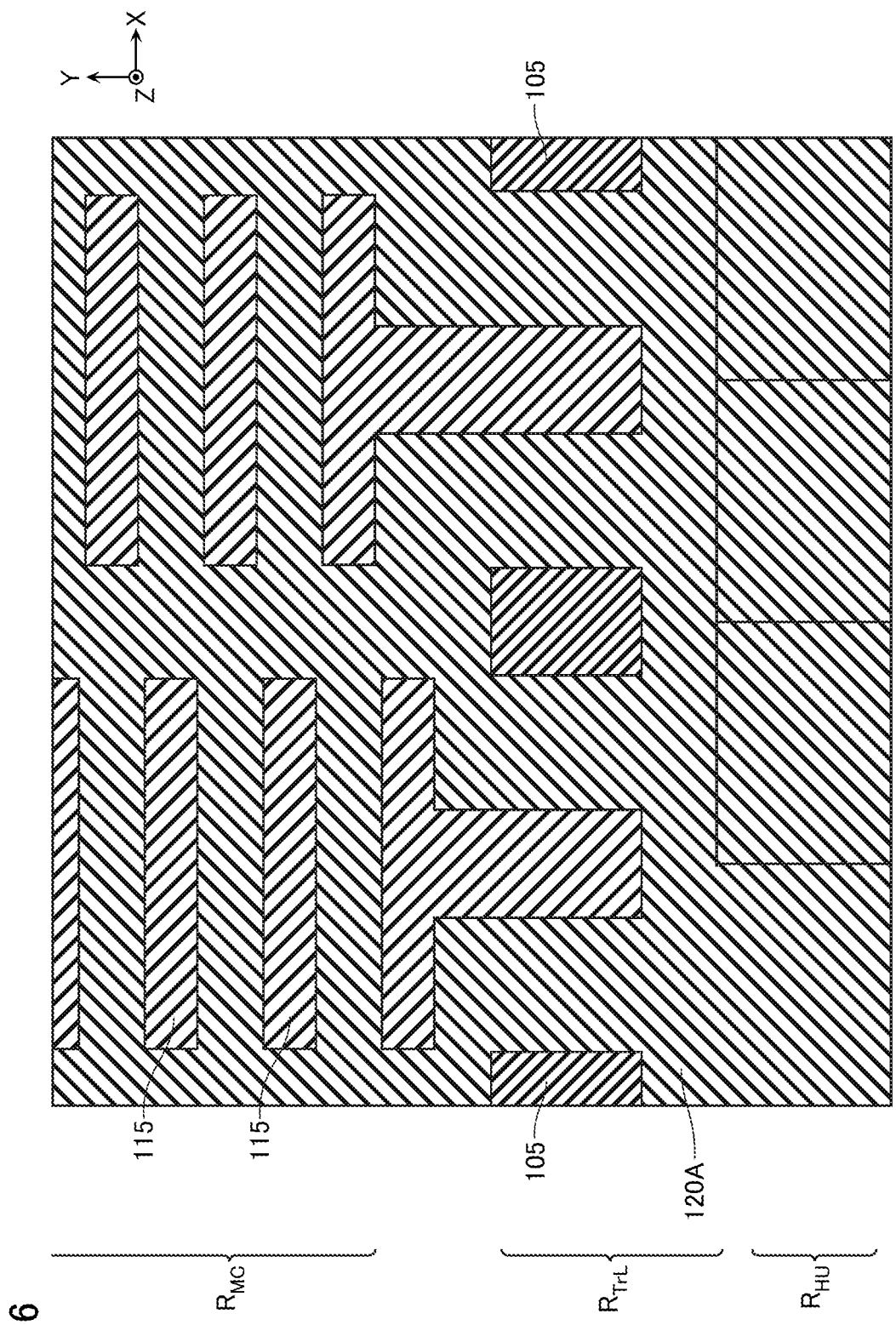
FIG. 16 is a schematic cross-sectional view for describing the manufacturing method.
Figure 17:
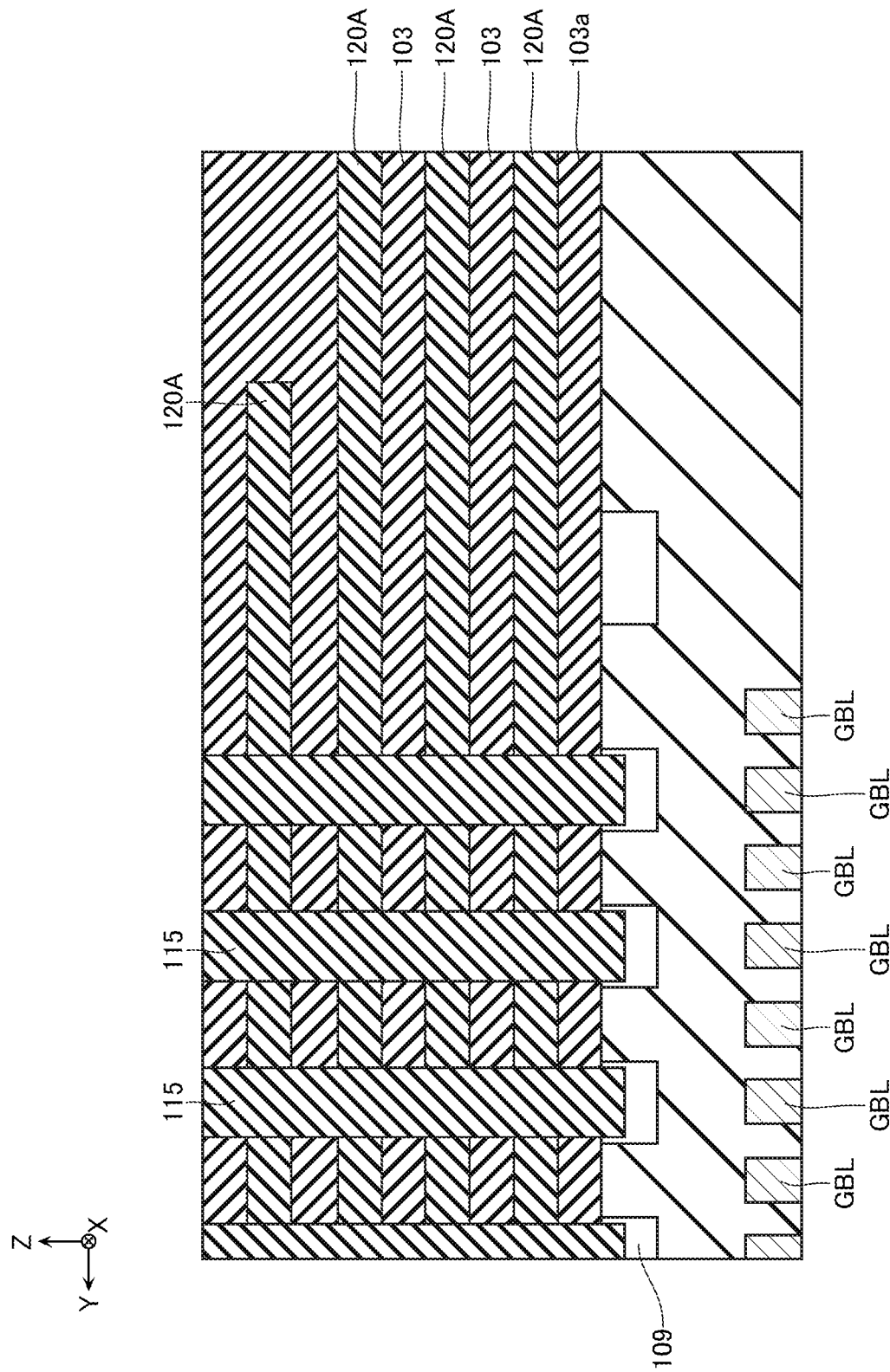
FIG. 17 is a schematic cross-sectional view for describing the manufacturing method.

Next, for example, as illustrated in FIG. 16 and FIG. 17, the insulating layers 115, 105 are formed. This process is performed by CVD or the like.

Figure 18:
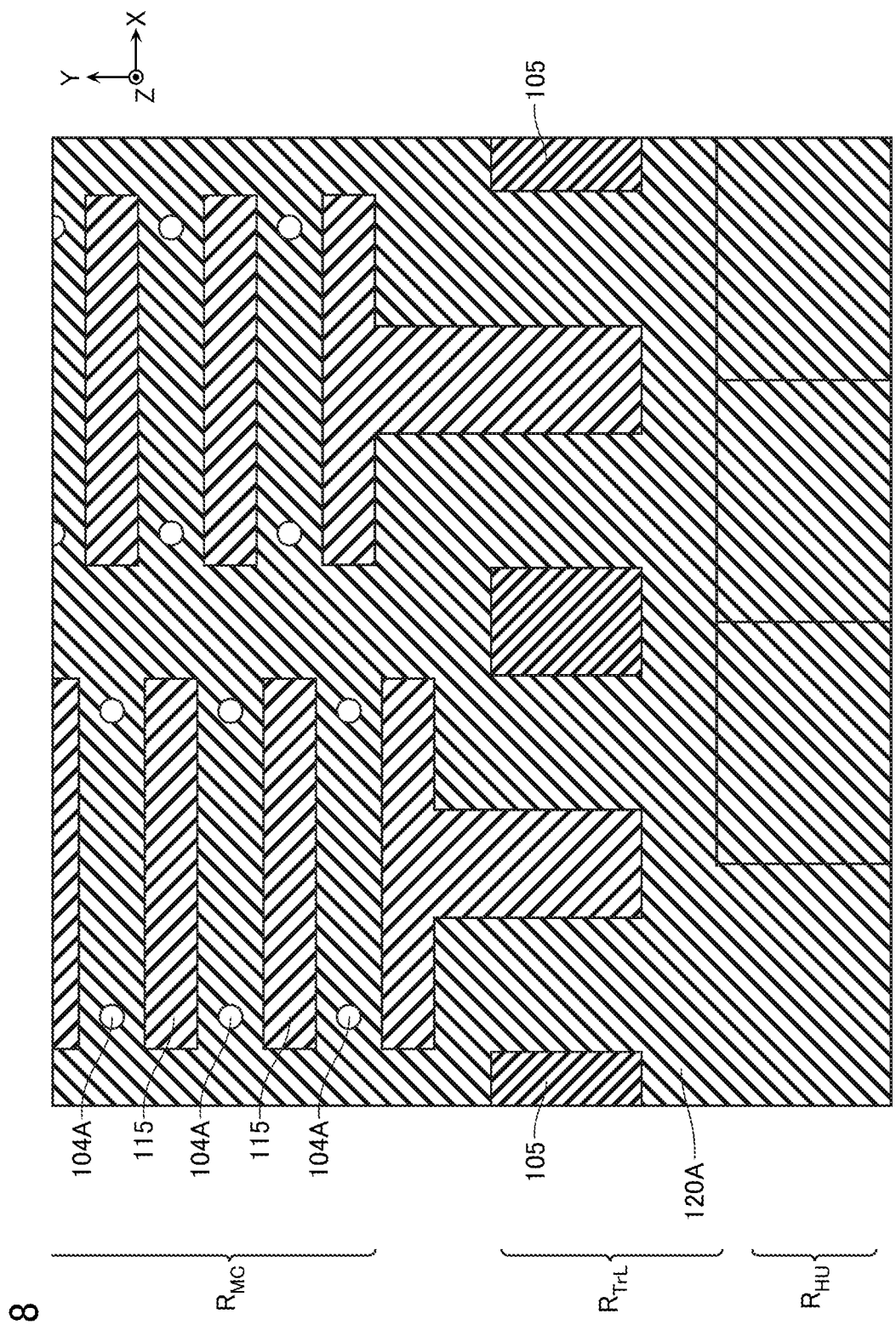
FIG. 18 is a schematic cross-sectional view for describing the manufacturing method.
Figure 19:
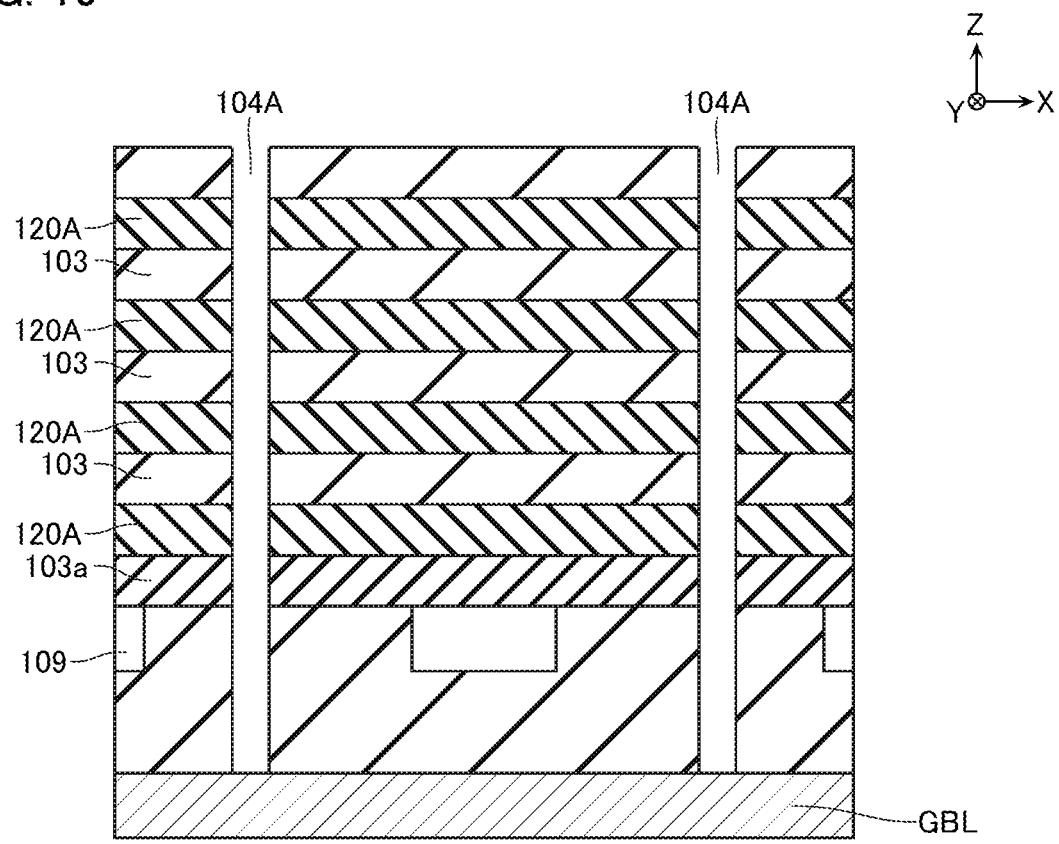
FIG. 19 is a schematic cross-sectional view for describing the manufacturing method.

Next, for example, as illustrated in FIG. 18 and FIG. 19, openings 104A are formed at positions corresponding to the conductive layers 104. The openings 104A extend in the Z-direction as illustrated in FIG. 19, and penetrate the plurality of insulating layers 103, the plurality of sacrifice layers 120A, and the insulating layer 103a arranged in the Z-direction, thus exposing the upper surfaces of the global bit lines GBL. This process is performed by RIE or the like.

Figure 20:
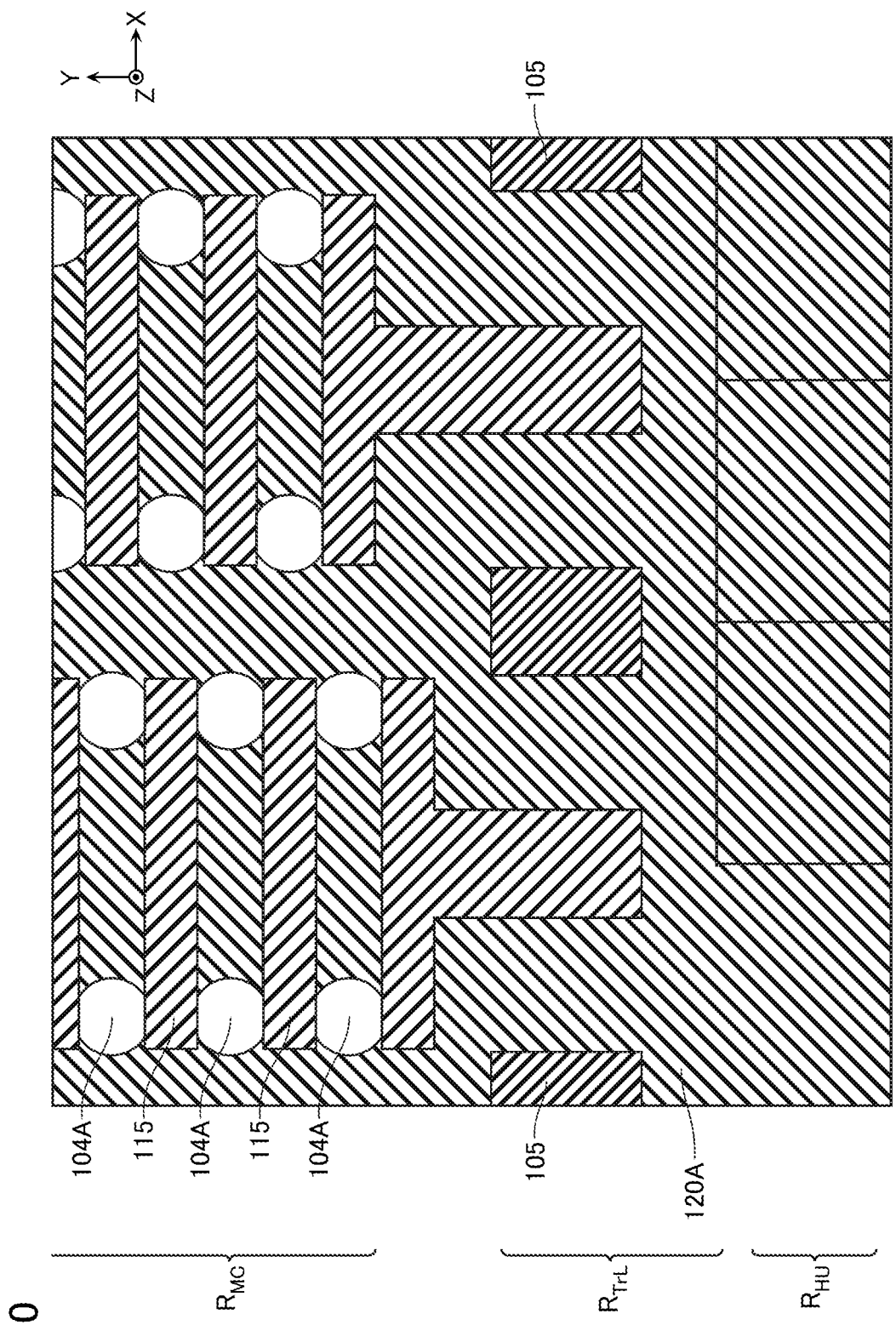
FIG. 20 is a schematic cross-sectional view for describing the manufacturing method.
Figure 21:
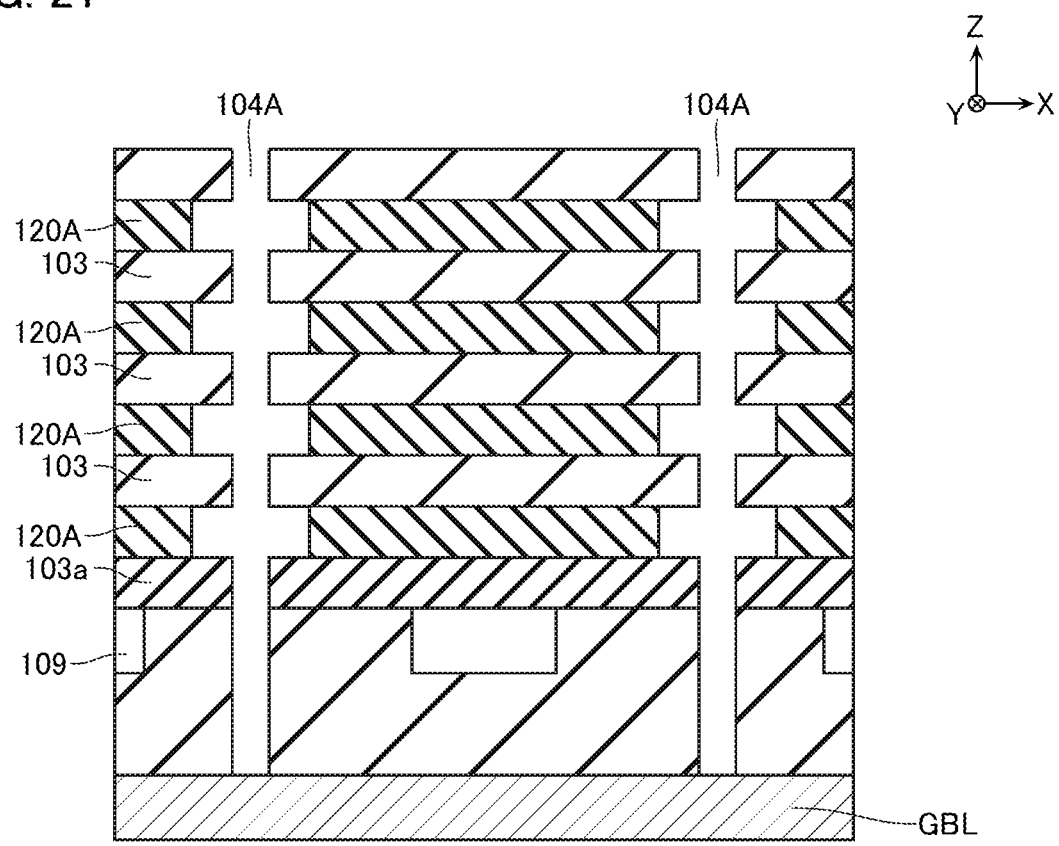
FIG. 21 is a schematic cross-sectional view for describing the manufacturing method.

Next, for example, as illustrated in FIG. 20 and FIG. 21, parts of the sacrifice layers 120A are selectively removed via the openings 104A. In this process, side surfaces of the insulating layers 115 in the Y-direction are exposed to insides of the openings 104A, thereby separating the sacrifice layers 120A in the X-direction. This process is performed by wet etching or the like.

Figure 22:
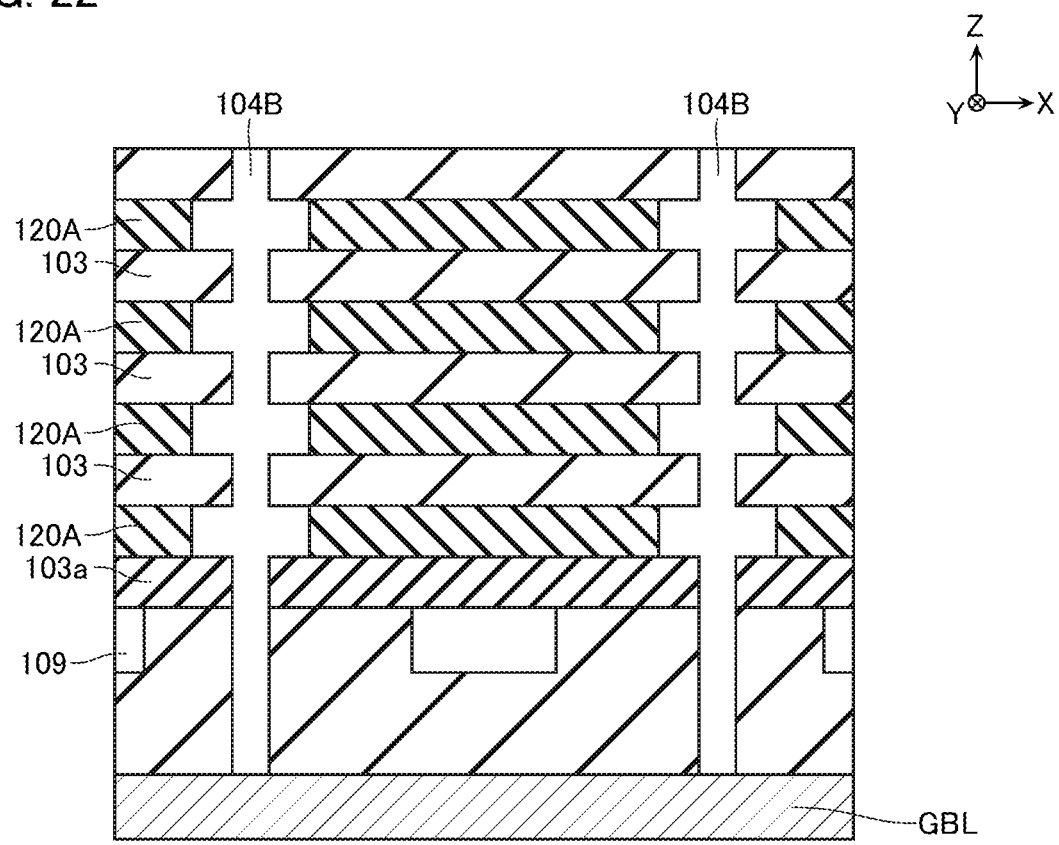
FIG. 22 is a schematic cross-sectional view for describing the manufacturing method.

Next, for example, as illustrated in FIG. 22, sacrifice layers 104B are formed inside the openings 104A. The sacrifice layer 104B contains silicon (Si) or the like. This process is performed by CVD or the like.

Figure 23:
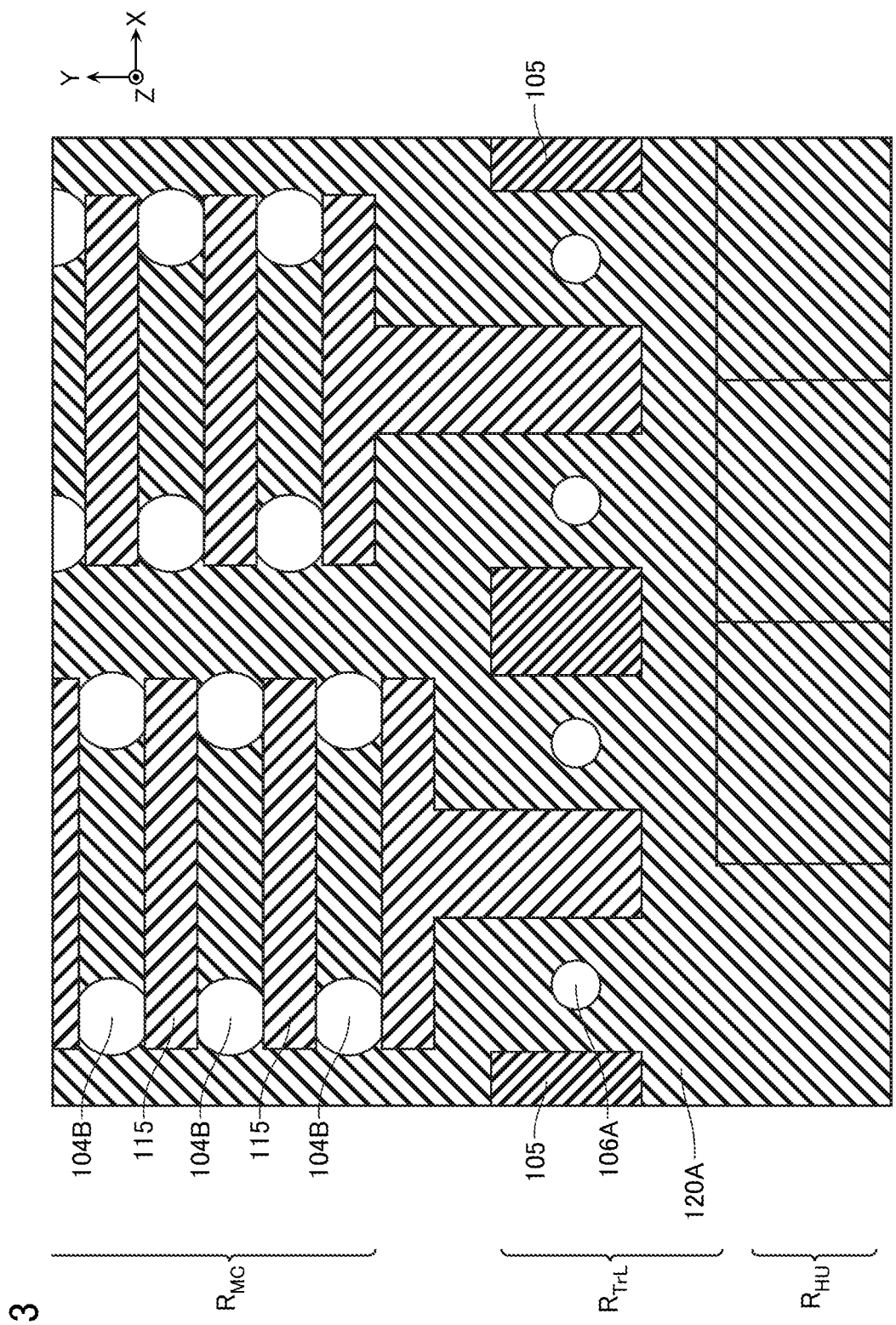
FIG. 23 is a schematic cross-sectional view for describing the manufacturing method.
Figure 24:
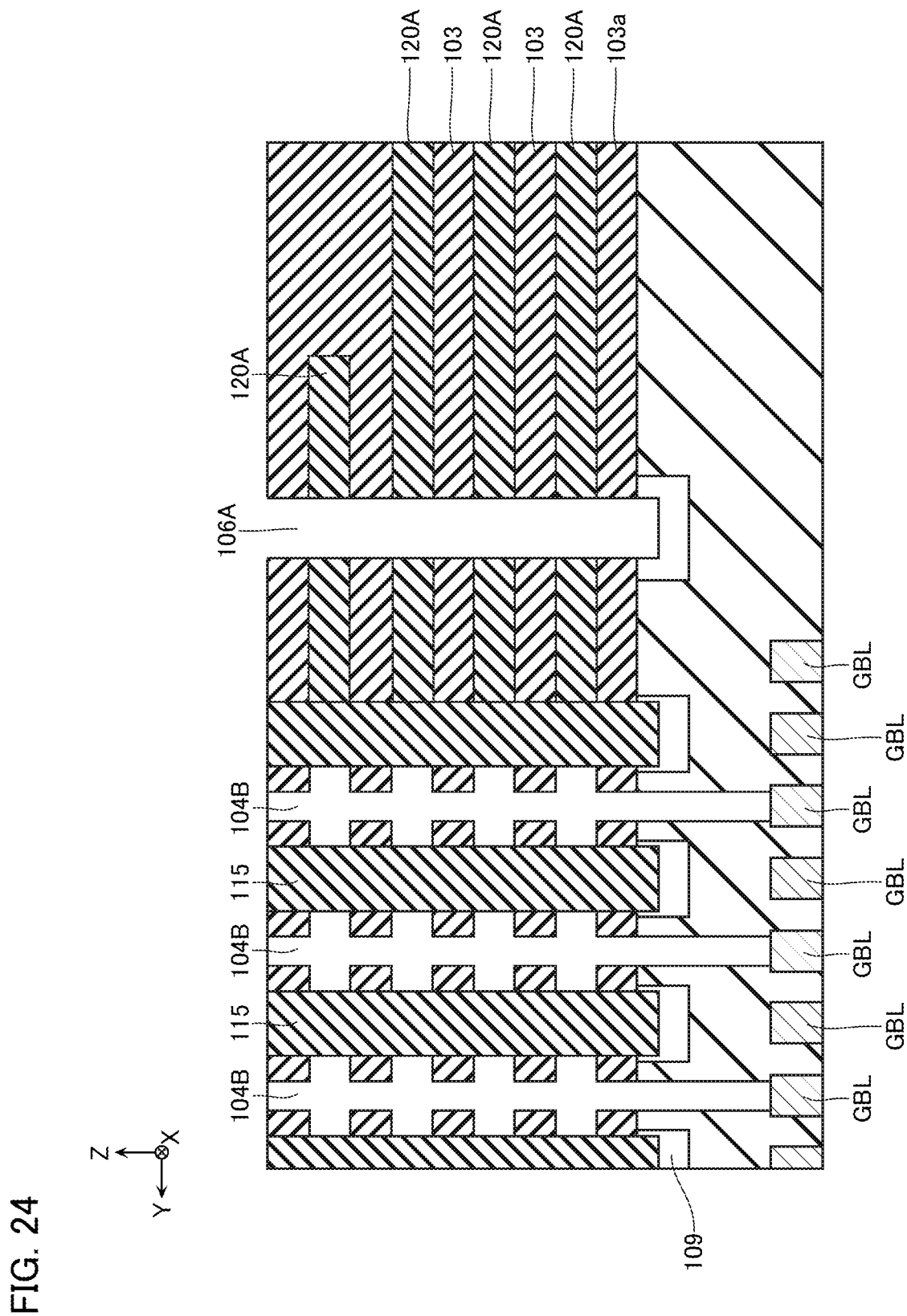
FIG. 24 is a schematic cross-sectional view for describing the manufacturing method.

Next, for example, as illustrated in FIG. 23 and FIG. 24, openings 106A are formed at positions corresponding to the conductive layers 106. The openings 106A extend in the Z-direction as illustrated in FIG. 24, and penetrate the plurality of insulating layers 103, the plurality of sacrifice layers 120A, and the insulating layer 103a arranged in the Z-direction, thus exposing the upper surfaces of the etching stoppers 109. This process is performed by RIE or the like.

Figure 25:
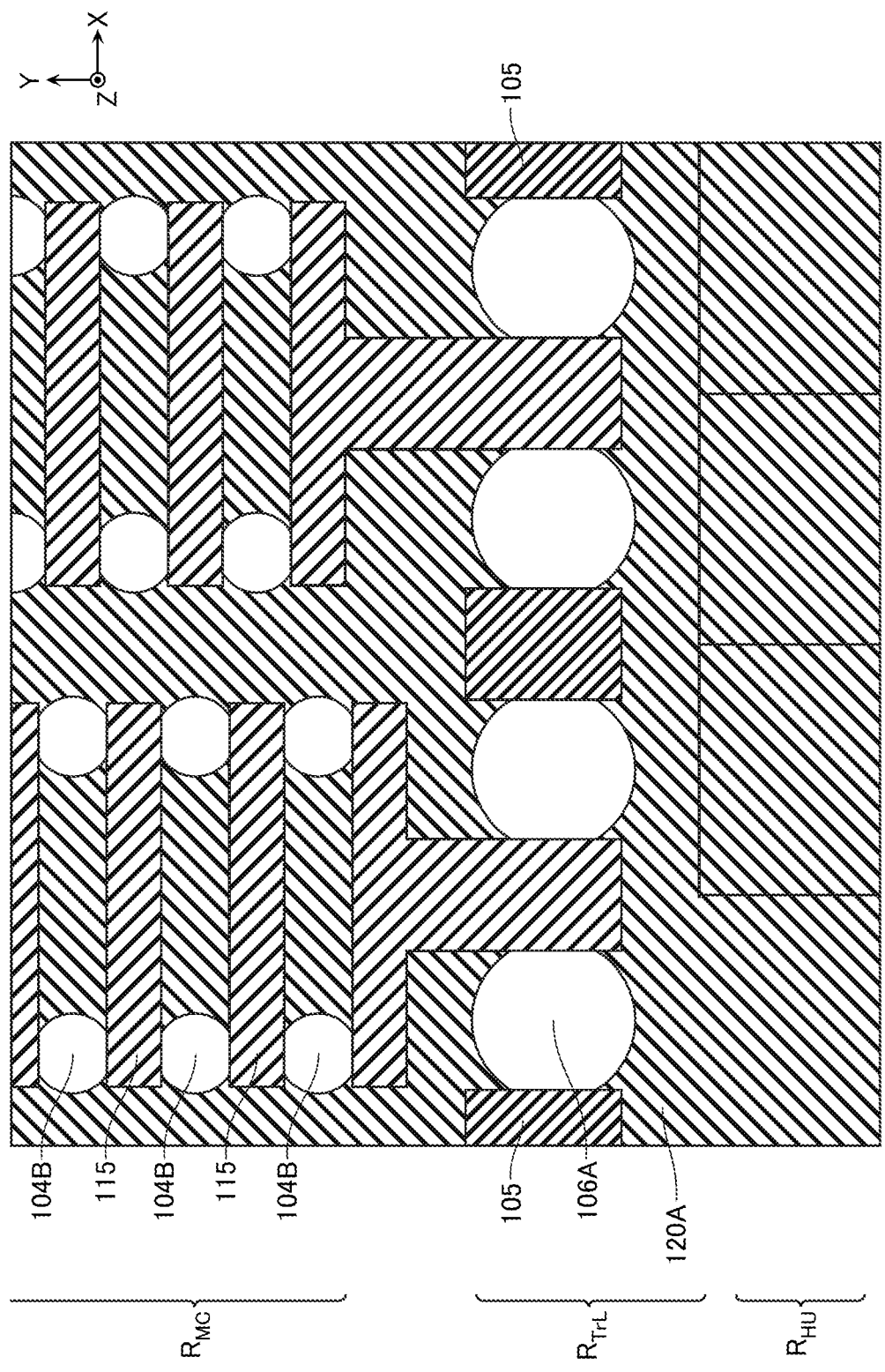
FIG. 25 is a schematic cross-sectional view for describing the manufacturing method.
Figure 26:
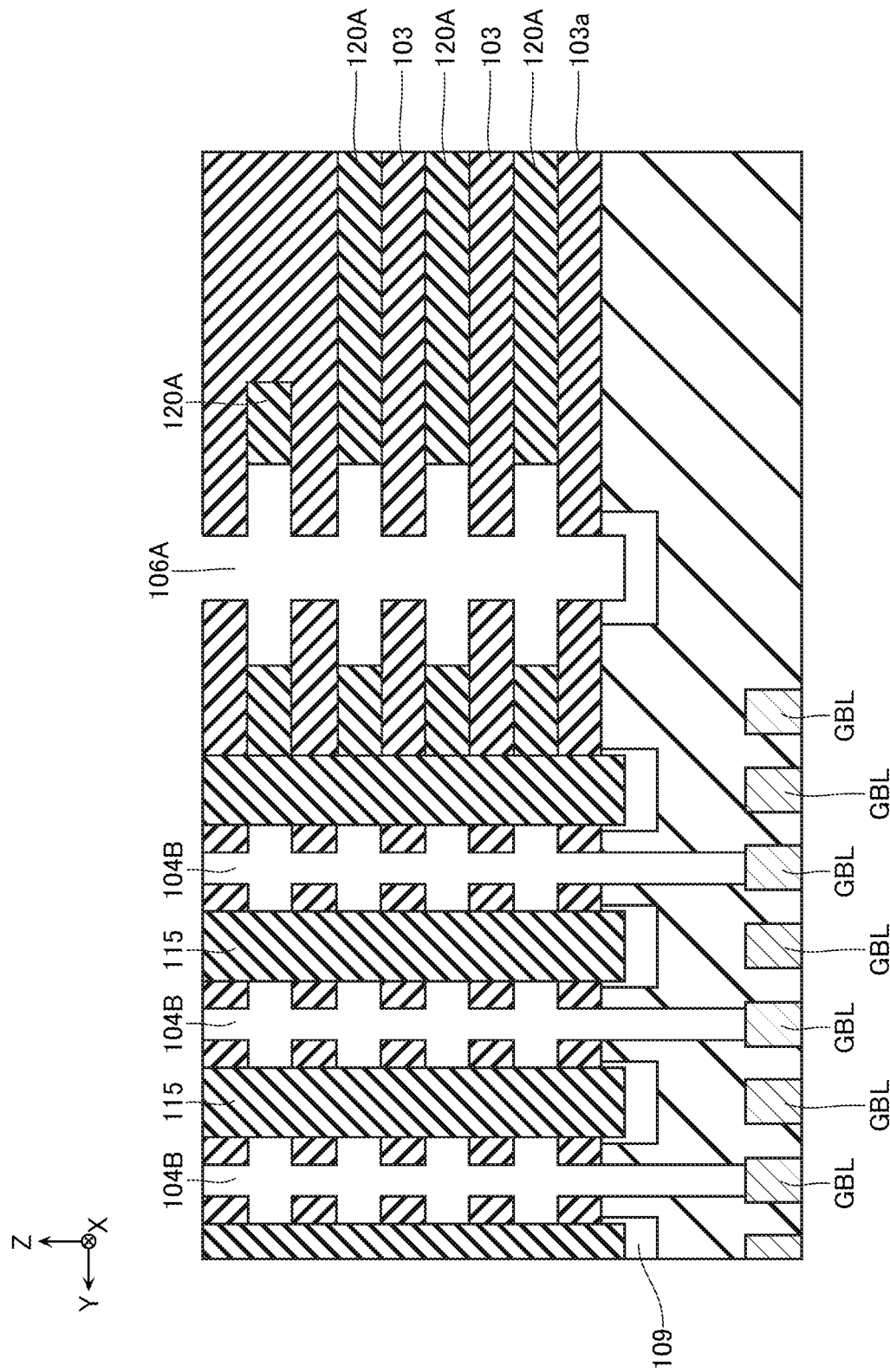
FIG. 26 is a schematic cross-sectional view for describing the manufacturing method.

Next, for example, as illustrated in FIG. 25 and FIG. 26, parts of the sacrifice layers 120A are selectively removed via the openings 106A. In this process, side surfaces in the X-direction of the insulating layers 105 are exposed to insides of the openings 106A, thereby separating the sacrifice layers 120A in the Y-direction. This process is performed by wet etching or the like.

Figure 27:
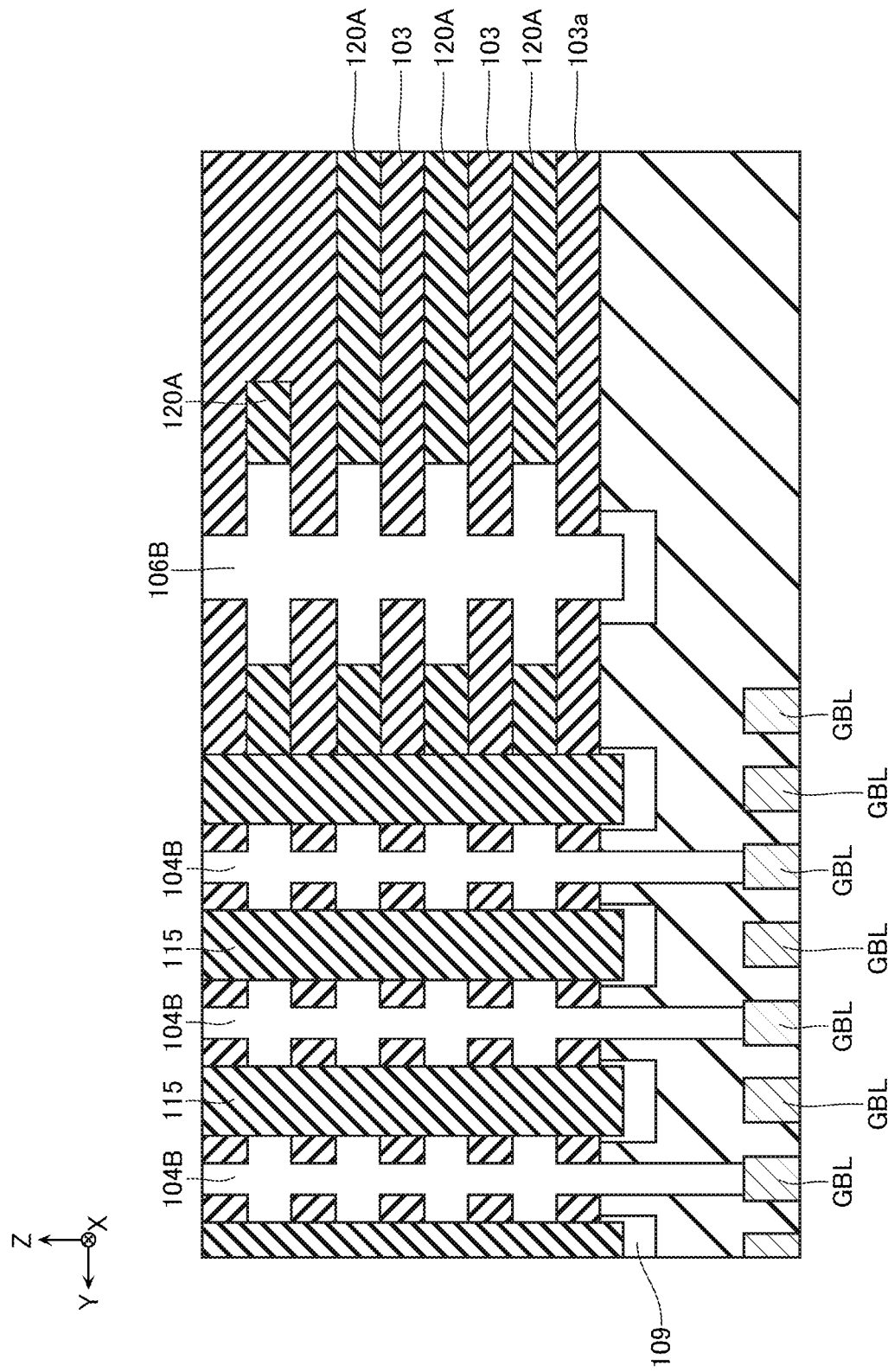
FIG. 27 is a schematic cross-sectional view for describing the manufacturing method.

Next, for example, as illustrated in FIG. 27, sacrifice layers 106B are formed inside the openings 106A. The sacrifice layer 106B contains silicon (Si) or the like. This process is performed by CVD or the like.

Figure 28:
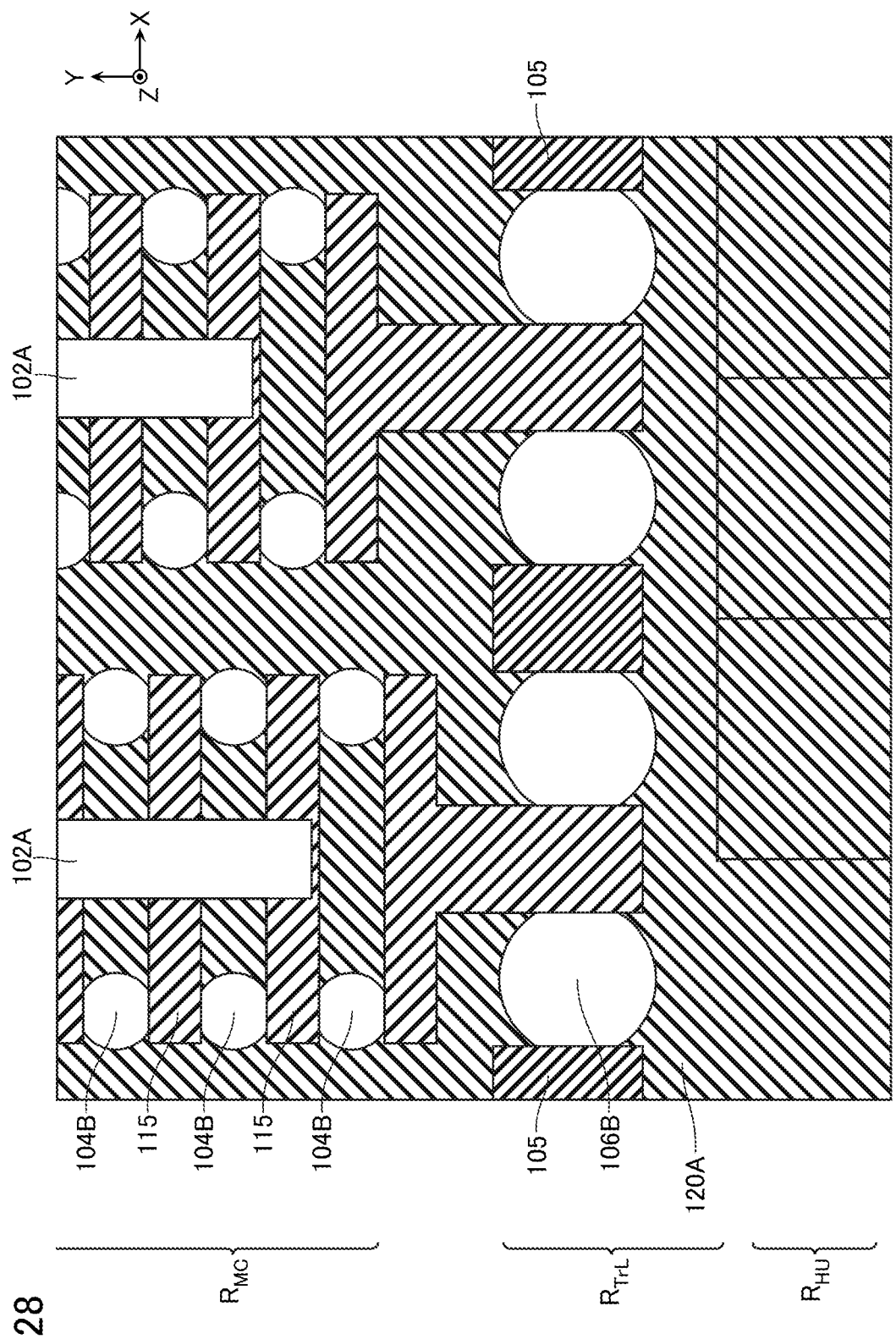
FIG. 28 is a schematic cross-sectional view for describing the manufacturing method.
Figure 29:
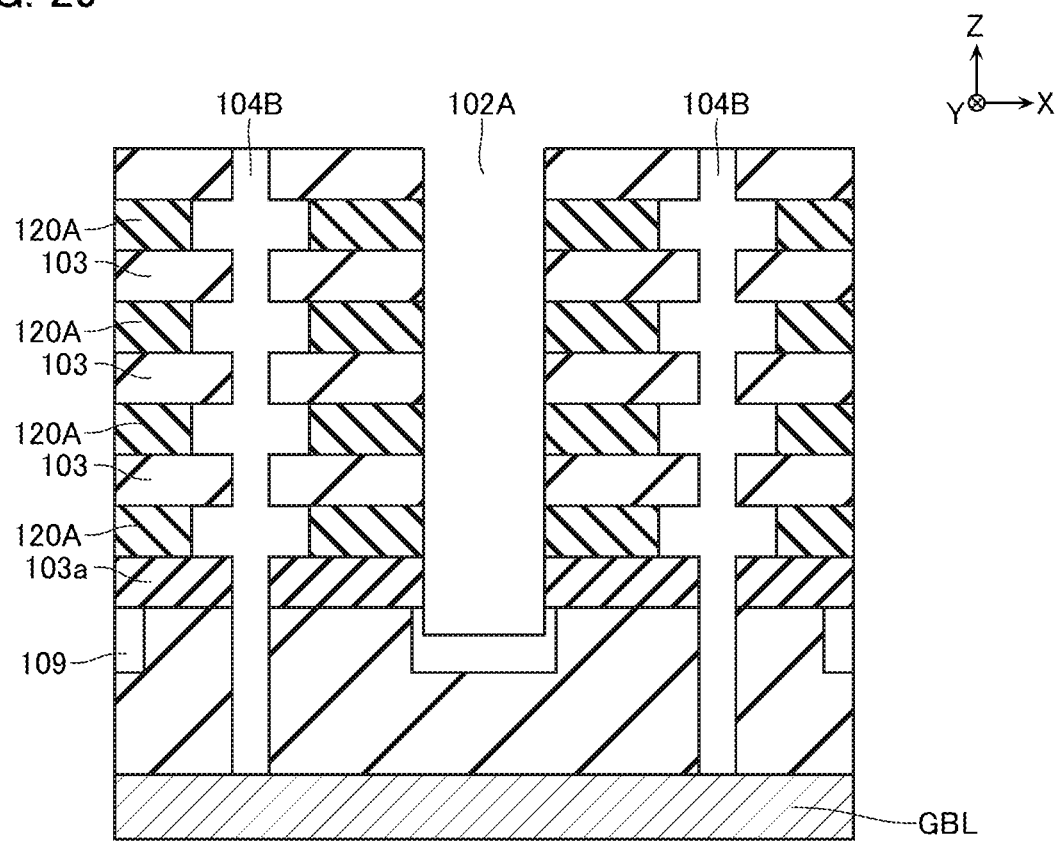
FIG. 29 is a schematic cross-sectional view for describing the manufacturing method.

Next, for example, as illustrated in FIG. 28 and FIG. 29, openings 102A are formed at positions corresponding to the conductive layers 102. The openings 102A extend in the Z-direction as illustrated in FIG. 29, and penetrate the plurality of insulating layers 103, the plurality of sacrifice layers 120A, and the insulating layer 103a arranged in the Z-direction, thus separating these configurations in the X-direction and exposing the upper surfaces of the etching stoppers 109. This process is performed by RIE or the like.

Figure 30:
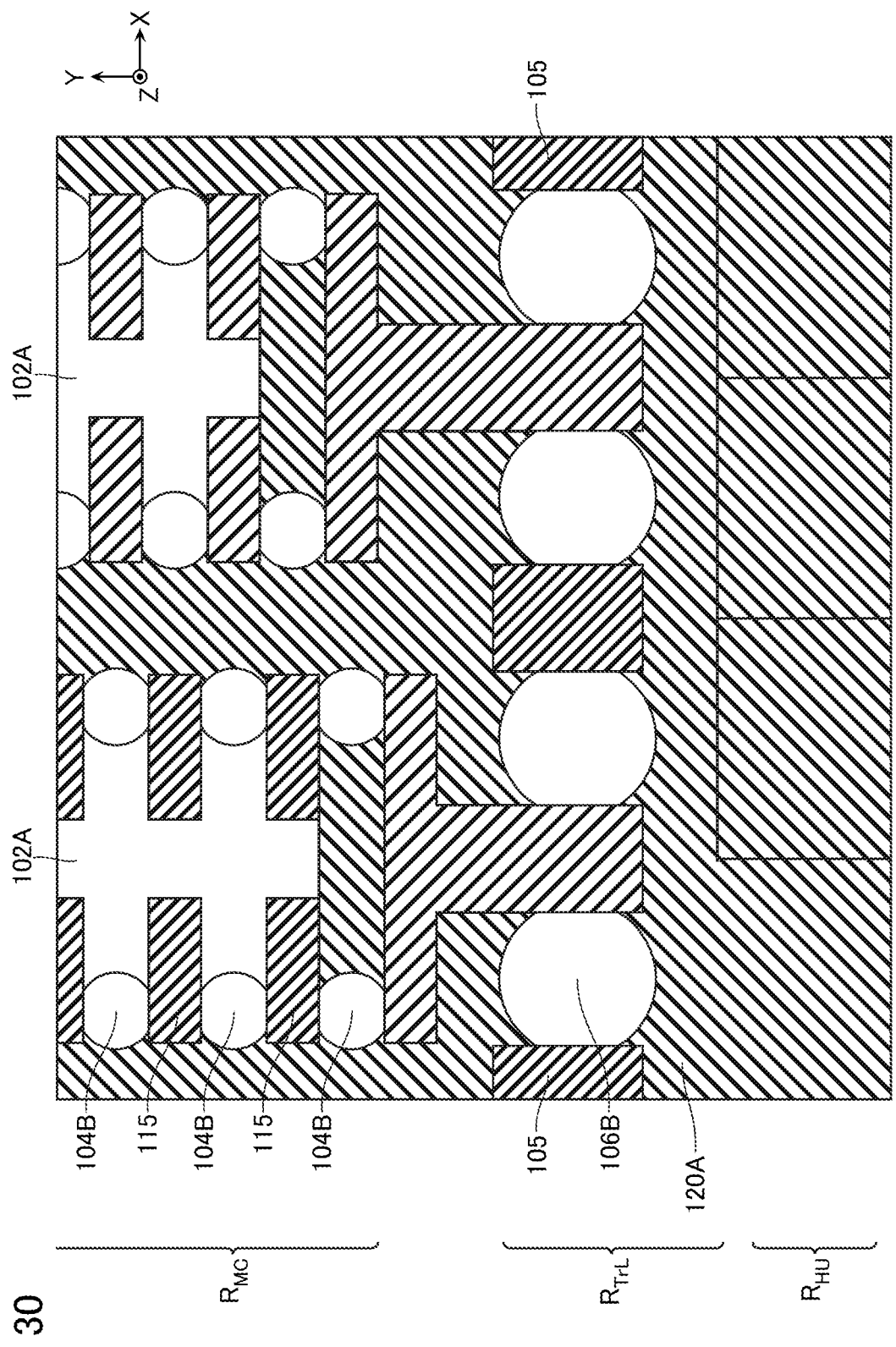
FIG. 30 is a schematic cross-sectional view for describing the manufacturing method.
Figure 31:
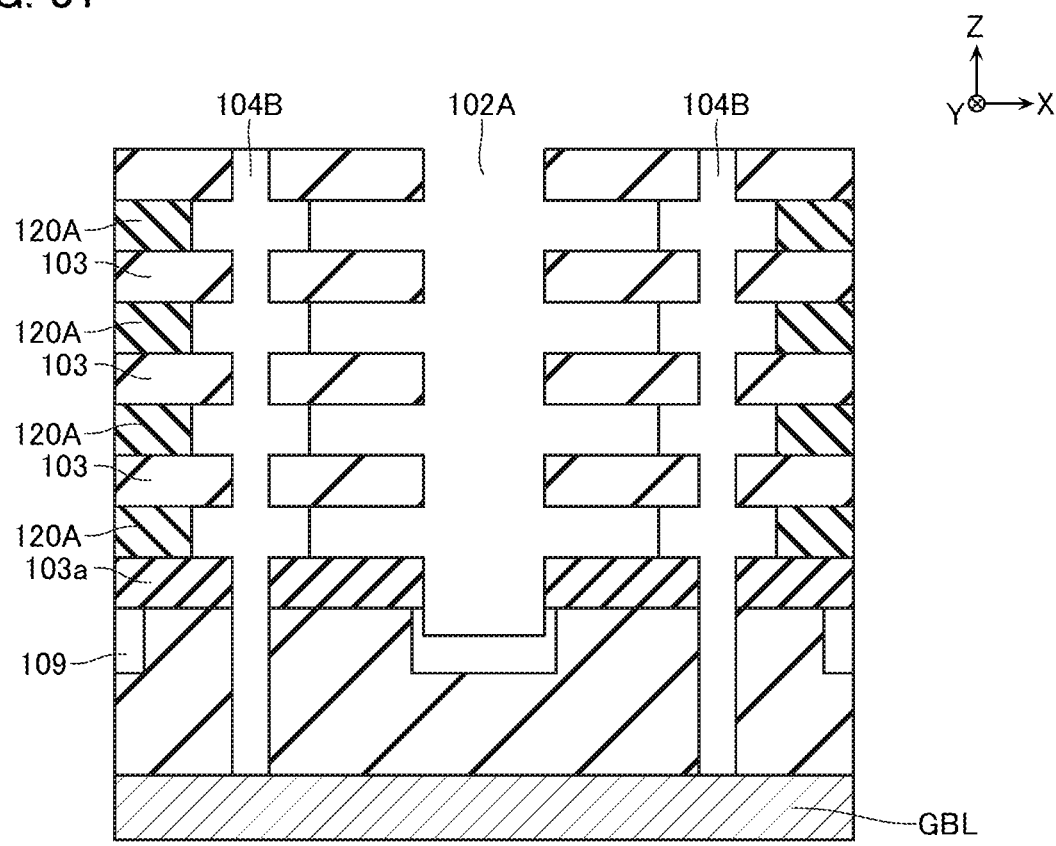
FIG. 31 is a schematic cross-sectional view for describing the manufacturing method.

Next, for example, as illustrated in FIG. 30 and FIG. 31, parts of the sacrifice layers 120A are selectively removed via the openings 102A. In this process, side surfaces in the X-direction of the sacrifice layers 104B are exposed to insides of the openings 102A. This process is performed by wet etching or the like.

Figure 32:
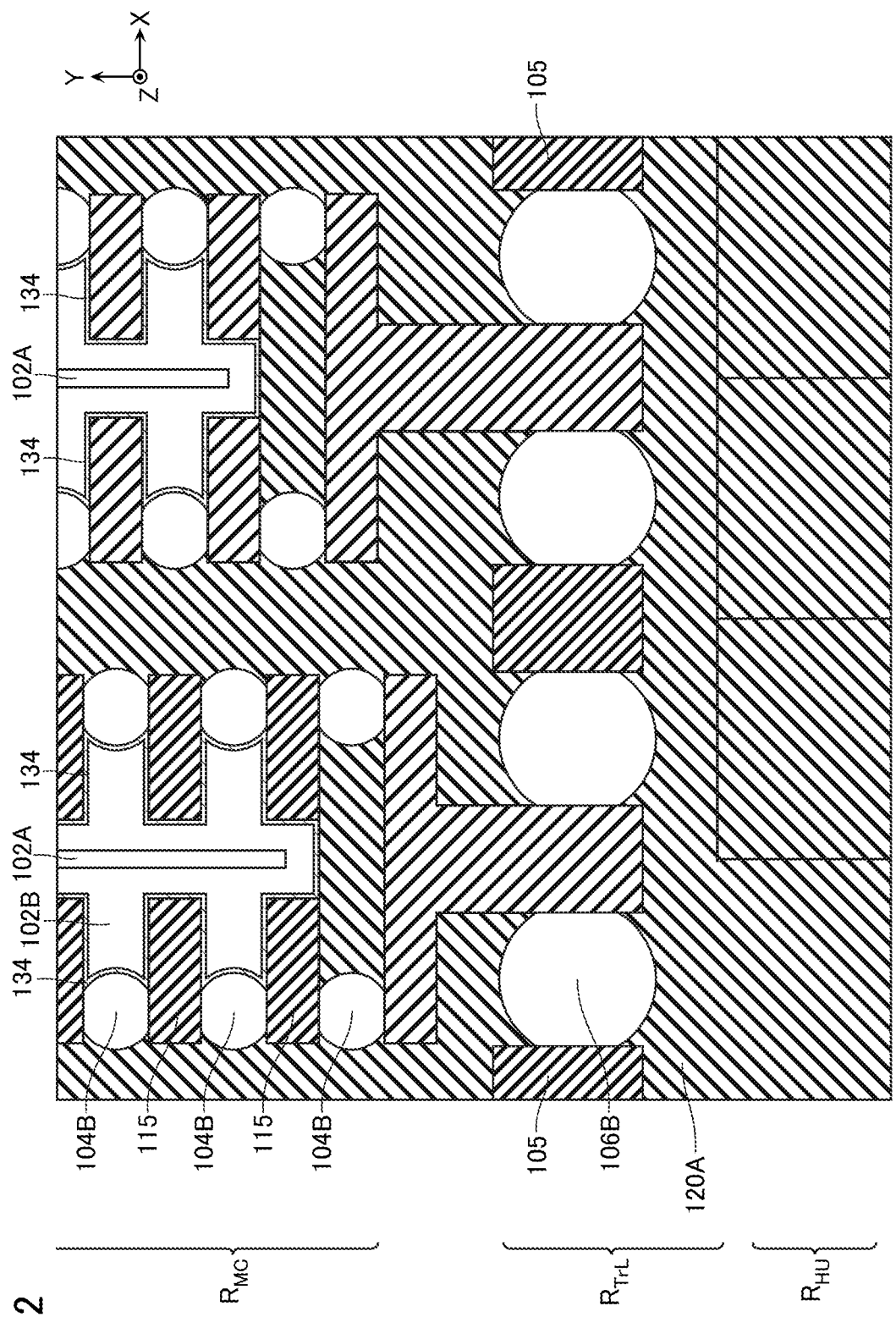
FIG. 32 is a schematic cross-sectional view for describing the manufacturing method.
Figure 33:
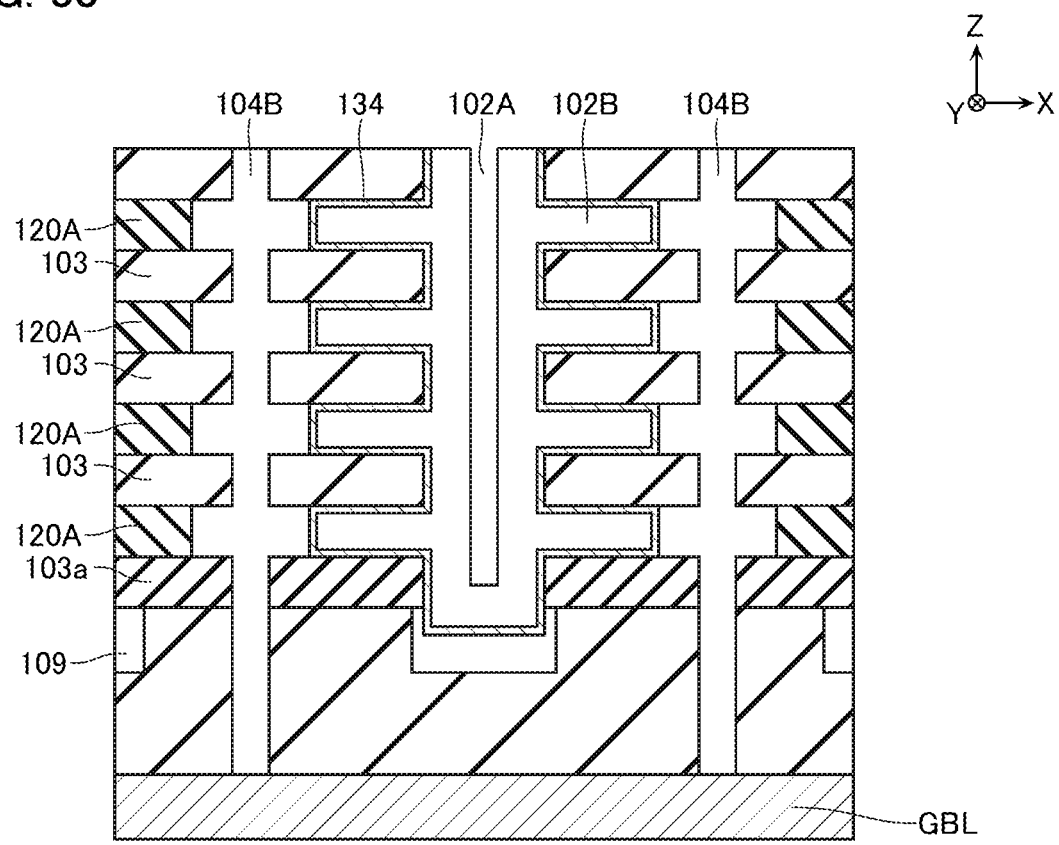
FIG. 33 is a schematic cross-sectional view for describing the manufacturing method.

Next, for example, as illustrated in FIG. 32 and FIG. 33, the conductive layers 134 are formed on side surfaces in the X-direction of the sacrifice layers 104B, side surfaces in the X-direction and the Y-direction of the insulating layers 115, and upper surfaces, lower surfaces, and side surfaces in the X-direction of the insulating layers 103 (FIG. 33) via the openings 102A. Sacrifice layers 102B are formed inside the openings 102A. The sacrifice layer 102B contains silicon (Si) or the like. In this process, for example, as illustrated in FIG. 33, a region between the two insulating layers 103 mutually adjacent in the Z-direction is filled with the sacrifice layer 102B. Meanwhile, a region between the two insulating layers 103 mutually adjacent in the X-direction is not filled with the sacrifice layer 102B. This process is performed by, for example, Atomic Layer Deposition (ALD) and CVD.

Figure 34:
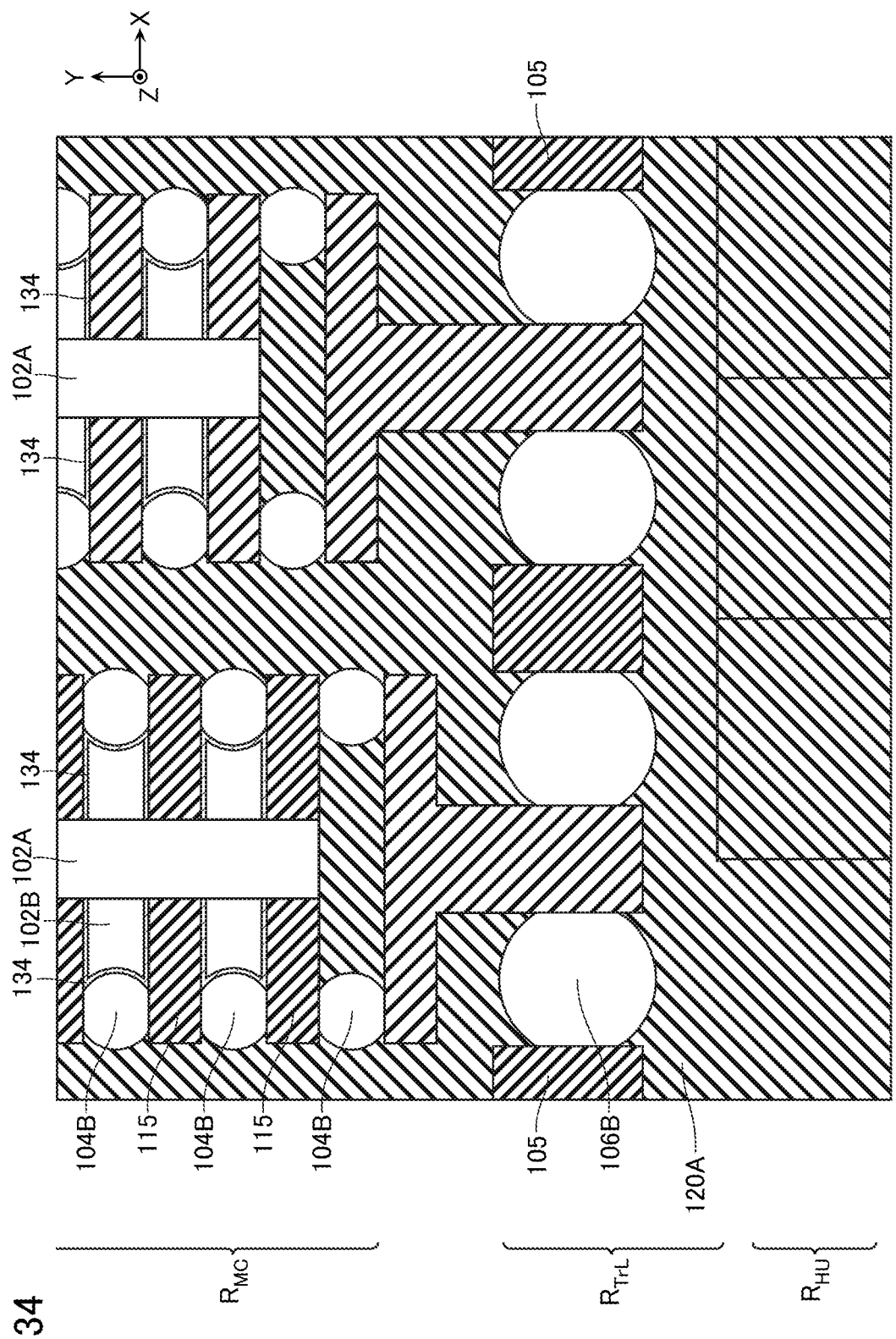
FIG. 34 is a schematic cross-sectional view for describing the manufacturing method.
Figure 35:
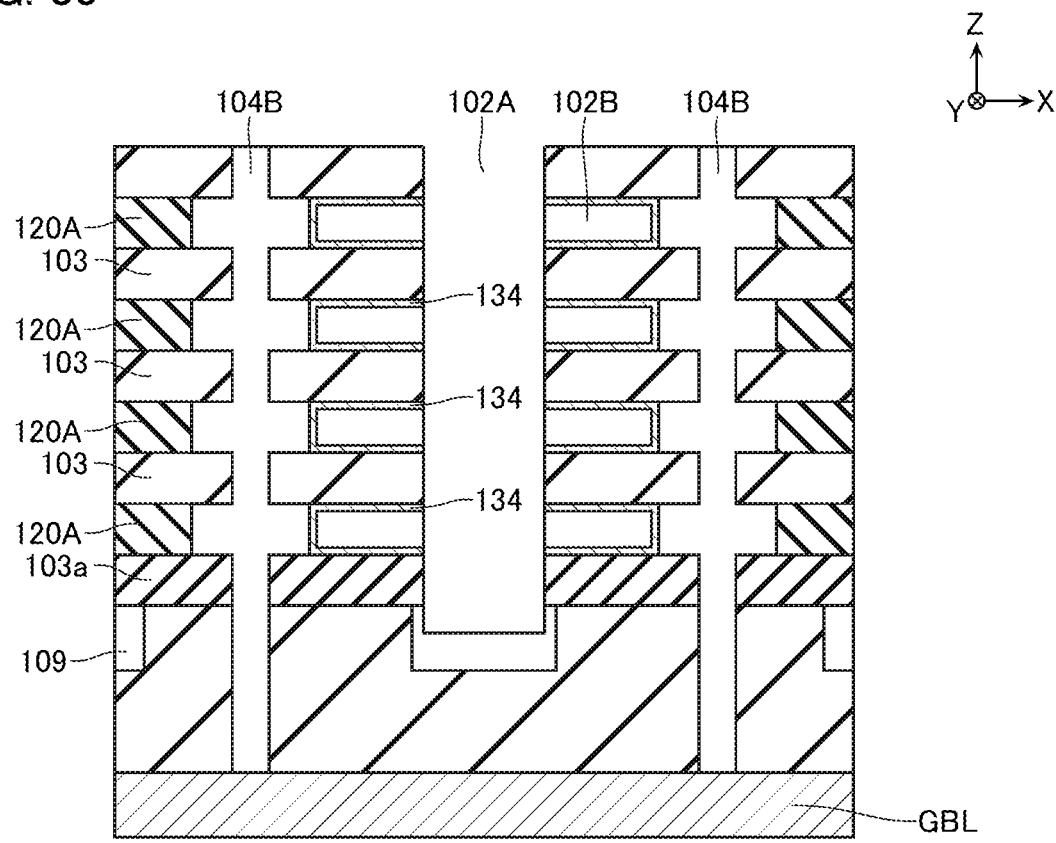
FIG. 35 is a schematic cross-sectional view for describing the manufacturing method.

Next, for example, as illustrated in FIG. 34 and FIG. 35, the sacrifice layers 102B and the conductive layers 134 are partially removed via the openings 102A. In this process, for example, parts of the sacrifice layers 102B are removed to expose the parts of the conductive layers 134 disposed on the side surfaces in the X-direction of the insulating layers 115

(FIG. 32) and the insulating layers 103 (FIG. 33), thus removing these parts. This process is performed by wet etching or the like.

Figure 36:
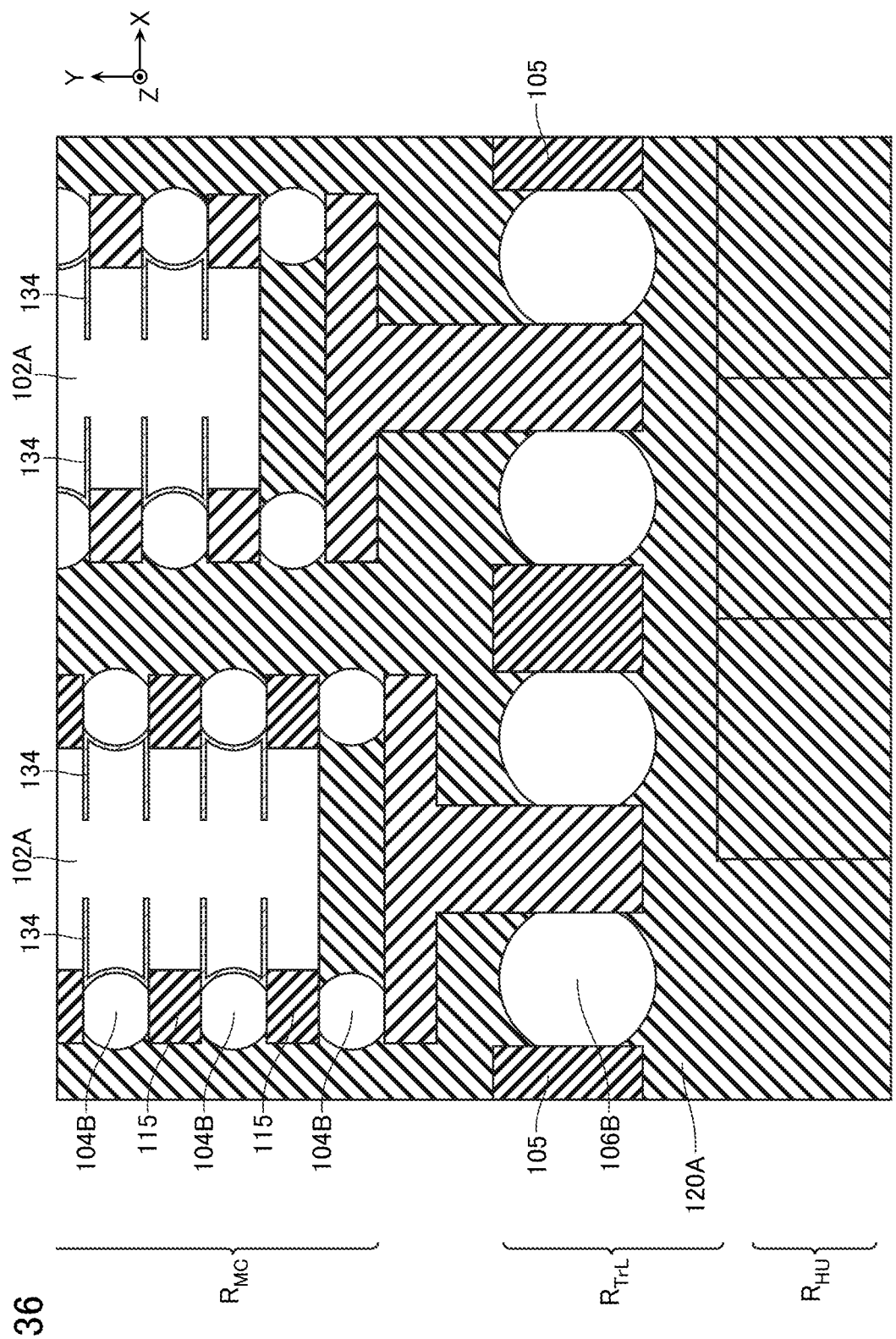
FIG. 36 is a schematic cross-sectional view for describing the manufacturing method.
Figure 37:
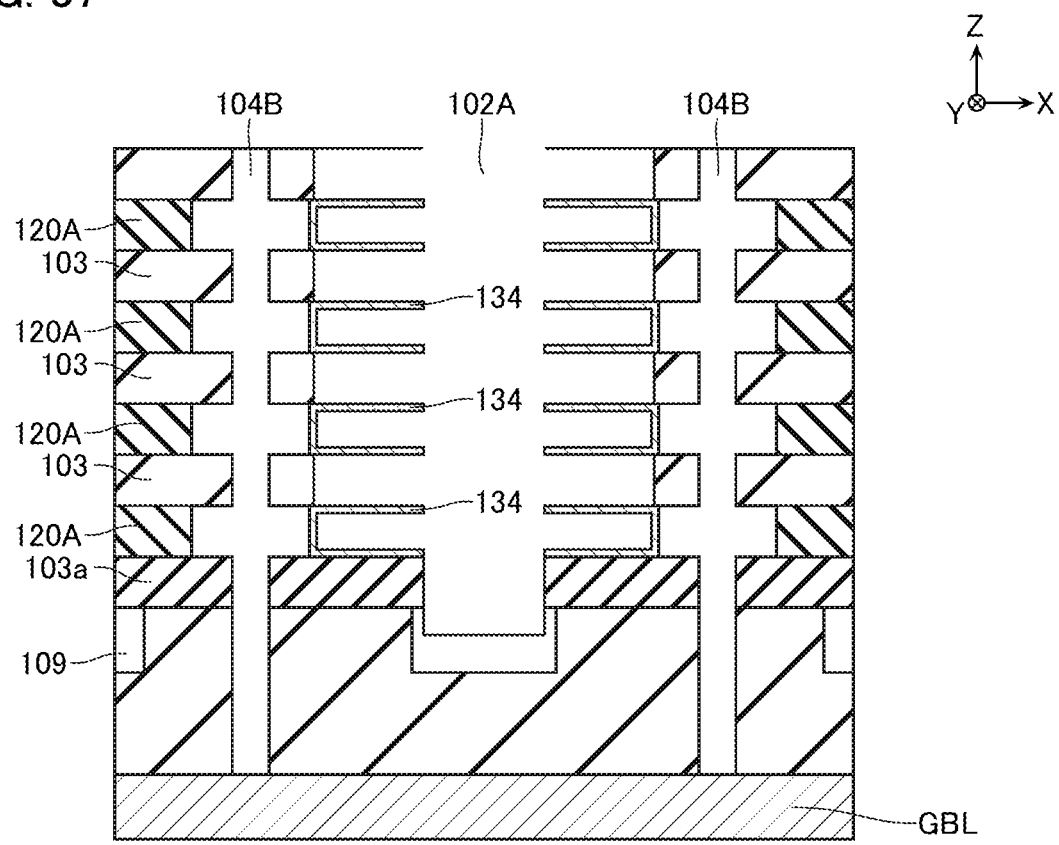
FIG. 37 is a schematic cross-sectional view for describing the manufacturing method.

Next, for example, as illustrated in FIG. 36 and FIG. 37, the sacrifice layers 102B, parts of the insulating layers 115 (FIG. 34), and parts of the insulating layers 103 (FIG. 35) are removed via the openings 102A. In this process, the sacrifice layers 102B are completely removed. The insulating layers 115 (FIG. 34) and the insulating layers 103 (FIG. 35) are removed in a range where the sacrifice layers 104B are not exposed to the openings 102A. This process is performed by wet etching or the like.

Figure 38:
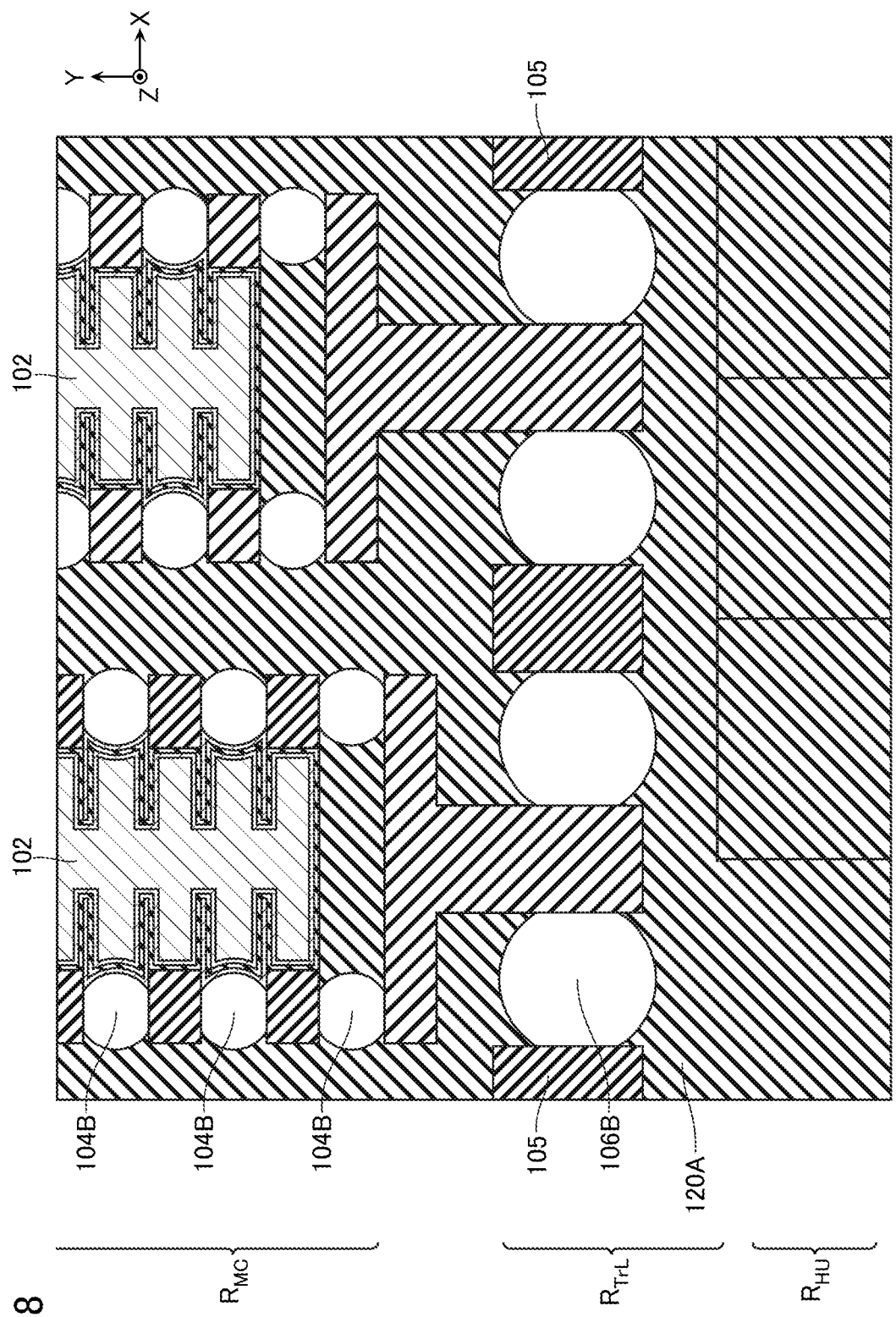
FIG. 38 is a schematic cross-sectional view for describing the manufacturing method.
Figure 39:
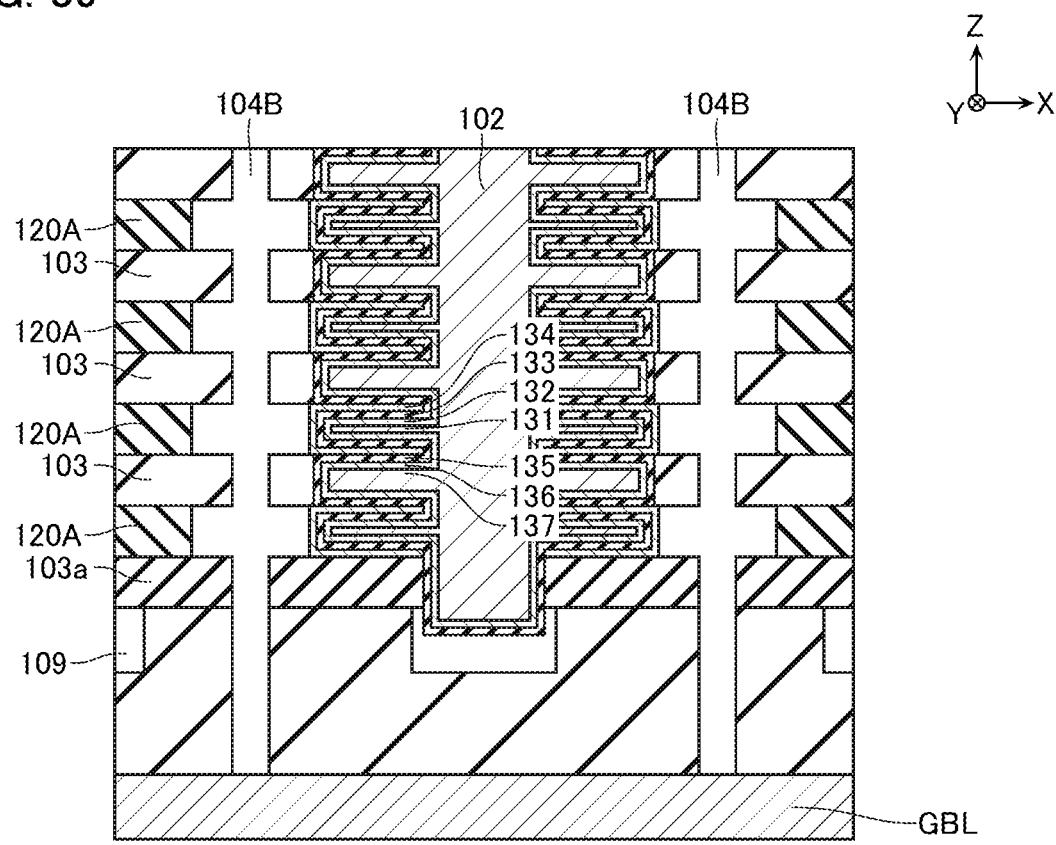
FIG. 39 is a schematic cross-sectional view for describing the manufacturing method.

Next, for example, as illustrated in FIG. 38 and FIG. 39, the insulating layers 133, 135, the conductive layers 132, 136, and the conductive layers 131, 137, 102 are formed on upper surfaces, lower surfaces, side surfaces in the X-direction, side surfaces in the Y-direction of the conductive layers 134 via the openings 102A. This process is performed by CVD or the like.

Figure 40:
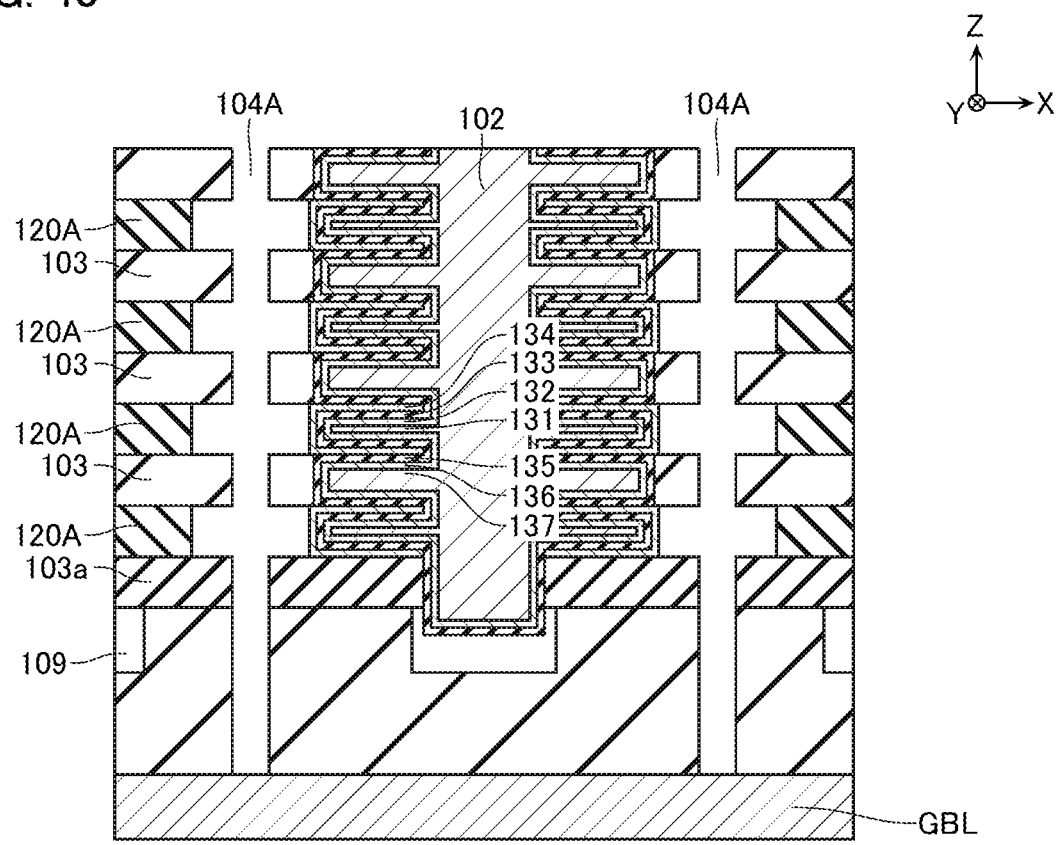
FIG. 40 is a schematic cross-sectional view for describing the manufacturing method.

Next, for example, as illustrated in FIG. 40, the sacrifice layers 104B are removed. This process is performed by wet etching or the like.

Figure 41:
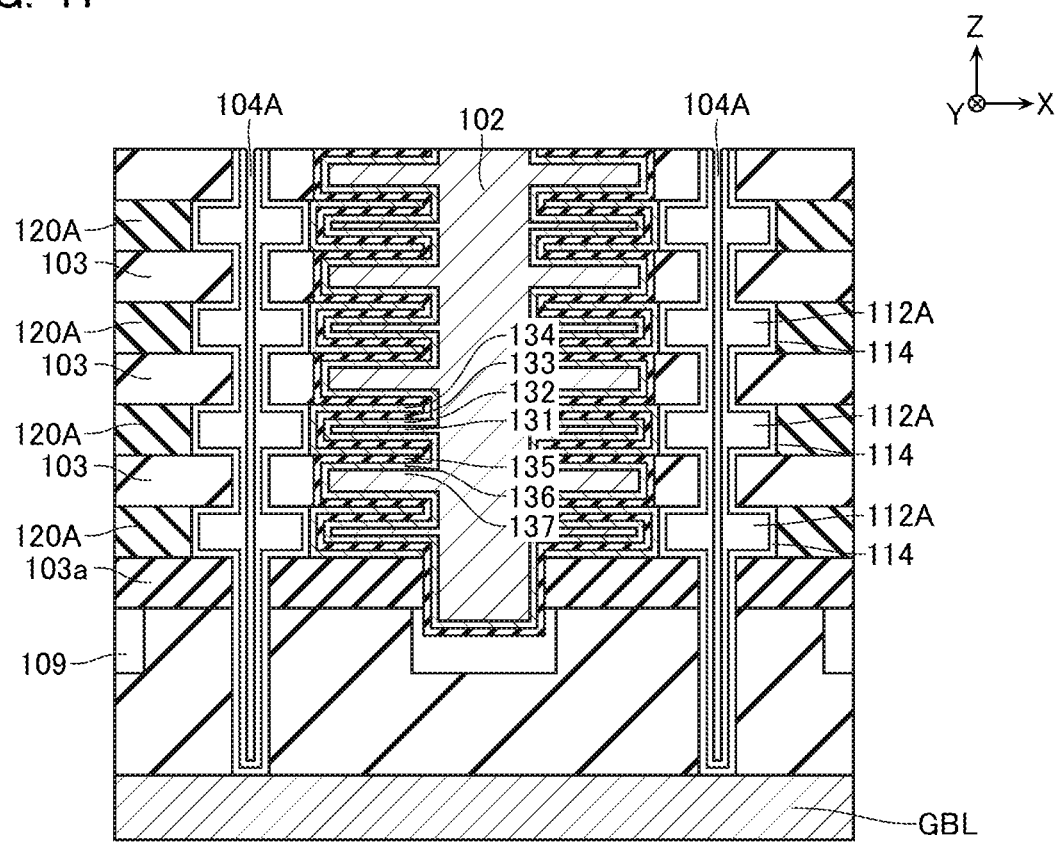
FIG. 41 is a schematic cross-sectional view for describing the manufacturing method.

Next, for example, as illustrated in FIG. 41, the semiconductor layers 114 are formed on side surfaces in the X-direction of the sacrifice layers 120A and the conductive layers 134, the side surfaces in the Y-direction of the insulating layers 115, and upper surfaces and lower surfaces of the insulating layers 103 via the openings 104A. Sacrifice layers 112A are each formed in a region between the two insulating layers 103 mutually adjacent in the Z-direction. In this process, for example, as illustrated in FIG. 41, the regions between two insulating layers 103 mutually adjacent in the Z-direction are filled with the sacrifice layers 112A. Meanwhile, the openings 104A are not filled with the sacrifice layers 112A. This process is performed by, for example, ALD and CVD.

Figure 42:
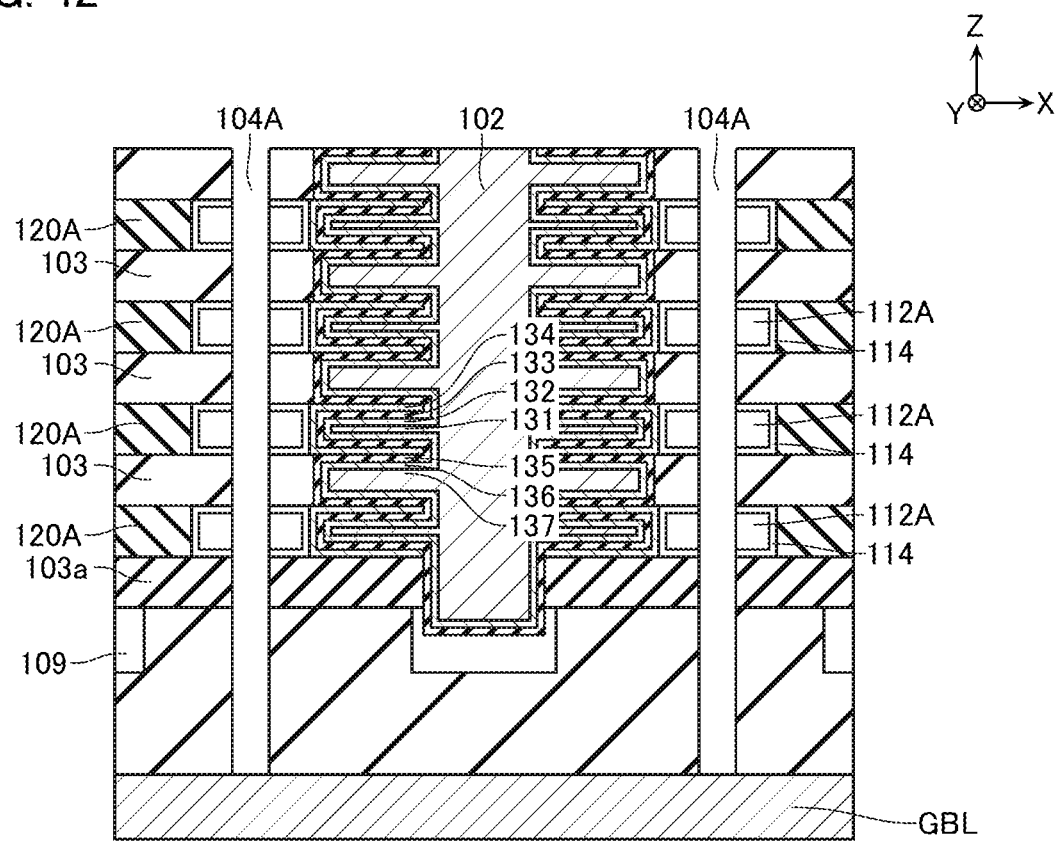
FIG. 42 is a schematic cross-sectional view for describing the manufacturing method.

Next, for example, as illustrated in FIG. 42, the sacrifice layers 112A and the semiconductor layers 114 are partially removed via the openings 104A. In this process, for example, parts of the sacrifice layers 112A are removed to expose parts of the semiconductor layers 114 disposed on inner peripheral surfaces of the insulating layers 103, and these parts are removed. This process is performed by wet etching or the like.

Figure 43:
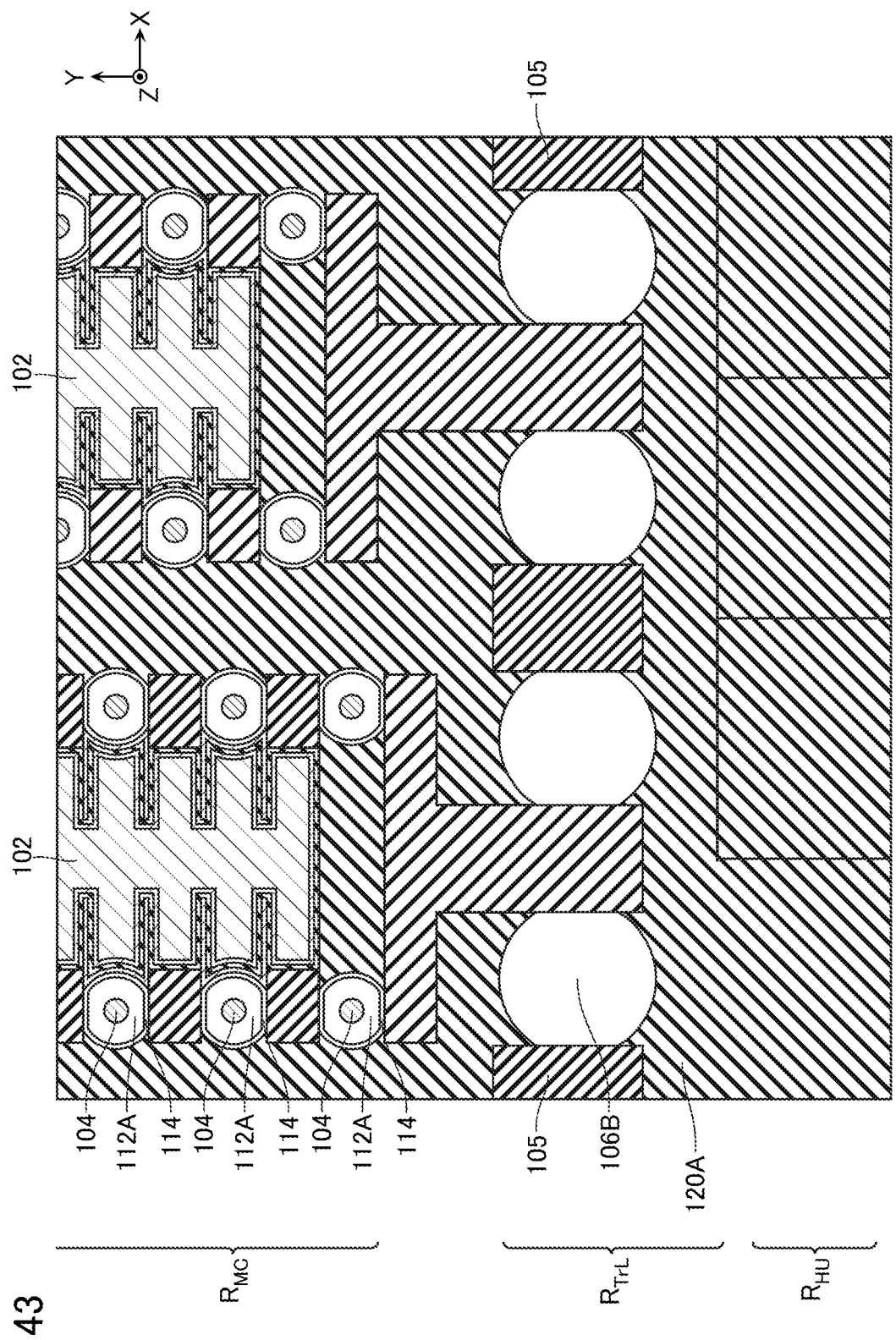
FIG. 43 is a schematic cross-sectional view for describing the manufacturing method.
Figure 44:
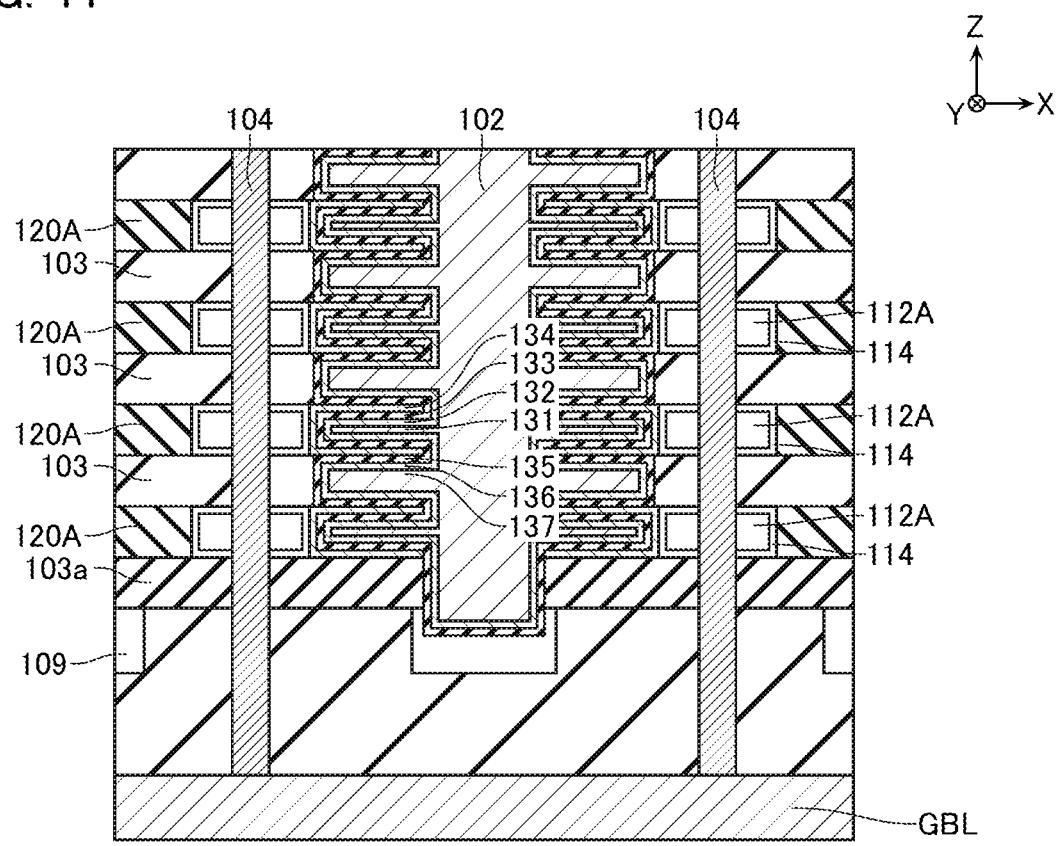
FIG. 44 is a schematic cross-sectional view for describing the manufacturing method.

Next, for example, as illustrated in FIG. 43 and FIG. 44, the conductive layers 104 are formed inside the openings 104A. This process is performed by, for example, ALD and CVD.

Figure 45:
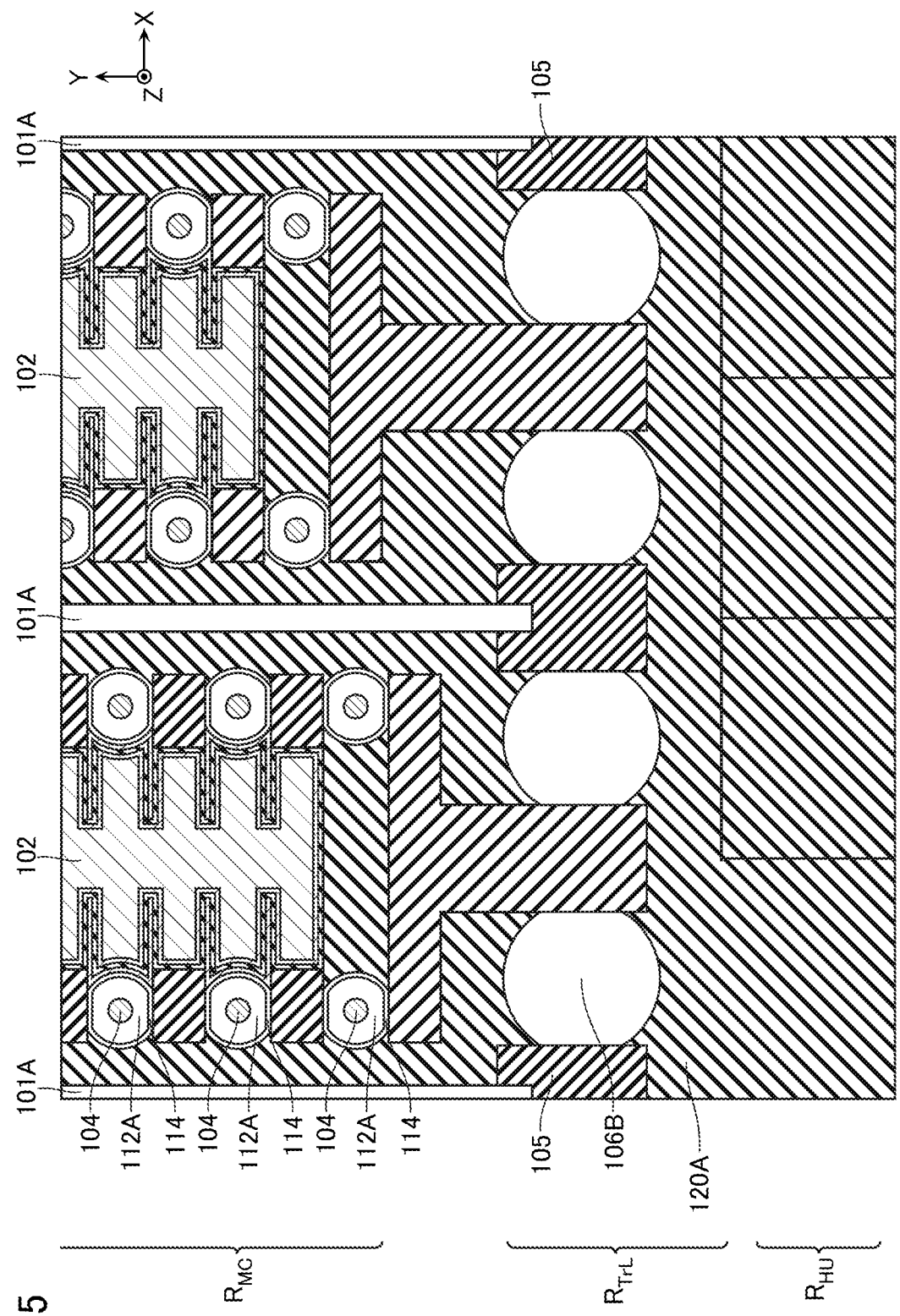
FIG. 45 is a schematic cross-sectional view for describing the manufacturing method.
Figure 46:
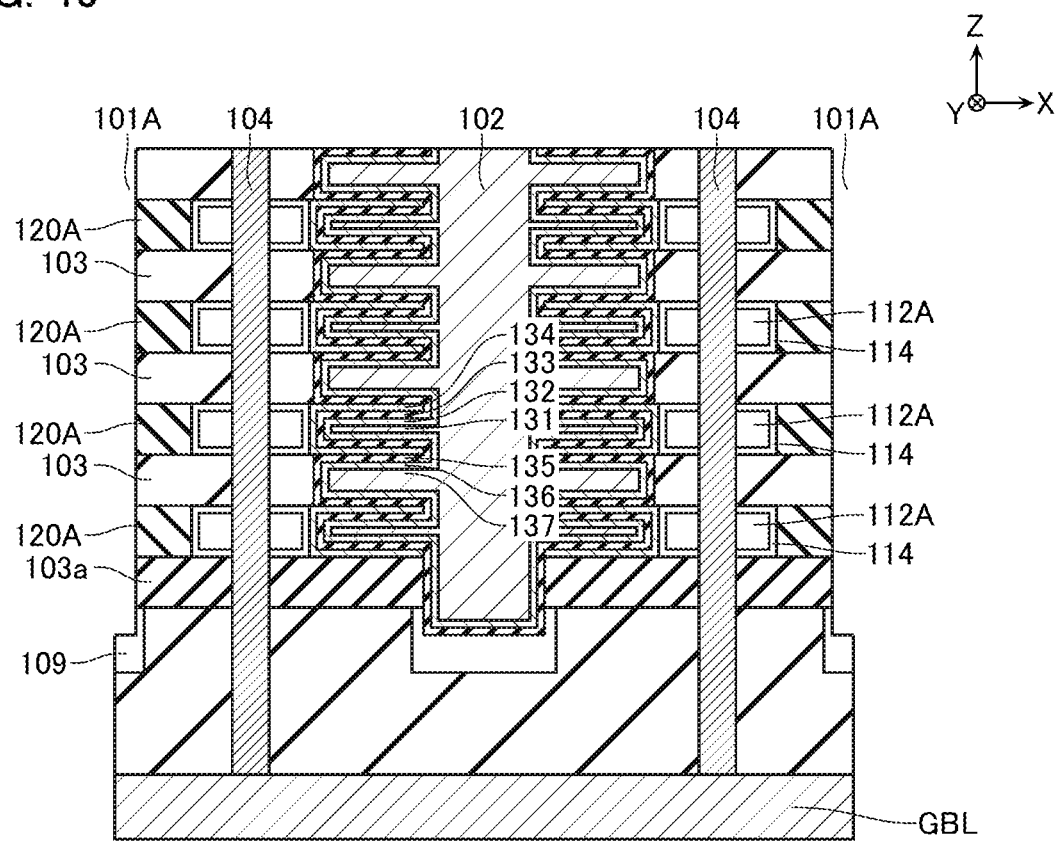
FIG. 46 is a schematic cross-sectional view for describing the manufacturing method.

Next, for example, as illustrated in FIG. 45 and FIG. 46, openings 101A are formed at positions corresponding to the insulating layers 101. The openings 101A extend in the Z-direction as illustrated in FIG. 46, and penetrate the plurality of insulating layers 103, the plurality of sacrifice layers 120A, and the insulating layer 103a arranged in the Z-direction to separate these configurations in the X-direction, thus exposing upper surfaces of the etching stoppers 109. This process is performed by RIE or the like.

Figure 47:
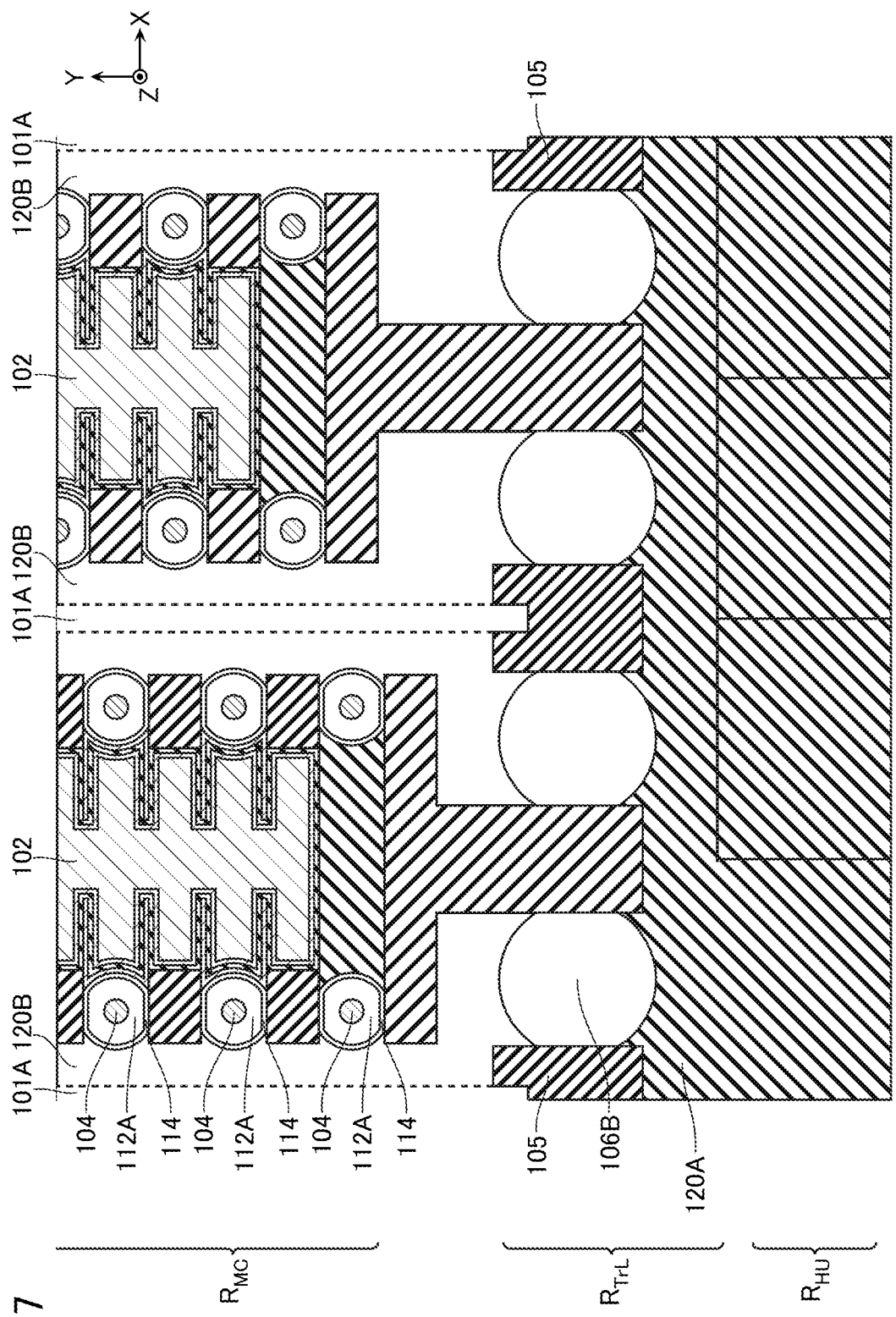
FIG. 47 is a schematic cross-sectional view for describing the manufacturing method.
Figure 48:
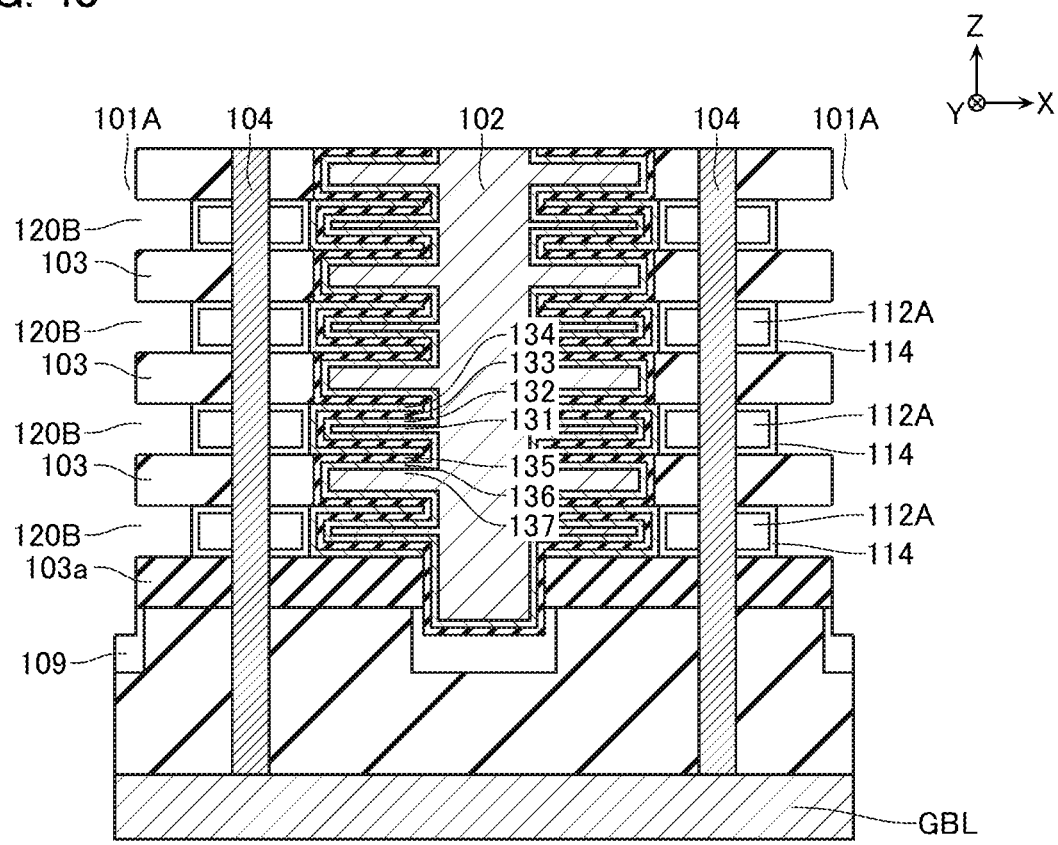
FIG. 48 is a schematic cross-sectional view for describing the manufacturing method.

Next, for example, as illustrated in FIG. 47 and FIG. 48, the sacrifice layers 120A are removed via the openings 101A. This process is performed by wet etching or the like. In the drawing, openings formed at the portions at which the sacrifice layers 120A were disposed are illustrated as openings 120B.

Figure 49:
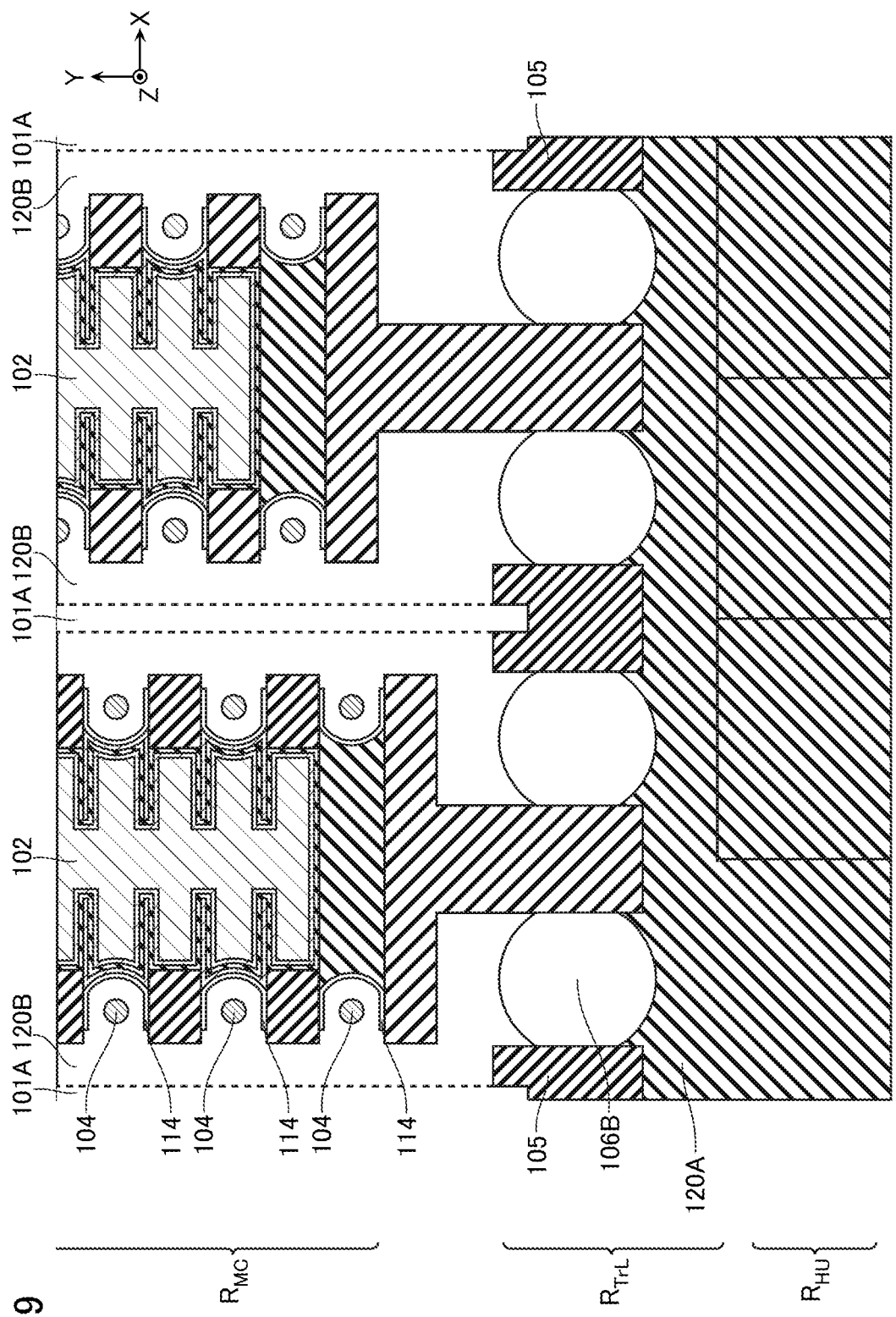
FIG. 49 is a schematic cross-sectional view for describing the manufacturing method.
Figure 50:
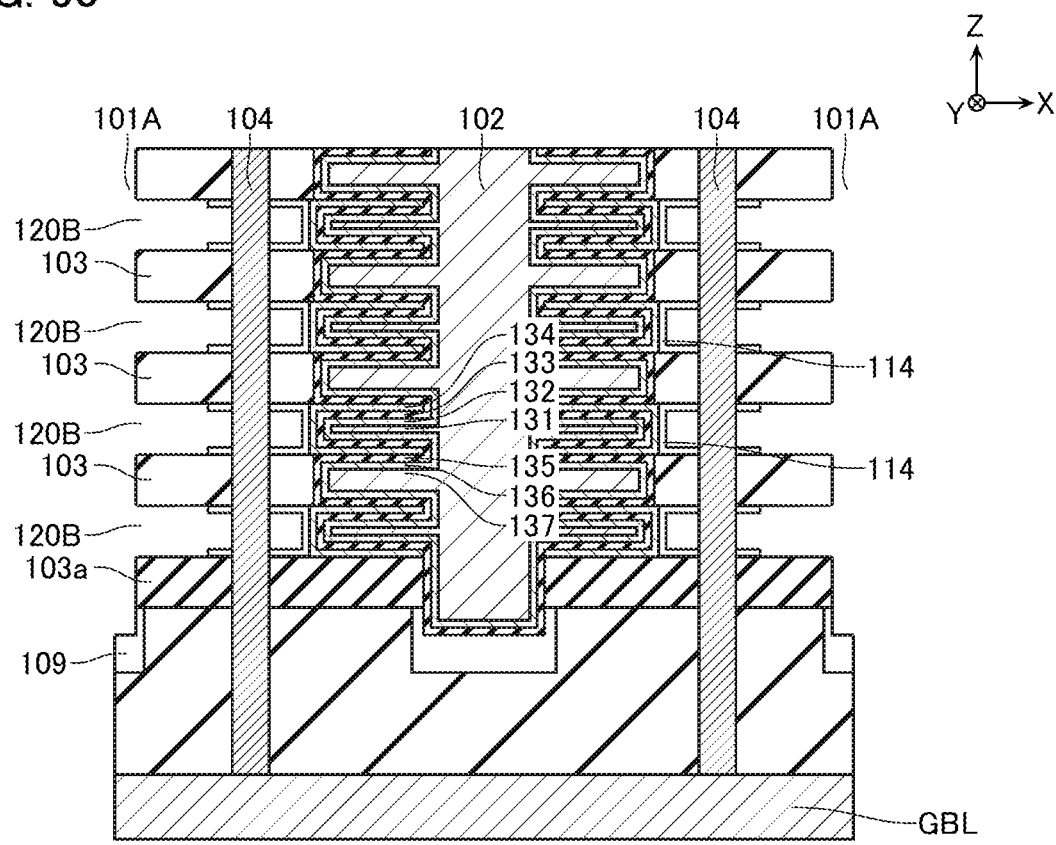
FIG. 50 is a schematic cross-sectional view for describing the manufacturing method.

Next, for example, as illustrated in FIG. 49 and FIG. 50, parts of the semiconductor layers 114 are removed via the openings 101A, 120B, thus exposing parts of the sacrifice layers 112A. The sacrifice layers 112A are removed via the openings 101A, 120B, thus exposing the outer peripheral surfaces of the conductive layers 104. This process is performed by wet etching or the like.

Figure 51:
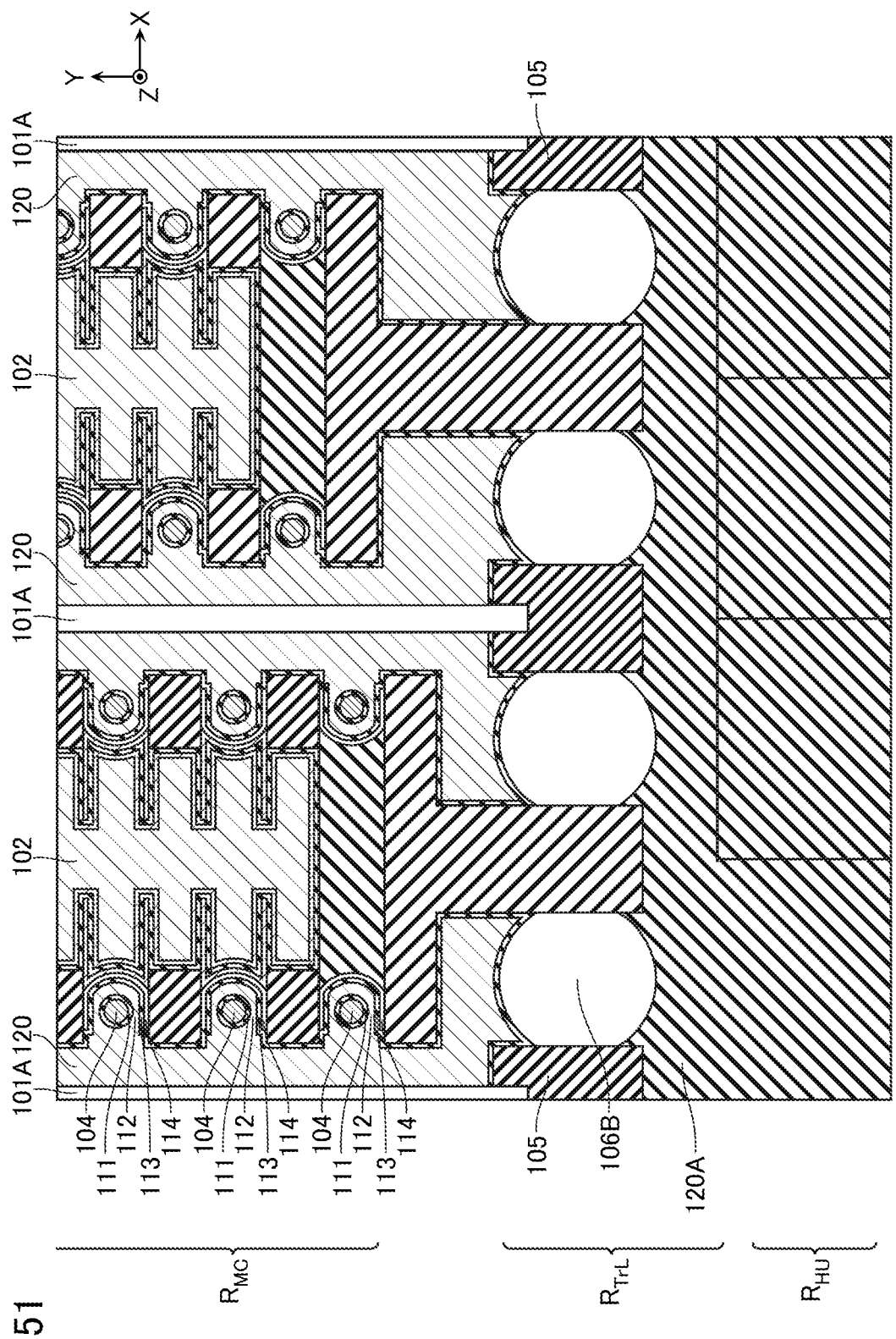
FIG. 51 is a schematic cross-sectional view for describing the manufacturing method.
Figure 52:
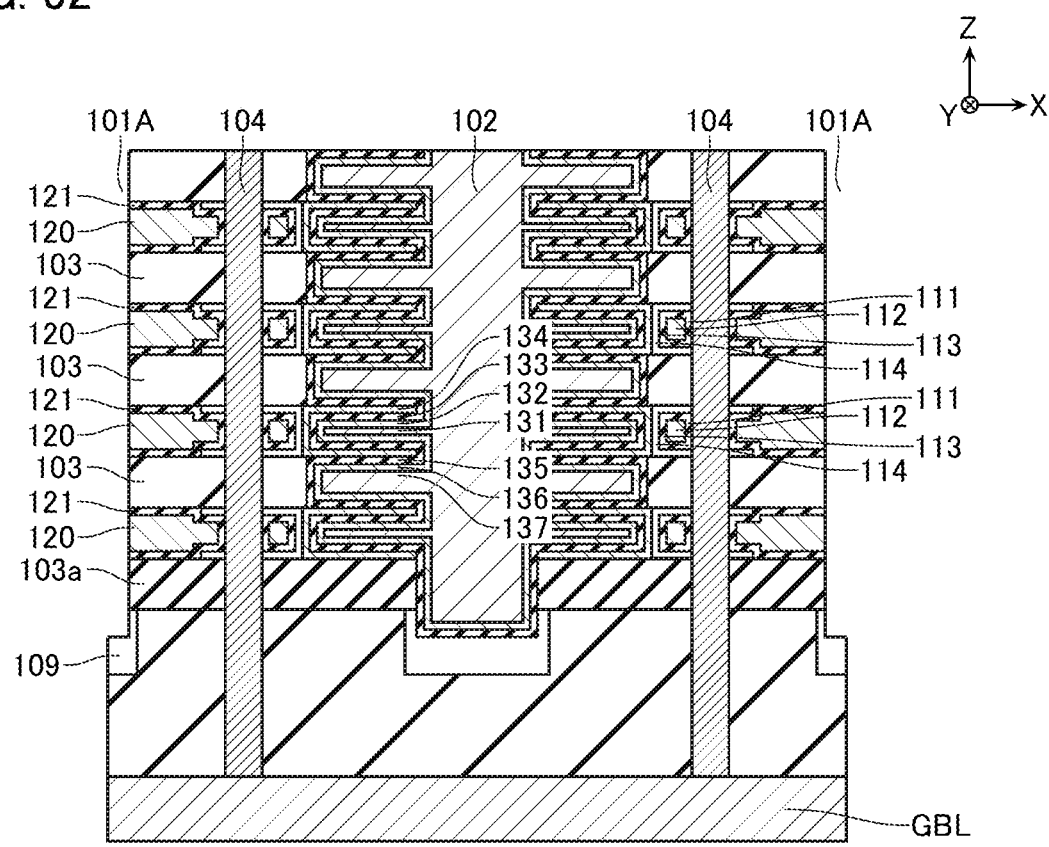
FIG. 52 is a schematic cross-sectional view for describing the manufacturing method.

Next, for example, as illustrated in FIG. 51 and FIG. 52, the insulating layers 111, 113, 121 are formed, and the conductive layers 112, 120 are formed inside the openings 120B. In this process, for example, the insulating layers and the conductive layers are formed in the openings 101A, 120B by CVD or the like. At this time, the openings 120B are filled with the conductive layers. Meanwhile, the openings 101A are not filled with the conductive layers. Next, for example, in these insulating layers and conductive layers, the parts disposed on the inner peripheral surfaces of the insulating layers 103 are removed by wet etching or the like. Then, the insulating layers 101 are formed inside the openings 101A.

Figure 53:
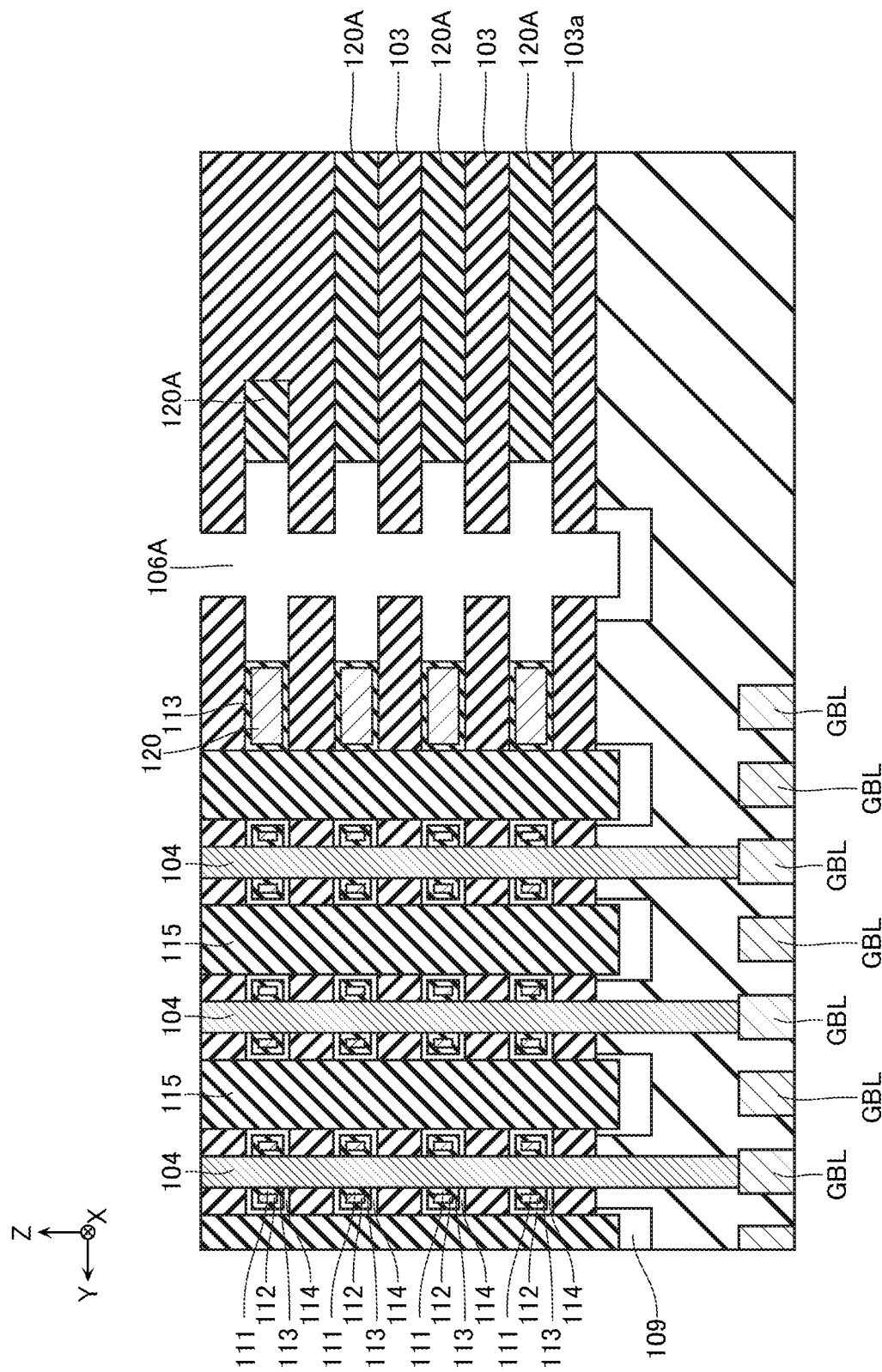
FIG. 53 is a schematic cross-sectional view for describing the manufacturing method.

Next, for example, as illustrated in FIG. 53, the sacrifice layers 106B are removed. This process is performed by wet etching or the like.

Figure 54:
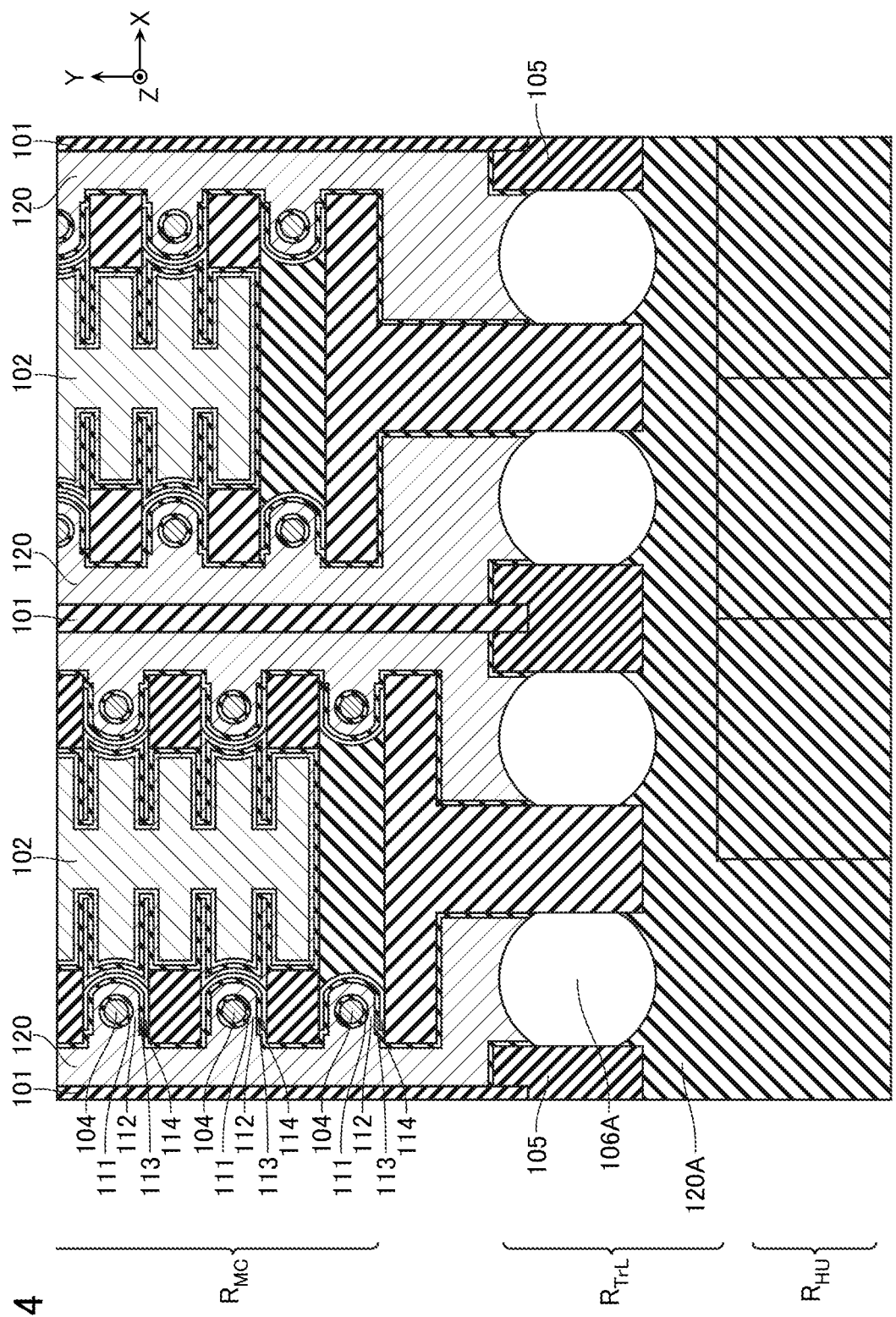
FIG. 54 is a schematic cross-sectional view for describing the manufacturing method.
Figure 55:
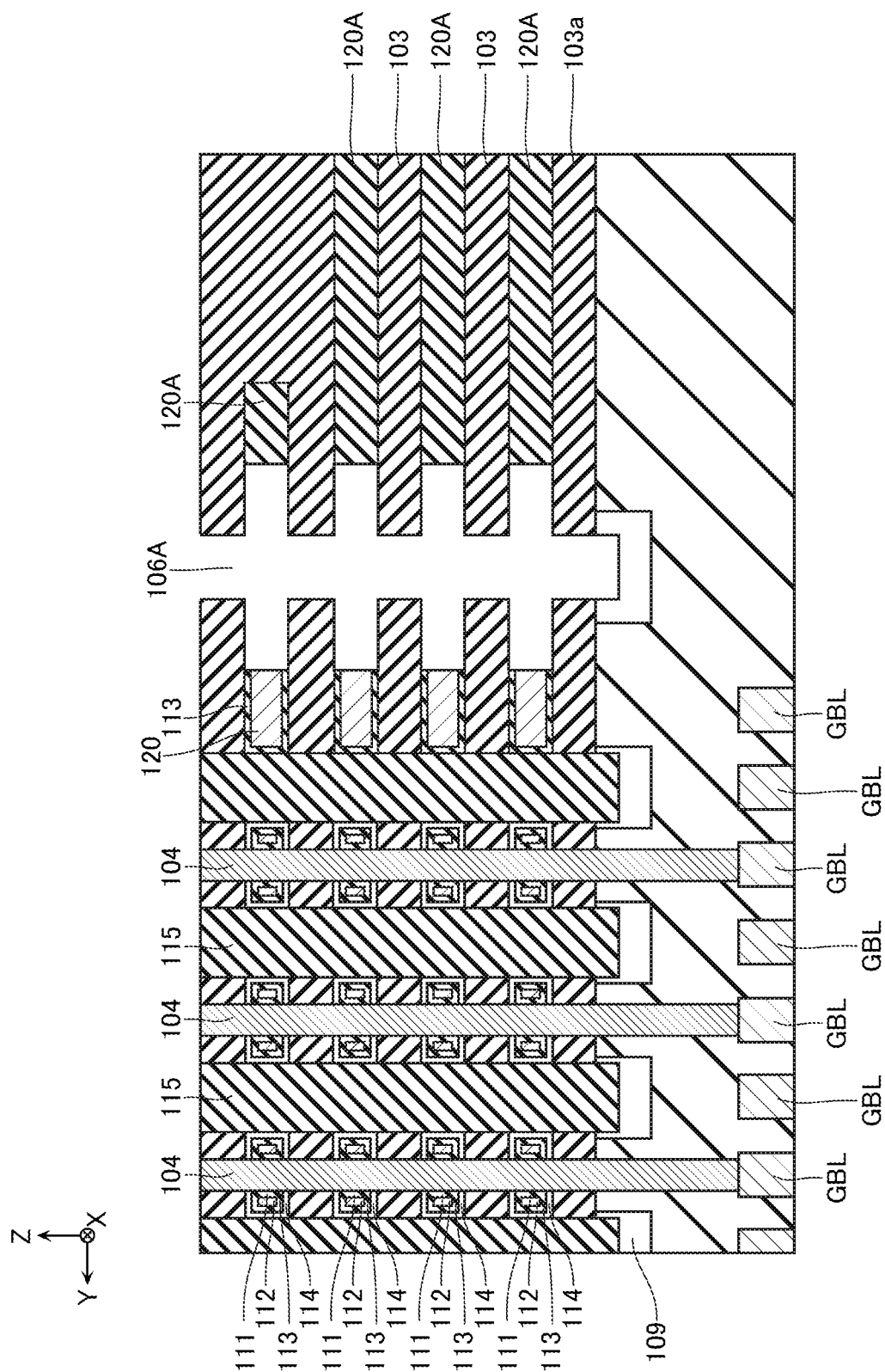
FIG. 55 is a schematic cross-sectional view for describing the manufacturing method.

Next, for example, as illustrated in FIG. 54 and FIG. 55, the insulating layers 113 are partially removed via the openings 106A, thus exposing parts of the conductive layers 120. This process is performed by wet etching or the like.

Figure 56:
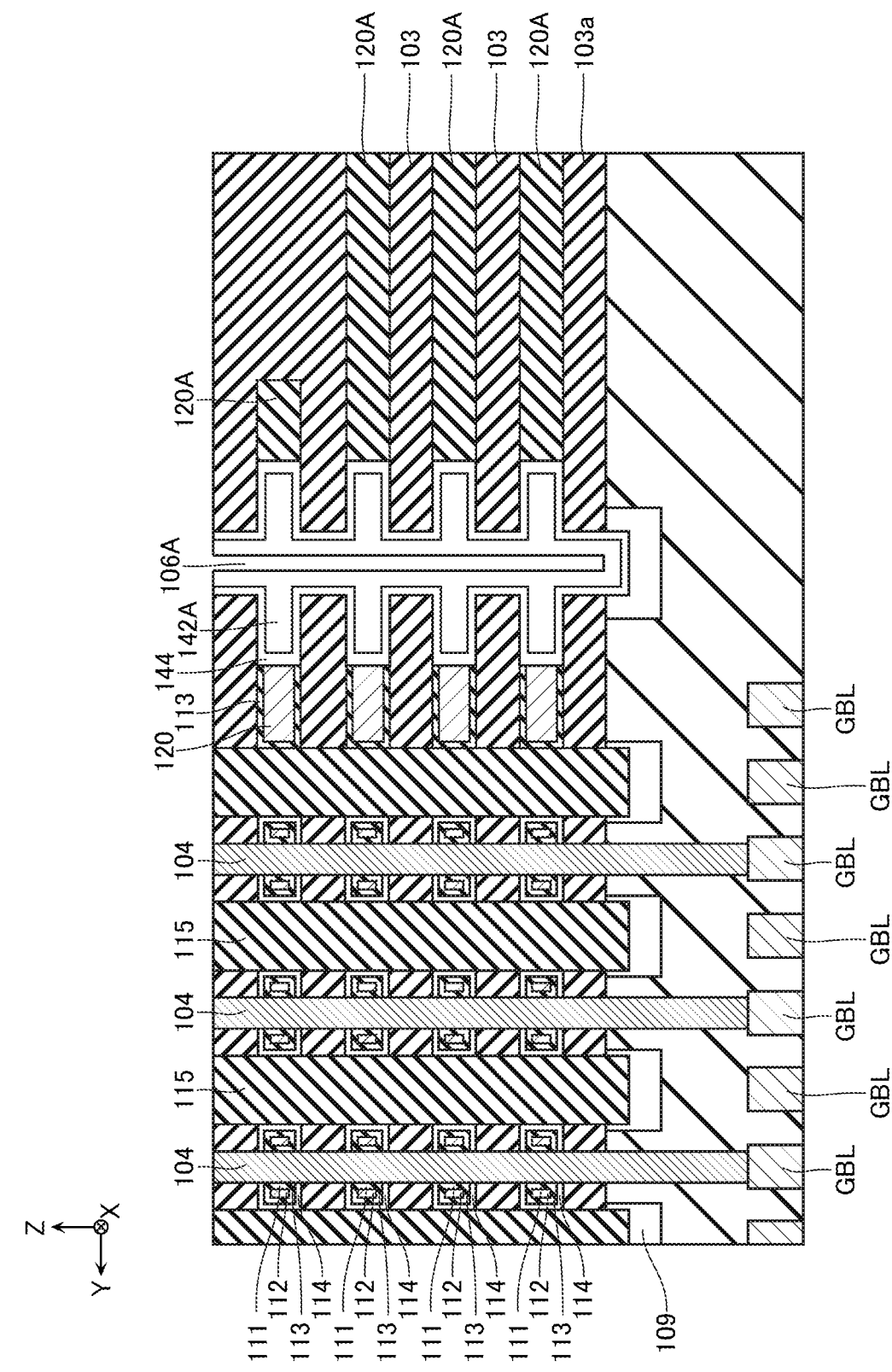
FIG. 56 is a schematic cross-sectional view for describing the manufacturing method.

Next, for example, as illustrated in FIG. 56, the semiconductor layers 144 are formed on side surfaces in the Y-direction of the sacrifice layers 120A and the conductive layers 120, side surfaces in the X-direction of the insulating layers 105 and the insulating layers 115, and upper surfaces and lower surfaces of the insulating layers 103 via the openings 106A. Sacrifice layers 142A are each formed in a region between two insulating layers 103 mutually adjacent in the Z-direction. In this process, regions between two insulating layers 103 mutually adjacent in the Z-direction are filled with the sacrifice layers 142A. Meanwhile, the openings 106A are not filled with the sacrifice layers 142A. This process is performed by, for example, ALD and CVD.

Figure 57:
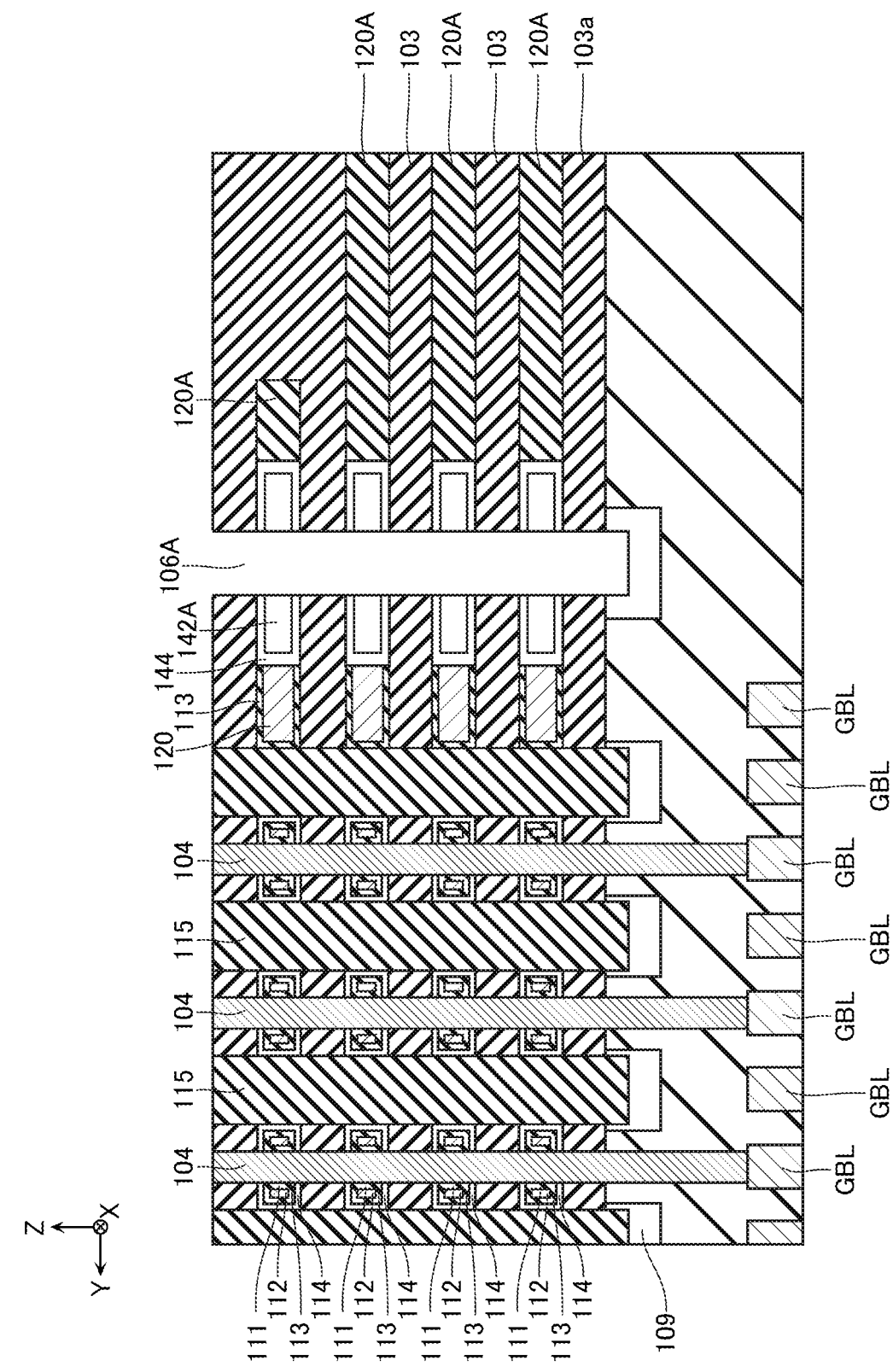
FIG. 57 is a schematic cross-sectional view for describing the manufacturing method.

Next, for example, as illustrated in FIG. 57, the sacrifice layers 142A and the semiconductor layers 144 are partially removed via the openings 106A. In this process, for example, the sacrifice layers 142A are partially removed to expose the parts of the semiconductor layers 144 disposed on the inner peripheral surfaces of the insulating layers 103, and these parts are removed. This process is performed by wet etching or the like.

Figure 58:
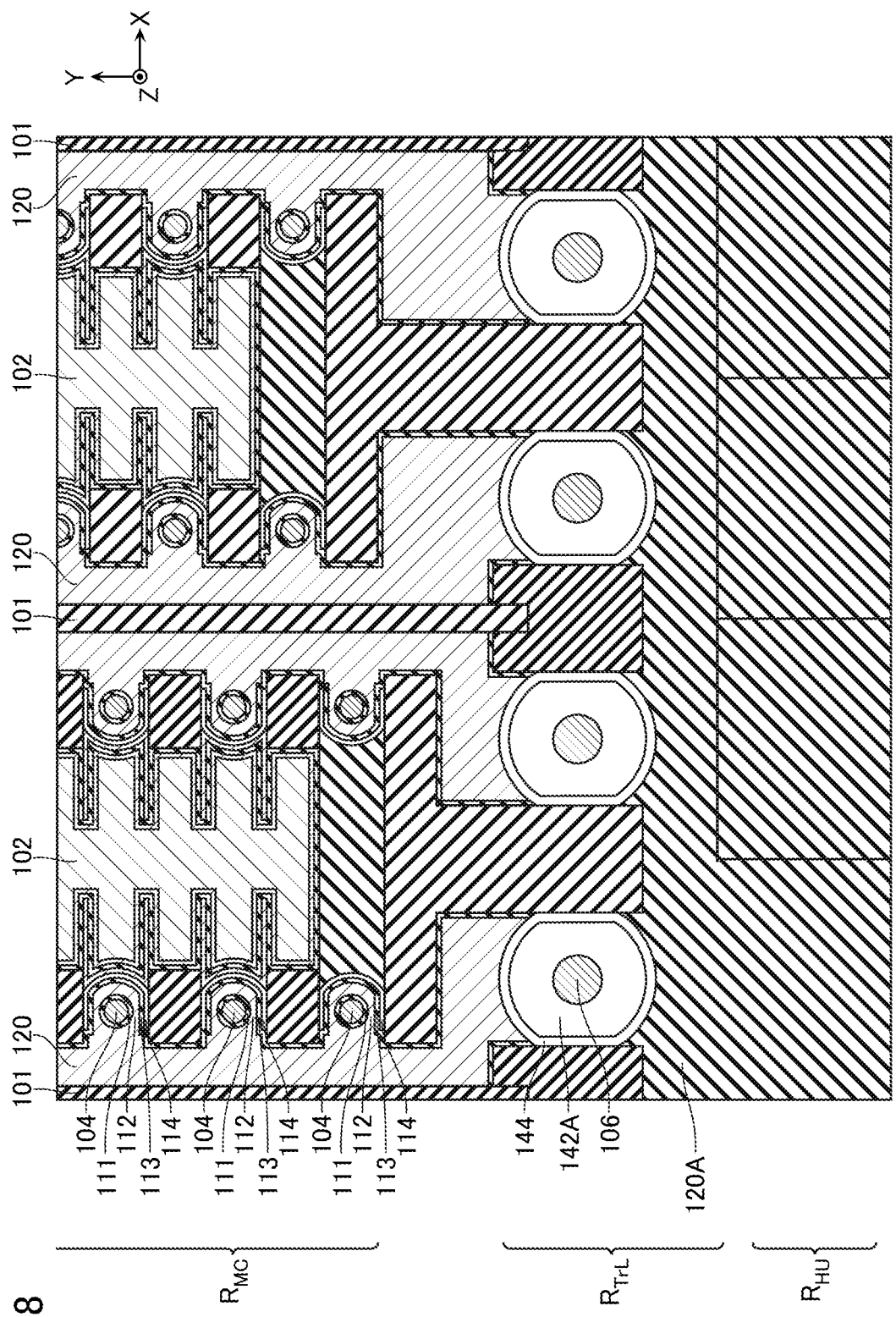
FIG. 58 is a schematic cross-sectional view for describing the manufacturing method.
Figure 59:
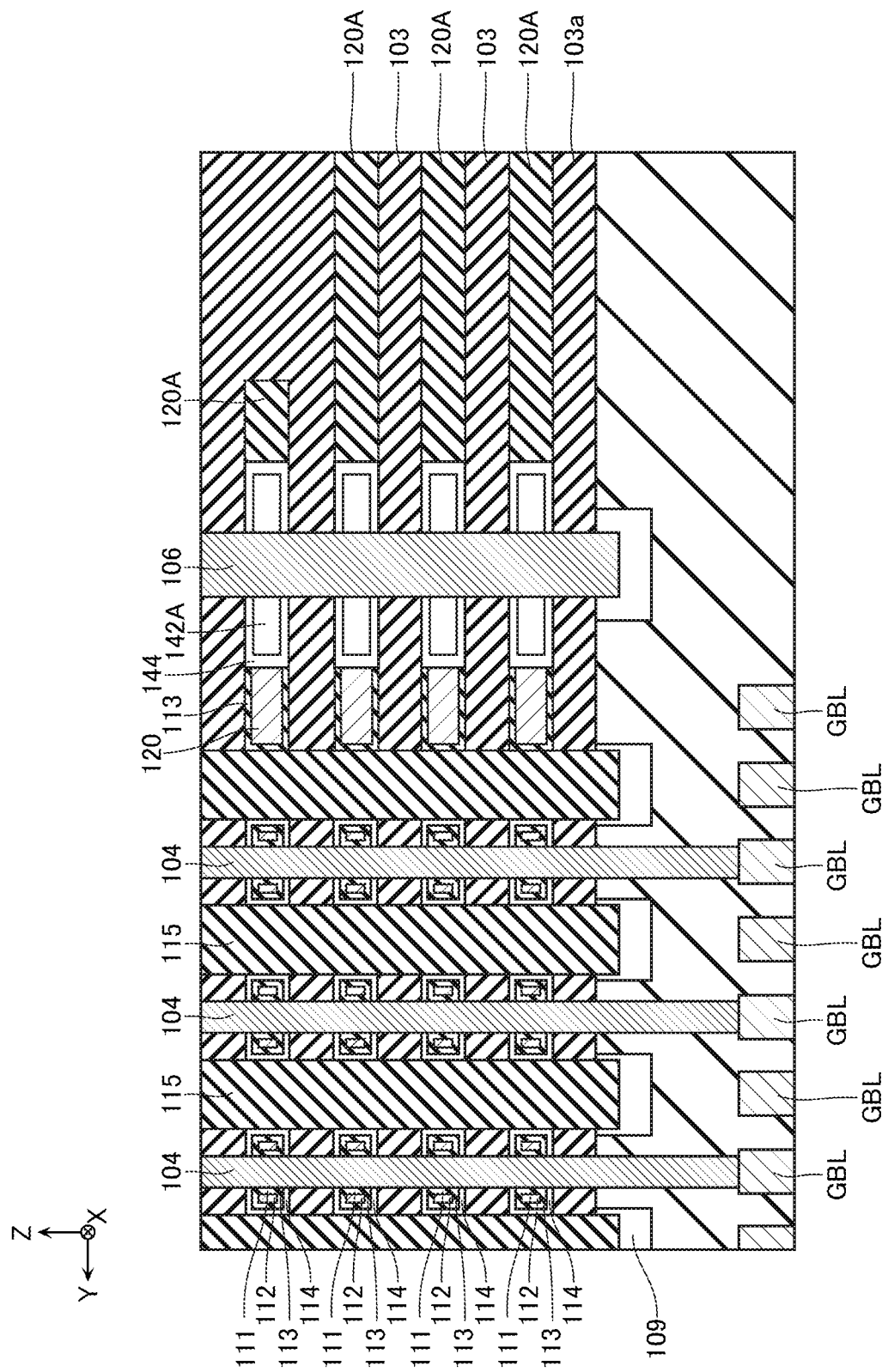
FIG. 59 is a schematic cross-sectional view for describing the manufacturing method.

Next, for example, as illustrated in FIG. 58 and FIG. 59, the conductive layers 106 are formed inside the openings 106A. This process is performed by, for example, ALD and CVD.

Figure 60:
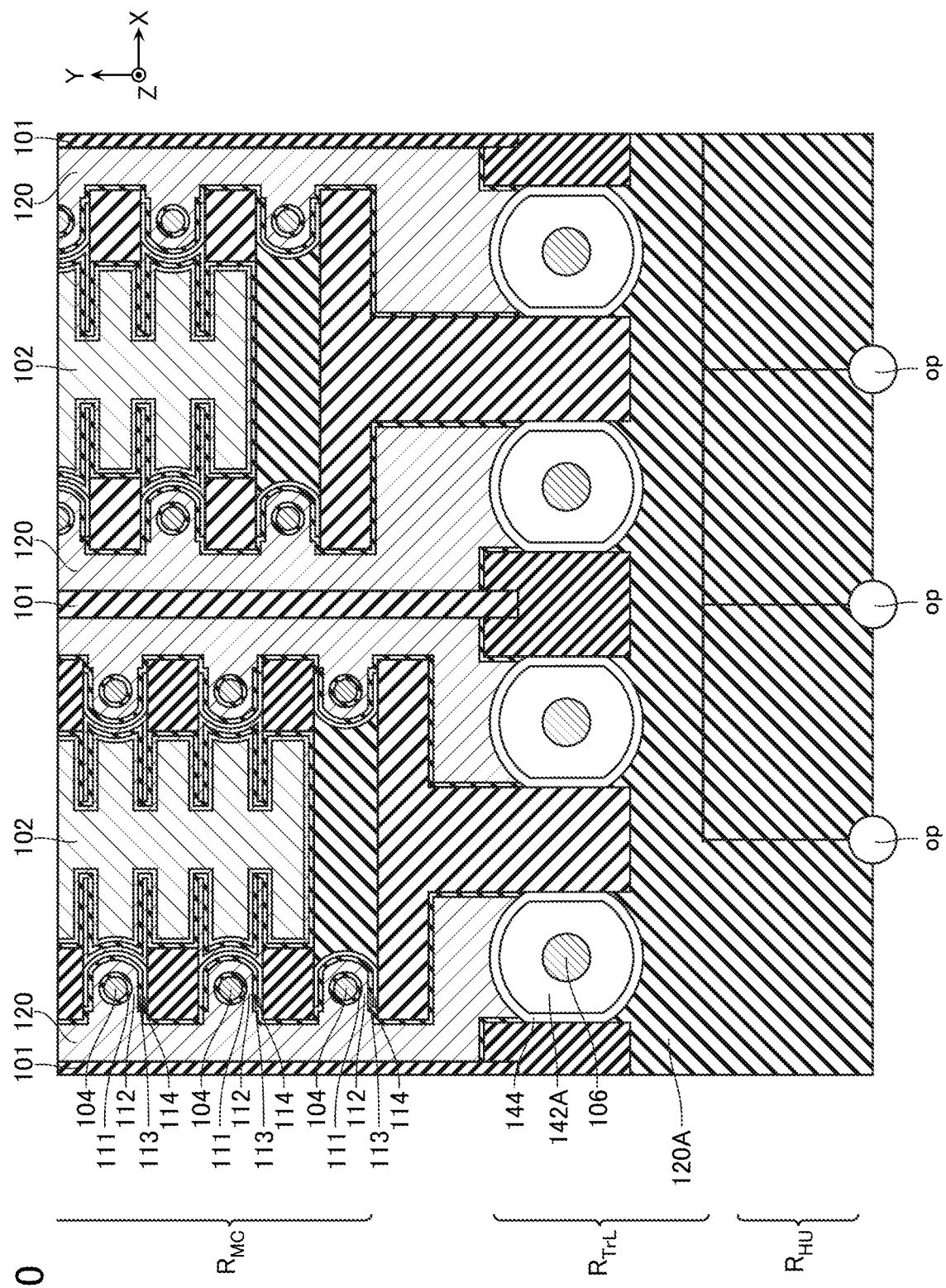
FIG. 60 is a schematic cross-sectional view for describing the manufacturing method.

Next, for example, as illustrated in FIG. 60, a plurality of openings op arranged in the X-direction are formed in the hook-up region $R_{HU}$. The openings op extend in the Z-direction, and penetrate the plurality of insulating layers 103, the plurality of sacrifice layers 120A, and the insulating layer 103a arranged in the Z-direction, thus exposing the upper surfaces of the etching stoppers 109. This process is performed by RIE or the like.

Figure 61:
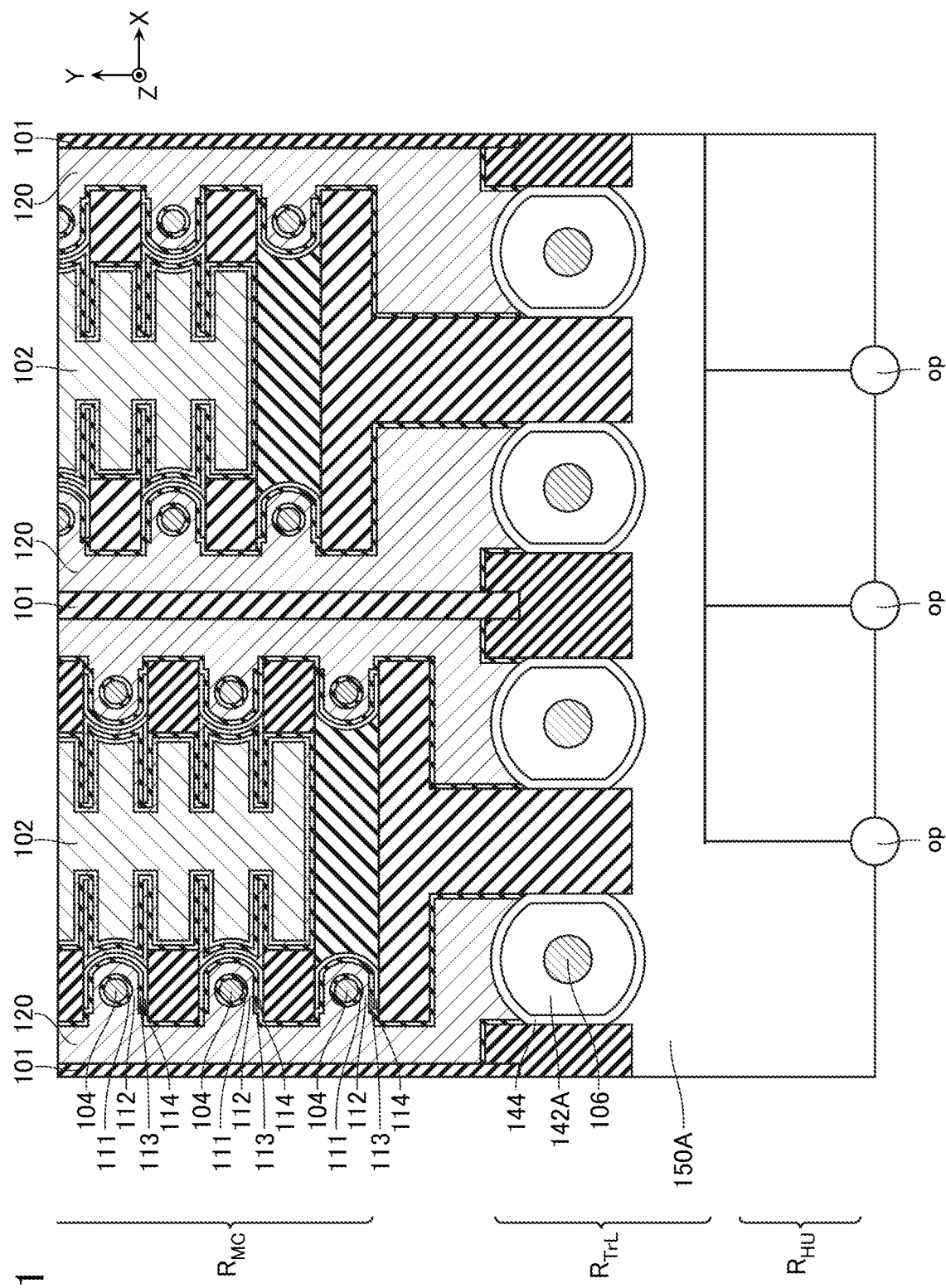
FIG. 61 is a schematic cross-sectional view for describing the manufacturing method.
Figure 62:
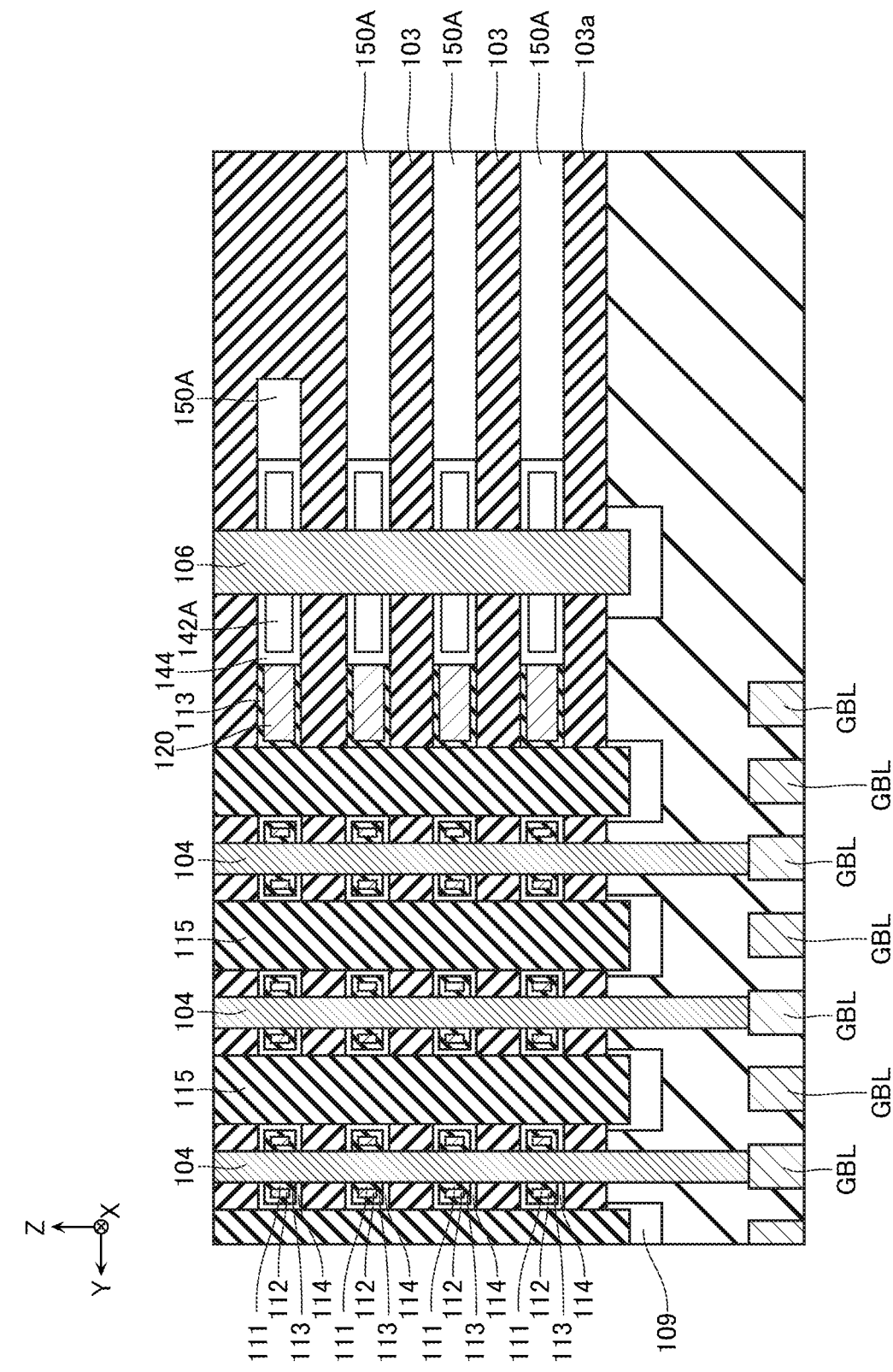
FIG. 62 is a schematic cross-sectional view for describing the manufacturing method.

Next, for example, as illustrated in FIG. 61 and FIG. 62, the sacrifice layers 120A are removed via the openings op. This process is performed by wet etching or the like. In the drawing, openings formed at the portions at which the sacrifice layers 120A were disposed are illustrated as openings 150A.

Figure 63:
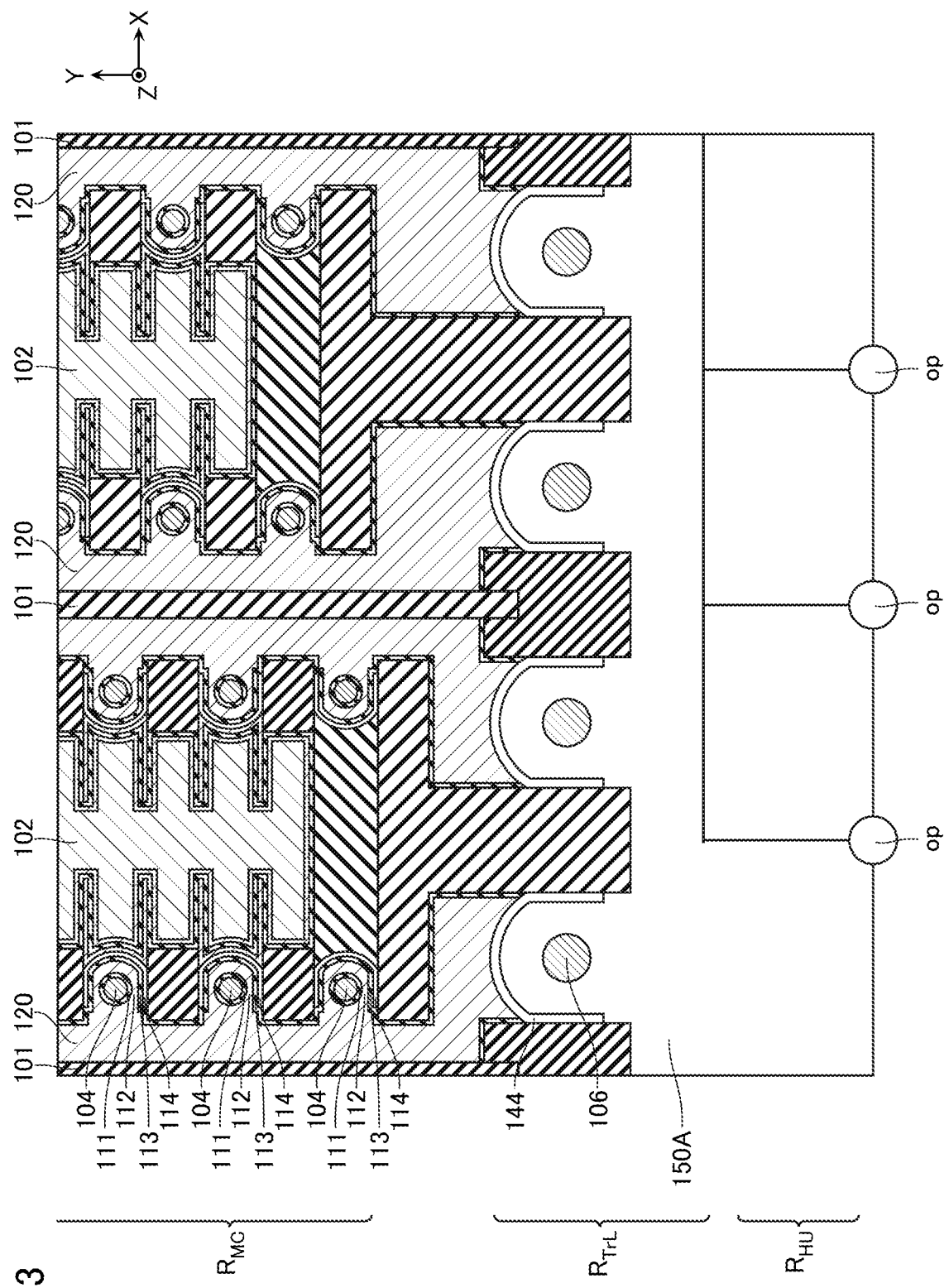
FIG. 63 is a schematic cross-sectional view for describing the manufacturing method.
Figure 64:
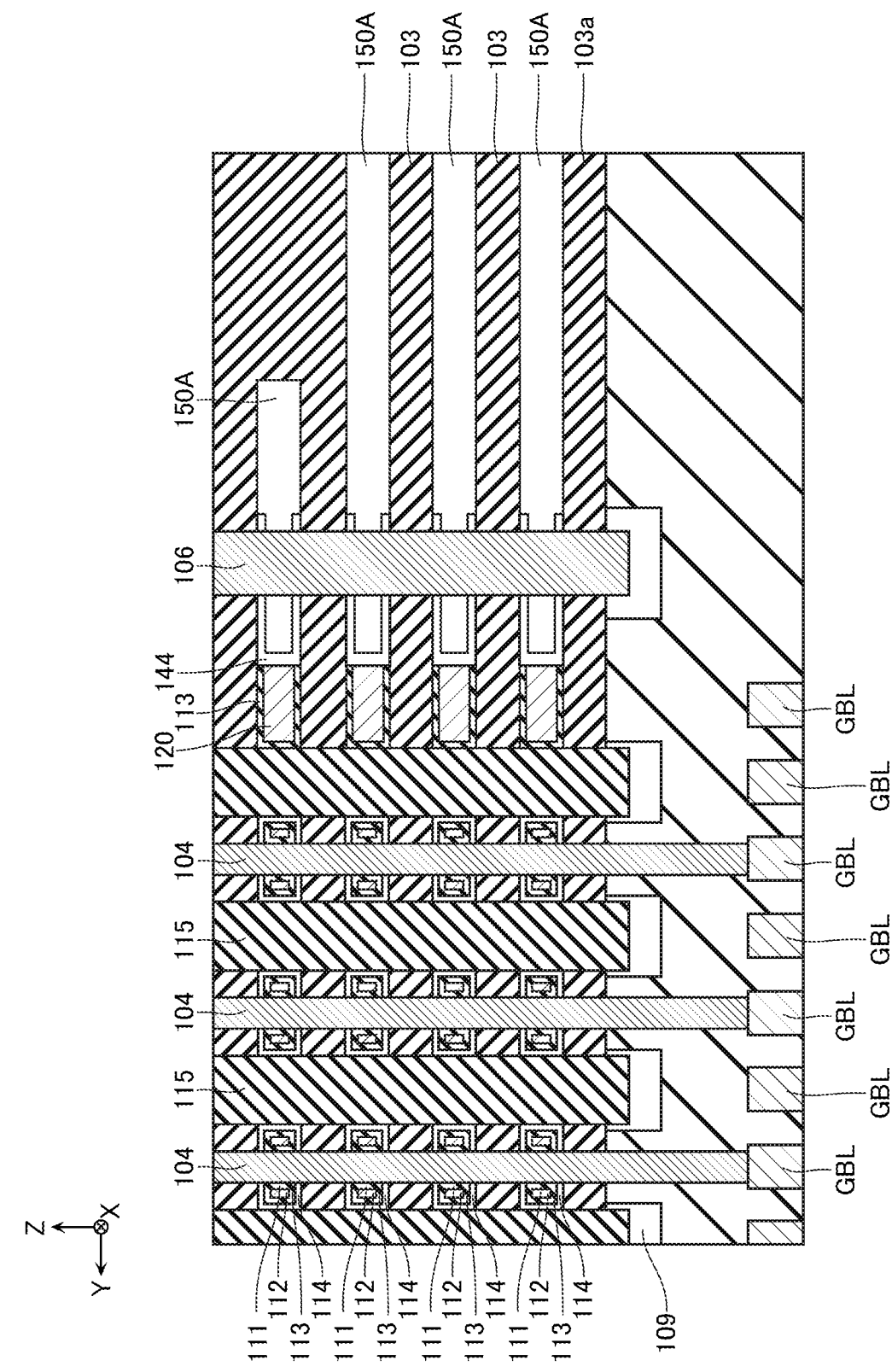
FIG. 64 is a schematic cross-sectional view for describing the manufacturing method.

Next, for example, as illustrated in FIG. 63 and FIG. 64, parts of the semiconductor layers 144 are removed via the openings op, 150A to expose parts of the sacrifice layers 142A. The sacrifice layers 142A are removed via the openings op, 150A to expose the outer peripheral surfaces of the conductive layers 106. This process is performed by wet etching or the like.

Next, for example, as illustrated in FIG. 65 and FIG. 66, the insulating layers 141, 143, 151 are formed and the conductive layers 142, 150 are formed in the openings 150A. In this process, for example, the insulating layers and the conductive layers are formed in the openings op, 150A by CVD or the like. At this time, the openings 150A are filled with the conductive layers. Meanwhile, the openings op are not filled with the conductive layers. Next, for example, in these insulating layers and conductive layers, the parts disposed on the inner peripheral surfaces of the insulating layers 103 are removed by wet etching or the like. Subsequently, the insulating layers are formed inside the openings op.

Effects

As described with reference to FIG. 5 and the like, the semiconductor memory device according to the embodiment includes the plurality of memory layers ML0 to ML3 arranged in the Z-direction. Each of the memory layers ML0 to ML3 includes the plurality of word lines WL0 to WL2. In this configuration, it is necessary to select one memory layer among the plurality of memory layers ML0 to ML3 and further select one word line among the plurality of word lines WL0 to WL2 included in the selected memory layer ML0 to ML3 in the read operation. Therefore, it is necessary to independently apply the voltages to the plurality of word lines WL0 to WL2 included in the plurality of memory layers ML0 to ML3.

For achieving this, for example, it is possible to dispose the contact electrodes 107 as described with reference to FIG. 6, FIG. 10, and FIG. 11 for the number of a product of the number of the memory layers ML0 to ML3 and the number of the word lines WL0 to WL2 included in each of the memory layers ML0 to ML3, and connect these plurality of contact electrodes 107 to the plurality of word lines WL0 to WL2 included in each of the memory layers ML0 to ML3. Additionally, it is possible to connect the plurality of word lines WL0 to WL2 included in each of the memory layers ML0 to ML3 to the peripheral circuit via these plurality of contact electrodes 107.

However, when this method is employed, areas for connecting the contact electrodes 107 to the word lines WL0 to WL2 are increased in some cases. These areas are increased as the number of the memory layers ML arranged in the Z-direction increases. For example, when the number of the memory layers ML is 64 and the number of the word lines WL is 128, the 8192 contact electrodes 107 are necessary.

Therefore, in the semiconductor memory device according to the embodiment, as described with reference to FIG. 6 and the like, the two transistor regions $R_{TrL}$ are disposed in each of the memory layers ML0 to ML3, and a plurality of the transistor structures 140 are disposed in each of these two transistor regions $R_{TrL}$. The gate electrodes of the plurality of transistors TrL corresponding to the respective transistor structures 140 are electrically connected in common via the conductive layer 150 disposed in each of the memory layers ML0 to ML3. The source electrodes of the plurality of transistors TrL corresponding to the plurality of memory layers ML0 to ML3 are commonly connected to the conductive layer 106 extending in the Z-direction.

When this method is employed, the areas for connecting the contact electrodes 107 to the word lines WL0 to WL2 can be significantly reduced in some cases. For example, when the number of the memory layers is 64 and the number of the word lines is 128, the number of the contact electrodes 107 is approximately a product (128) of the number of the memory layers (64) and the number of the hook-up regions $R_{HU}$ (2). Therefore, compared with the above-described example, the areas of the hook-up regions $R_{HU}$ can be reduced to about 1/64.

As described with reference to FIG. 8, FIG. 10, and the like, in the semiconductor memory device according to the embodiment, each of the semiconductor layers 144 is opposed to the upper surface, the lower surface, and the side surfaces in the X-direction of the conductive layer 142.

In this configuration, the channel is formed at the portions opposed to the upper surface, the portion opposed to the lower surface, and the portions opposed to the side surfaces in the X-direction of the conductive layer 142 in the semiconductor layer 144. Therefore, the ON current of the transistor TrL can be relatively increased. Accordingly, the speed-up and the stabilization of the operation can be ensured.

In this configuration, the two transistors TrL mutually adjacent in the Z-direction are mutually adjacent via their respective channel regions. In this configuration, for example, the electrostatic capacity between the gate electrodes can be reduced compared with a structure in which the two transistors TrL mutually adjacent in the Z-direction are mutually adjacent via their respective gate electrodes. Accordingly, the speed-up and the stabilization of the operation can be ensured.

Second Embodiment

The semiconductor memory device according to the first embodiment can execute the read operation, for example, in the aspect as described with reference to FIG. 3 and FIG. 4.

Here, for example, in the example of FIG. 3, the voltages of the layer select lines LL0b, LL1b, LL2b, and LL3b are kept to the voltage $V_{ON}$ for a relatively long period. Therefore, in the example of FIG. 3, the transistors TrL0b, TrL1b, TrL2b, and TrL3b are kept in the ON state for a relatively long period. The time periods of keeping the transistors TrL0b, TrL1b, TrL2b, and TrL3b in the ON state are increased as the number of the word lines WL included in each of the memory layers ML increases in some cases.

In the example of FIG. 4, the time periods of keeping the transistors TrL0b, TrL1b, TrL2b, and TrL3b in the ON state are increased as the number of the memory layers ML is increased in some cases.

Here, when the transistors TrL0b, TrL1b, TrL2b, and TrL3b are continuously kept in the ON state for a long time, the threshold voltages of these transistors TrL0b, TrL1b, TrL2b, and TrL3b possibly fluctuate due to the influence of Bias Temperature Instability (BTI). In this case, the voltage $V_{OFF}$ cannot be appropriately applied to the word lines WL0 to WL2 included in the memory layers ML0 to ML3 other than the memory layer ML0 to ML3 corresponding to the selected memory cell MC, and a leakage current is possibly generated in the transistors TrC in such memory layers ML0 to ML3. Therefore, the electric charges in the capacitors CpC are discharged, thus possibly destroying the data.

Figure 67:
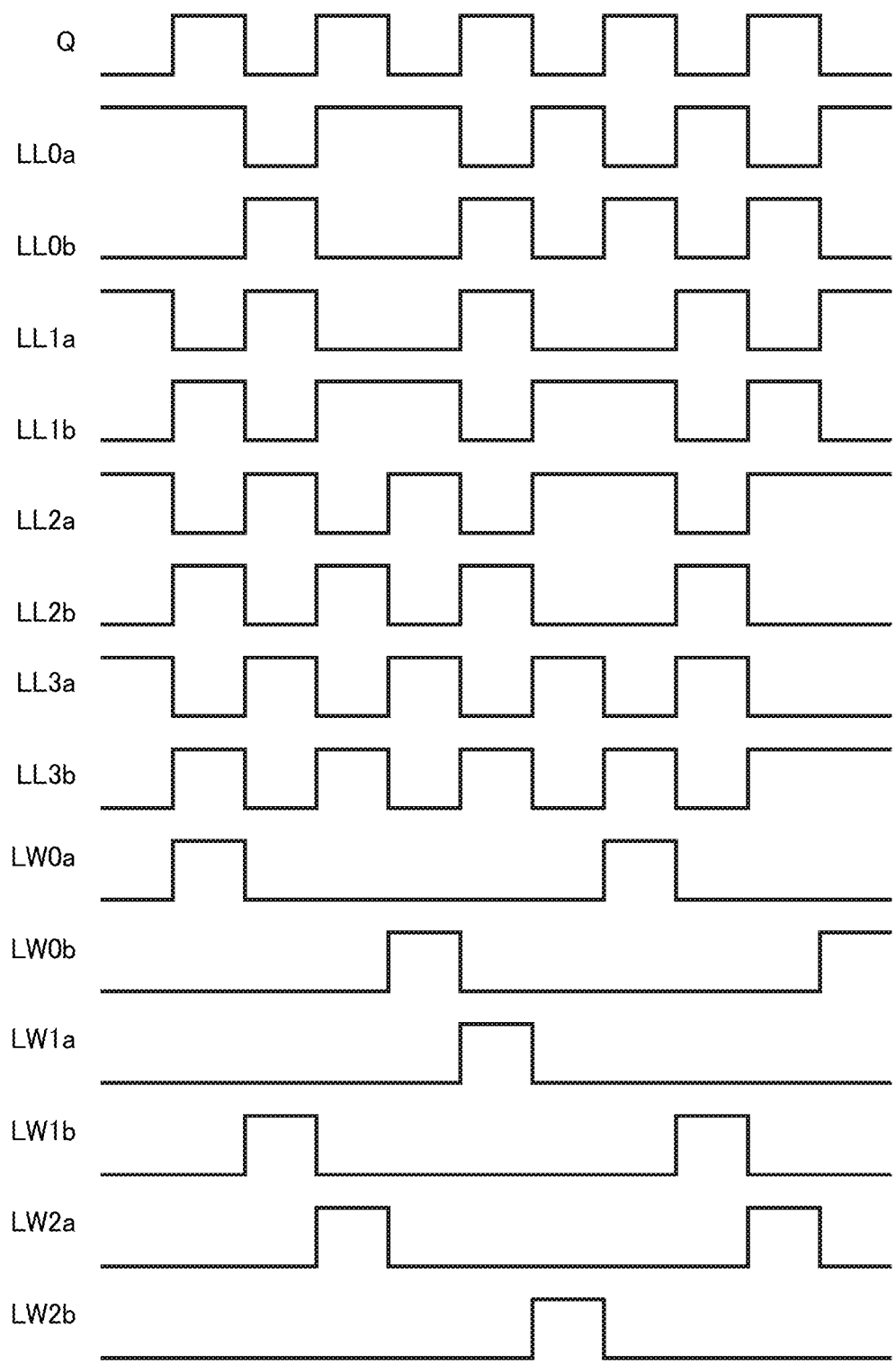
FIG. 67 is a schematic waveform diagram for describing a read operation of a semiconductor memory device according to a second embodiment.
Figure 68:
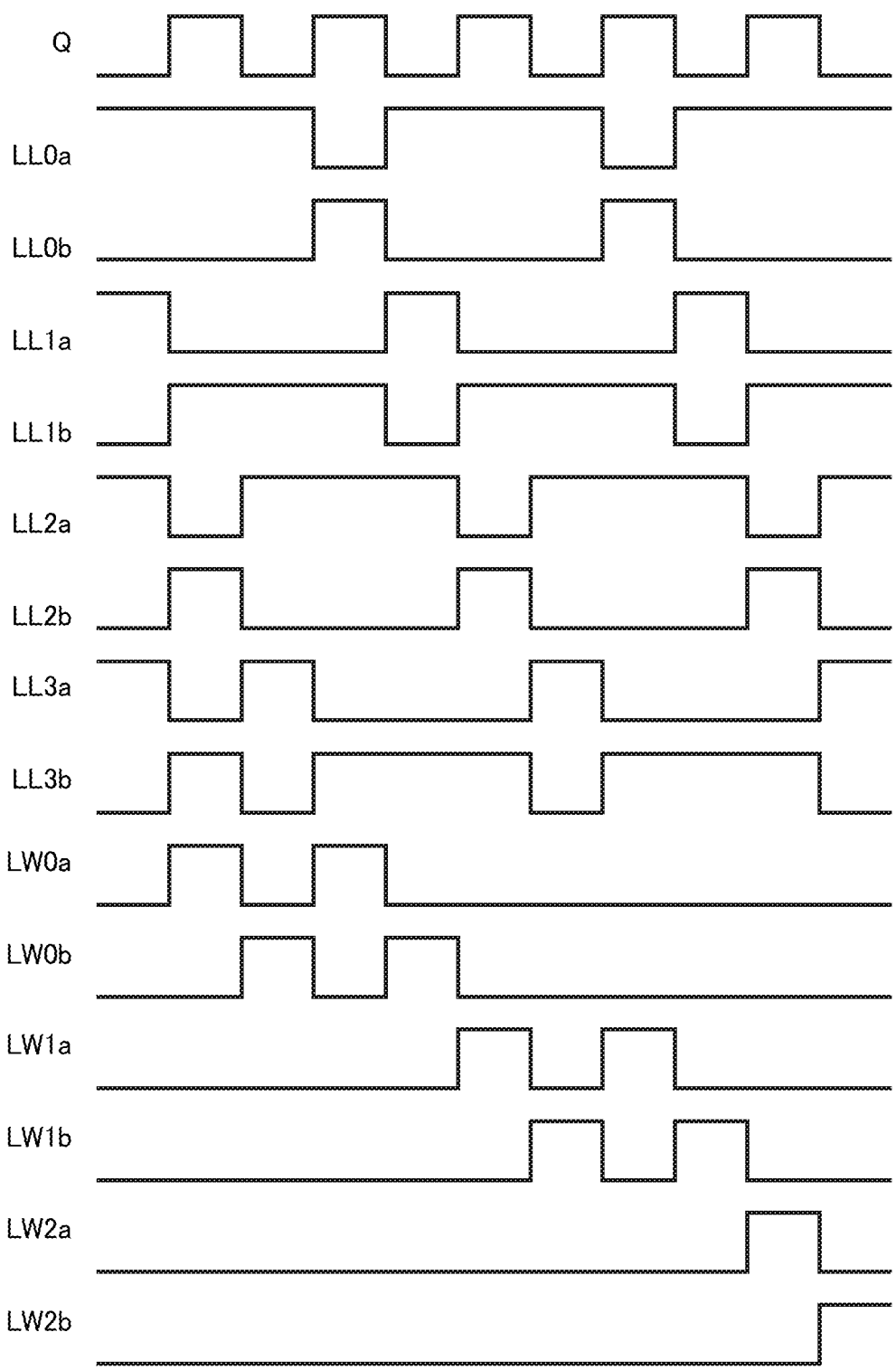
FIG. 68 is a schematic waveform diagram for describing the read operation of the semiconductor memory device according to the second embodiment.
Figure 69:
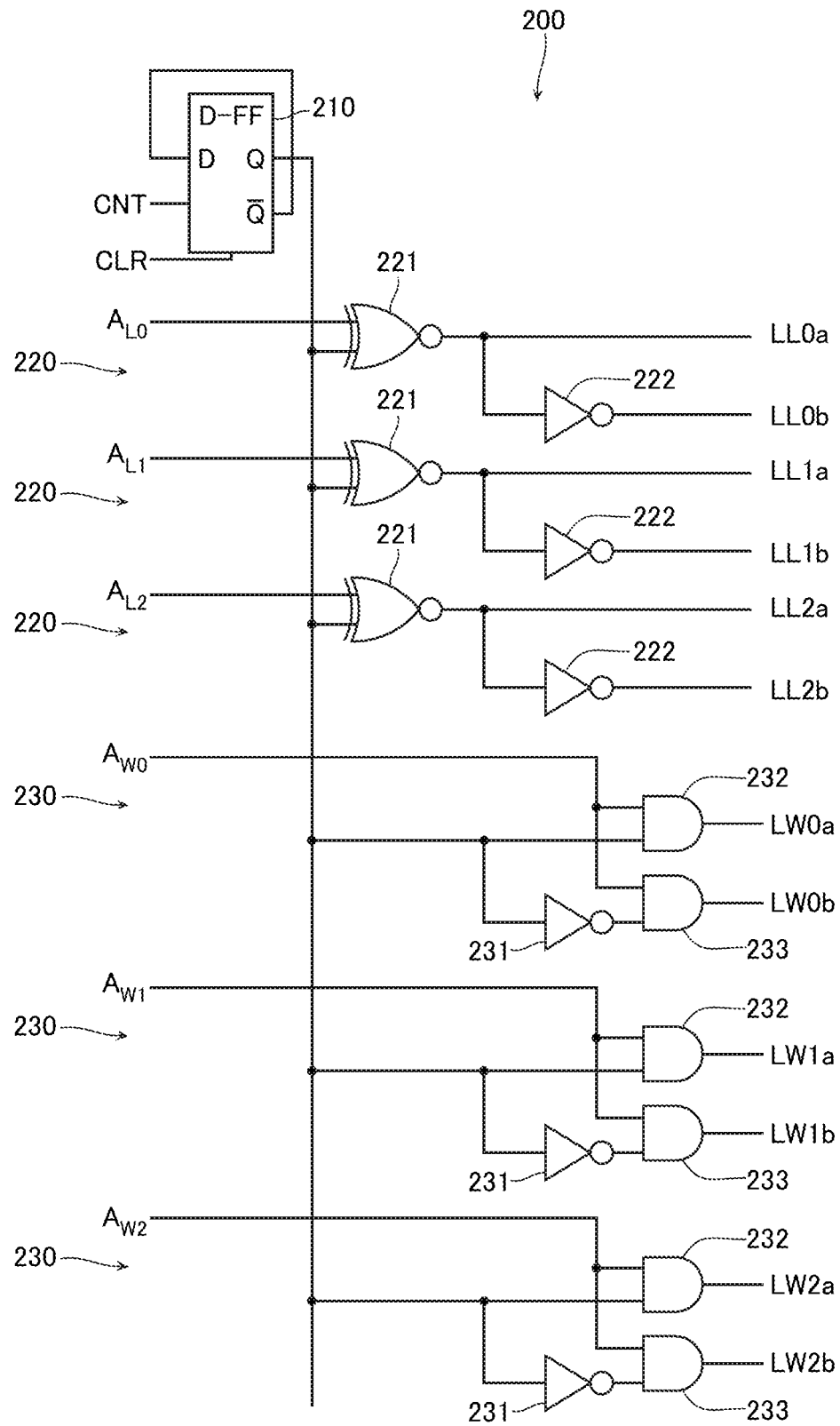
FIG. 69 is a schematic circuit diagram illustrating a part of a configuration of the semiconductor memory device according to the second embodiment.

Next, with reference to FIG. 67 to FIG. 69, a semiconductor memory device according to the second embodiment will be described. FIG. 67 and FIG. 68 are schematic waveform diagrams for describing a read operation of the semiconductor memory device according to the second embodiment. FIG. 69 is a schematic circuit diagram illustrating a part of a configuration the semiconductor memory device according to the second embodiment.

In the semiconductor memory device according to the second embodiment, for example, as illustrated in FIG. 67 and FIG. 68, the voltages of the layer select lines LL are appropriately switched, thereby reducing the influence of the above-described BTI.

For example, in the example of FIG. 67, similarly to the example of FIG. 3, the read operations corresponding to the plurality of word lines WL0 to WL2 included in the memory layer ML0 are sequentially executed, the read operations corresponding to the plurality of word lines WL0 to WL2 included in the memory layer ML1 are sequentially executed, the read operations corresponding to the plurality of word lines WL0 to WL2 included in the memory layer ML2 are sequentially executed, and further, the read operation corresponding to the word line WL0 included in the memory layer ML3 is executed.

However, in the example of FIG. 67, the transistors TrL that apply the voltage to the word lines WL0 to WL2 in the memory layers ML0 to ML3 as targets of the read operation are switched every time the read operation is executed once.

That is, in the example of FIG. 67, in time periods T300, T302, T311, T320, and T322, the voltage is applied to the word lines WL0 to WL2 in the memory layers ML0 to ML3 as the targets of the read operation via the transistors TrL0a, TrL1a, TrL2a, and TrL3a. In these time periods, the voltage is applied to the word lines WL0 to WL2 in the other memory layers ML0 to ML3 via the transistors TrL0b, TrL1b, TrL2b, and TrL3b.

In the example of FIG. 67, in time periods T301, T310, T312, T321, and T330, the voltage is applied to the word lines WL0 to WL2 in the memory layers ML0 to ML3 as the targets of the read operation via the transistors TrL0b, TrL1b, TrL2b, and TrL3b. In these time periods, the voltage is applied to the word lines WL0 to WL2 in the other memory layers ML0 to ML3 via the transistors TrL0a, TrL1a, TrL2a, TrL3a.

For example, in the example of FIG. 68, similarly to the example of FIG. 4, the read operations corresponding to the word lines WL0 included in the respective memory layers ML0 to ML3 are sequentially executed, the read operations corresponding to the word lines WL1 included in the respective memory layers ML0 to ML3 are sequentially executed, and further, the read operations corresponding to the word lines WL2 included in the respective memory layers ML0, ML1 are sequentially executed.

However, in the example of FIG. 68, the transistors TrL that apply the voltage to the word lines WL0 to WL2 in the memory layers ML0 to ML3 as targets of the read operation are switched every time the read operation is executed once.

That is, in the example of FIG. 68, in time periods T400, T402, T410, T412, and T420, the voltage is applied to the word lines WL0 to WL2 as the targets of the read operation in the memory layers ML0 to ML3 via the transistors TrL0a, TrL1a, TrL2a, and TrL3a. In these time periods, the voltage is applied to the other word lines WL0 to WL2 in the memory layers ML0 to ML3 via the transistors TrL0b, TrL1b, TrL2b, and TrL3b.

In the example of FIG. 68, in time periods T401, T403, T411, T413, and T421, the voltage is applied to the word lines WL0 to WL2 as the targets of the read operation in the memory layers ML0 to ML3 via the transistors TrL0b, TrL1b, TrL2b, and TrL3b. In these time periods, the voltage is applied to the other word lines WL0 to WL2 in the memory layers ML0 to ML3 via the transistors TrL0a, TrL1a, TrL2a, and TrL3a.

FIG. 69 illustrates a decode circuit 200 of the semiconductor memory device according to the embodiment.

The decode circuit 200 includes a D flip-flop 210, a plurality of layer select line decode units 220 connected to an output terminal of the D flip-flop 210, and a plurality of word line select line decode units 230 connected to the output terminal of the D flip-flop 210.

The D flip-flop 210 includes a D terminal, a Q terminal, a /Q terminal, and a clock terminal CNT. The /Q terminal is connected to the D terminal. Therefore, a signal of the Q terminal is switched from "H" to "L", or switched from "L" to "H" corresponding to rise of a signal of the clock terminal CNT.

For example, in the examples of FIG. 67 and FIG. 68, the transistors TrL that apply the voltage to the word lines WL0 to WL2 in the memory layers ML0 to ML3 as the targets of the read operation are switched every time the read operation is executed once. In this case, the signal of the clock terminal CNT can be raised every time when the read operation is executed once.

The transistors TrL that apply the voltage to the word lines WL0 to WL2 in the memory layers ML0 to ML3 as the targets of the read operation can be switched every time the read operation is executed multiple times. In this case, the signal of the clock terminal CNT can be raised every time when the read operation is executed multiple times.

The layer select line decode unit 220 includes an XNOR circuit 221 and a NOT circuit 222.

Any of address signals $A_{L0}$, $A_{L1}$, and $A_{L2}$ is input to one input terminal of the XNOR circuit 221. The address signal $A_{L0}$ turns "H" when the memory layer ML0 is selected, and turns "L" in the other cases. The address signal $A_{L1}$ turns "H" when the memory layer ML1 is selected, and turns "L" in the other cases. The address signal $A_{L2}$ turns "H" when the memory layer ML2 is selected, and turns "L" in the other cases. The other input terminal of the XNOR circuit 221 is connected to the Q terminal of the D flip-flop 210. The XNOR circuit 221 has an output terminal connected to any of the layer select lines LL0a, LL1a, and LL2a and an input terminal of the NOT circuit 222.

The XNOR circuit 221 outputs "H", for example, when the signal of the Q terminal is "H" and the input address signal $A_{L0}$, $A_{L1}$, $A_{L2}$ is "H". The XNOR circuit 221 outputs "L", for example, when the signal of the Q terminal is "H" and the input address signal $A_{L0}$, $A_{L1}$, $A_{L2}$ is "L". The XNOR circuit 221 outputs "L", for example, when the signal of the Q terminal is "L" and the input address signal $A_{L0}$, $A_{L1}$, $A_{L2}$ is "H". The XNOR circuit 221 outputs "H", for example, when the signal of the Q terminal is "L" and the input address signal $A_{L0}$, $A_{L1}$, $A_{L2}$ is "L".

The NOT circuit 222 has an output terminal connected to any of the layer select lines LL0b, LL1b, and LL2b.

The NOT circuit 222 outputs "L", for example, when the signal of the Q terminal is "H" and the address signal $A_{L0}$, $A_{L1}$, $A_{L2}$ input to the XNOR circuit 221 is "H". The NOT circuit 222 outputs "H", for example, when the signal of the Q terminal is "H" and the address signal $A_{L0}$, $A_{L1}$, $A_{L2}$ input to the XNOR circuit 221 is "L". The NOT circuit 222 outputs "H", for example, when the signal of the Q terminal is "L" and the address signal $A_{L0}$, $A_{L1}$, $A_{L2}$ input to the XNOR circuit 221 is "H". The NOT circuit 222 outputs "L", for example, when the signal of the Q terminal is "L" and the address signal $A_{L0}$, $A_{L1}$, $A_{L2}$ input to the XNOR circuit 221 is "L".

The word line select line decode unit 230 includes a NOT circuit 231 and AND circuits 232, 233.

The NOT circuit 231 has an input terminal connected to the Q terminal of the D flip-flop 210.

Any of address signals $A_{W0}$, $A_{W1}$, and $A_{W2}$ is input to one input terminal of the AND circuit 232. The address signal $A_{W0}$ turns "H" when the word line WL0 is selected, and turns "L" in the other cases. The address signal $A_{W1}$ turns "H" when the word line WL1 is selected, and turns "L" in the other cases. The address signal $A_{W2}$ turns "H" when the word line WL2 is selected, and turns "L" in the other cases. The other input terminal of the AND circuit 232 is connected to the Q terminal of the D flip-flop 210. The AND circuit 232 has an output terminal connected to any of the word line select lines LW0a, LW1a, and LW2a.

The AND circuit 232 outputs "H", for example, when the signal of the Q terminal is "H" and the input address signal $A_{W0}$, $A_{W1}$, $A_{W2}$ is "H". The AND circuit 232 outputs "L", for example, when at least one of the signal of the Q terminal and the input address signal $A_{W0}$, $A_{W1}$, $A_{W2}$ is "L".

Any of the address signals $A_{W0}$, $A_{W1}$, and $A_{W2}$ is input to one input terminal of the AND circuit 233. The other input terminal of the AND circuit 233 is connected to an output terminal of the NOT circuit 231. The AND circuit 233 has an output terminal connected to any of the word line select lines LW0b, LW1b, and LW2b.

The AND circuit 233 outputs "H", for example, when the signal of the Q terminal is "L" and the input address signal $A_{W0}$, $A_{W1}$, $A_{W2}$ is "H". The AND circuit 233 outputs "L", for example, when at least one of a condition that the signal of the Q terminal is "H" or a condition that the input address signal $A_{W0}$, $A_{W1}$, $A_{W2}$ is "L" is satisfied.

When output signals of the respective configurations in the layer select line decode unit 220 are "H", magnitudes of the voltages of the output signals may be, for example, the voltage $V_{ON}'$. When output signals of the respective configurations in the layer select line decode unit 220 are "L", magnitudes of the voltages of the output signals may be, for example, the voltage $V_{OFF}'$.

Similarly, when output signals of the respective configurations in the word line select line decode unit 230 are "H", magnitudes of the voltages of the output signals may be, for example, the voltage $V_{ON}$. When output signals of the respective configurations in the word line select line decode unit 230 are "L", magnitudes of the voltages of the output signals may be, for example, the voltage $V_{OFF}$.

Other Embodiments

The semiconductor memory devices according to the first embodiment and the second embodiment have been described above. However, the semiconductor memory devices according to these embodiments are merely examples, and the specific configuration, operation, and the like are adjustable, as necessary.

Figure 70:
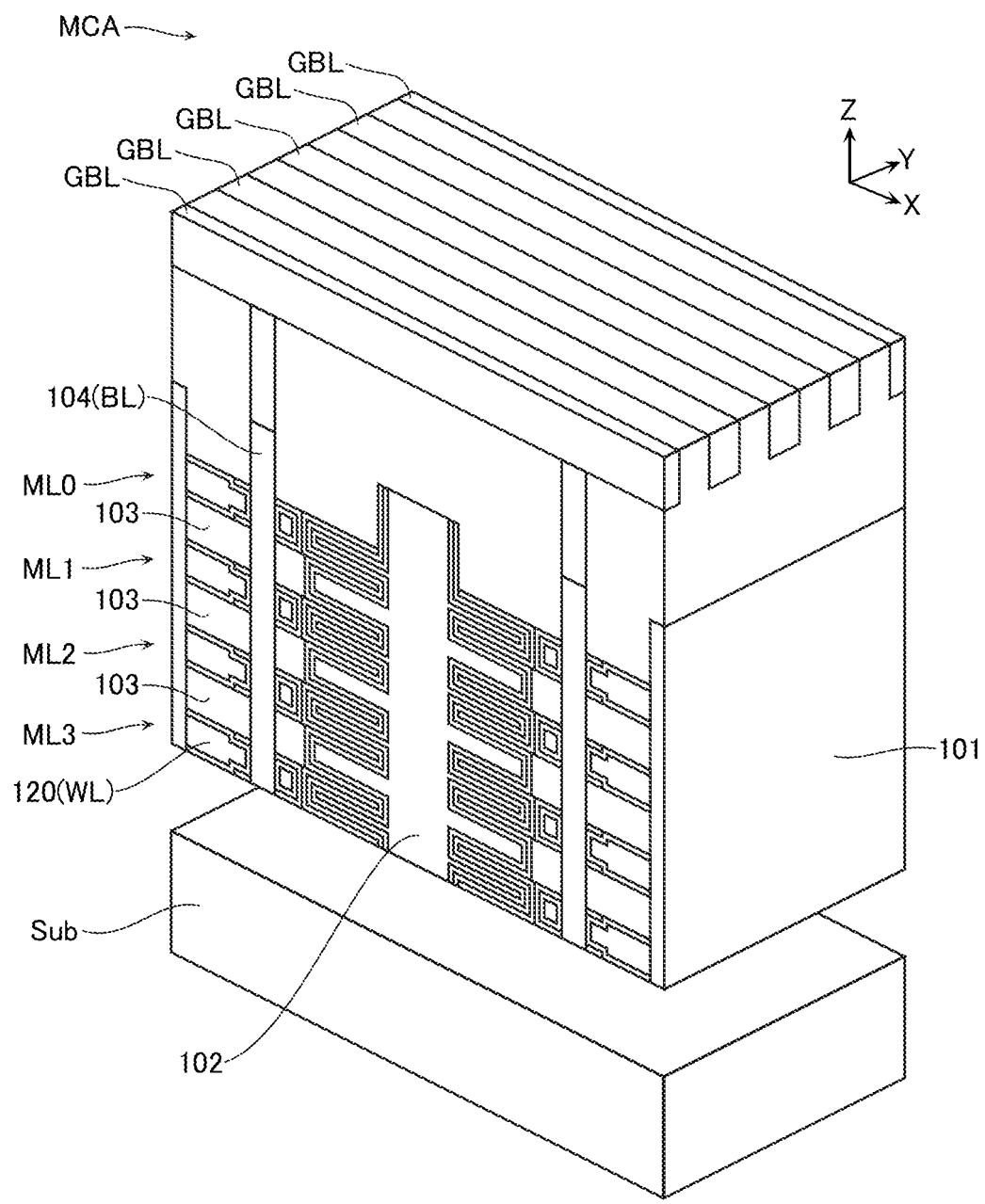
FIG. 70 is a schematic perspective view illustrating a configuration of a semiconductor memory device according to another embodiment.

For example, in the semiconductor memory devices according to the first embodiment and the second embodiment, the global bit lines GBL are disposed below the memory layers ML0 to ML3. However, this configuration is merely an example, and the specific configuration is adjustable, as necessary. For example, as illustrated in FIG. 70, the global bit lines GBL may be disposed above the memory layers ML0 to ML3.

Figure 71:
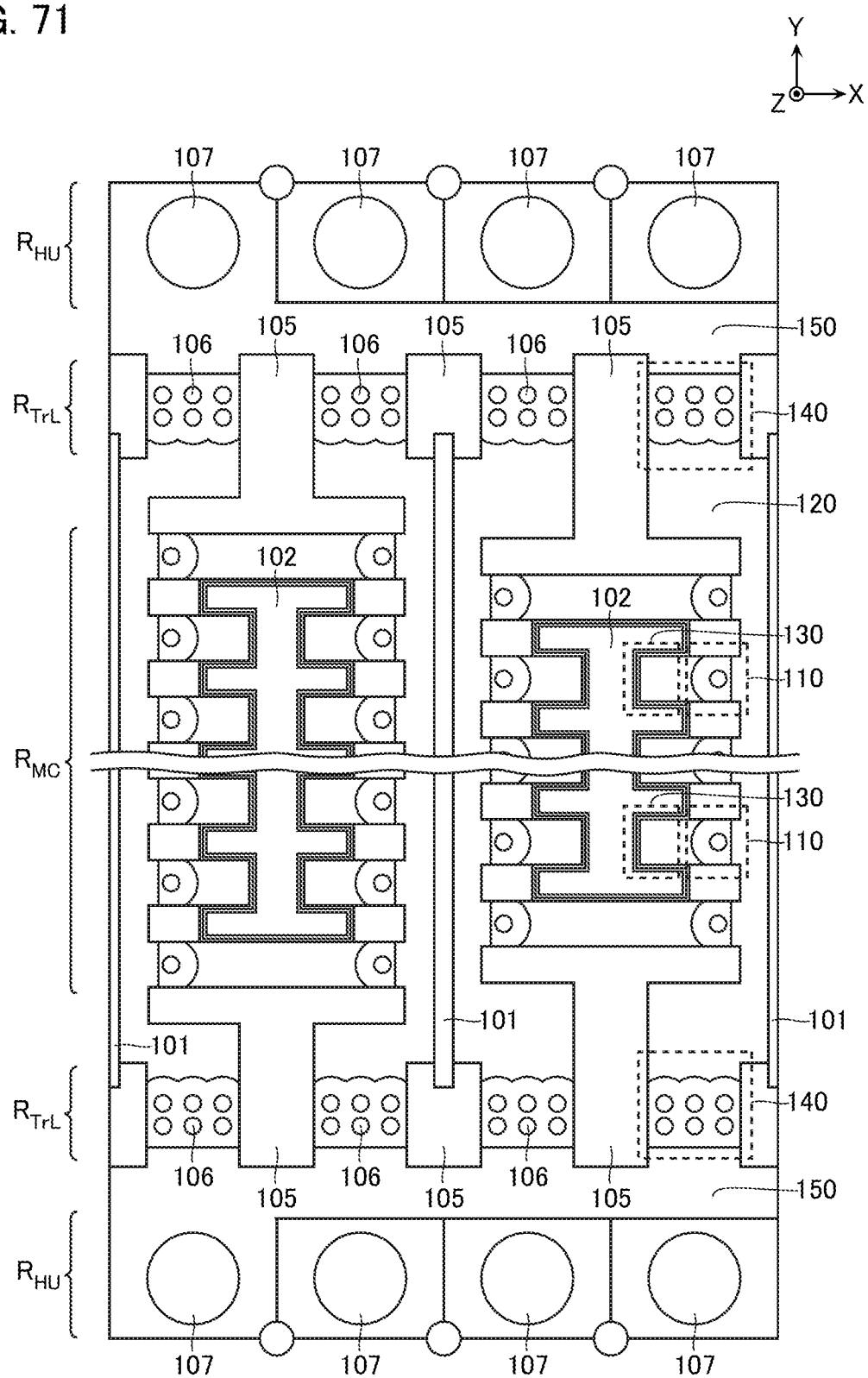
FIG. 71 is a schematic plan view illustrating the configuration of the semiconductor memory device according to the other embodiment.

In the manufacture of the semiconductor memory devices according to the first embodiment and the second embodiment, for example, in the processes described with reference to FIG. 18 to FIG. 22, the openings 104A and the sacrifice layers 104B corresponding to the conductive layers 104 are formed. Additionally, for example, in the processes described with reference to FIG. 23 to FIG. 27, the openings 106A and the sacrifice layers 106B corresponding to the conductive layers 106 are formed. However, this method is merely an example, and the specific method is adjustable, as necessary. For example, the processes described with reference to FIG. 18 to FIG. 22 and the processes described with reference to FIG. 23 to FIG. 27 may be collectively executed. In this case, for example, the inner diameter of the opening 104A (FIG. 18, FIG. 19) and the inner diameter of the opening 106A (FIG. 23, FIG. 24) may be approximately the same size. A plurality of the openings 106A may be formed corresponding to one transistor structure 140. In this case, for example, as illustrated in FIG. 71, a plurality of the conductive layers 106 each having the approximately same size as the conductive layer 104 may be disposed corresponding to one transistor structure 140.

In the above description, the structure in which the two transistors TrC, TrL mutually adjacent in the Z-direction are mutually adjacent via their respective channel regions is employed. However, for example, a structure in which the two transistors TrC, TrL mutually adjacent in the Z-direction are mutually adjacent via their respective gate electrodes may be employed.

In the above description, the example in which the capacitor CpC is employed as the memory unit connected to the transistor structure 110 is described. However, the memory unit does not need to be the capacitor CpC. For example, the memory unit may be one that contains ferroelectric material, ferromagnet material, chalcogen material such as GeSbTe, or another material and stores data using the characteristics of these materials. For example, in any of the structures described above, any of these materials may be included in the insulating layer between the electrodes forming the capacitor CpC.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory units arranged in a first direction;
a plurality of first semiconductor layers arranged in the first direction and electrically connected to the plurality of memory units;
a plurality of first gate electrodes arranged in the first direction and opposed to the plurality of first semiconductor layers;
a first wiring extending in the first direction and connected to the plurality of first semiconductor layers;
a plurality of second wirings arranged in the first direction, extending in a second direction intersecting with the first direction, and connected to the plurality of first gate electrodes;
a plurality of second semiconductor layers arranged in the first direction and disposed at first end portions in the second direction of the plurality of second wirings;

a plurality of second gate electrodes arranged in the first direction and opposed to the plurality of second semiconductor layers;

a plurality of third semiconductor layers arranged in the first direction and disposed at second end portions in the second direction of the plurality of second wirings; and a plurality of third gate electrodes arranged in the first direction and opposed to the plurality of third semiconductor layers.

2. The semiconductor memory device according to claim 1, comprising:

a third wiring extending in the first direction and connected to the plurality of second semiconductor layers; and a fourth wiring extending in the first direction and connected to the plurality of third semiconductor layers.

3. The semiconductor memory device according to claim 2, wherein the semiconductor memory device is configured to be able to execute a first read operation, when one of the plurality of second wirings is assumed to be a fifth wiring, in the first read operation, a first voltage is applied to a second gate electrode opposed to the second semiconductor layer connected to the fifth wiring among the plurality of second gate electrodes, and a second voltage different from the first voltage is applied to at least one of other second gate electrodes, and the second voltage is applied to a third gate electrode opposed to the third semiconductor layer connected to the fifth wiring among the plurality of third gate electrodes, and the first voltage is applied to at least one of other third gate electrodes.

4. The semiconductor memory device according to claim 3, wherein in the first read operation, different voltages are applied to the third wiring and the fourth wiring.

5. The semiconductor memory device according to claim 3, wherein the semiconductor memory device is configured to be able to execute a second read operation, when one of the plurality of second wirings is assumed to be a sixth wiring, in the second read operation, the second voltage is applied to a second gate electrode opposed to the second semiconductor layer connected to the sixth wiring among the plurality of second gate electrodes, and the first voltage is applied to at least one of other second gate electrodes, and the first voltage is applied to a third gate electrode opposed to the third semiconductor layer connected to the sixth wiring among the plurality of third gate electrodes, and the second voltage is applied to at least one of other third gate electrodes.

6. The semiconductor memory device according to claim 5, wherein in the second read operation, different voltages are applied to the third wiring and the fourth wiring.

7. The semiconductor memory device according to claim 2, comprising a first circuit connected to any of the plurality of second gate electrodes and any of the plurality of third gate electrodes, wherein the first circuit includes:

a first input terminal to which first data is input; and a second input terminal to which second data is input, a first voltage is applied to the second gate electrode and a second voltage different from the first voltage is applied to the third gate electrode when the first data is in a first state and the second data is in the first state, the second voltage is applied to the second gate electrode and the first voltage is applied to the third gate electrode when the first data is in the first state and the second data is in a second state different from the first state, the second voltage is applied to the second gate electrode and the first voltage is applied to the third gate electrode when the first data is in the second state and the second data is in the first state, and the first voltage is applied to the second gate electrode and the second voltage is applied to the third gate electrode when the first data is in the second state and the second data is in the second state.

8. The semiconductor memory device according to claim 2, comprising a second circuit connected to the third wiring and the fourth wiring, wherein the second circuit includes:

a third input terminal to which third data is input; and a fourth input terminal to which first data is input, a third voltage is applied to the third wiring and a fourth voltage different from the third voltage is applied to the fourth wiring when the first data is in a first state and the third data is in the first state, the fourth voltage is applied to the third wiring and the third voltage is applied to the fourth wiring when the first data is in a second state different from the first state and the third data is in the first state, and the fourth voltage is applied to the third wiring and the fourth wiring when the third data is in the second state.

9. The semiconductor memory device according to claim 1, wherein the memory unit is a capacitor.

10. The semiconductor memory device according to claim 1, wherein the plurality of first semiconductor layers are opposed to surfaces on one side and the other side of each of the plurality of first gate electrodes in the first direction.

11. The semiconductor memory device according to claim 1, wherein the second semiconductor layer is opposed to surfaces on one side and the other side of the second gate electrode in the first direction, and the third semiconductor layer is opposed to surfaces on one side and the other side of the third gate electrode in the first direction.

12. The semiconductor memory device according to claim 1, wherein each of the first semiconductor layer, the second semiconductor layer, and the third semiconductor layer contains an oxide semiconductor.

13. The semiconductor memory device according to claim 1, wherein each of the first semiconductor layer, the second semiconductor layer, and the third semiconductor layer contains at least one element of gallium (Ga) and aluminum (Al), and contains indium (In), zinc (Zn), and oxygen (O).

14. The semiconductor memory device according to claim 1, comprising a semiconductor substrate, wherein the first direction intersects with a surface of the semiconductor substrate.

15. The semiconductor memory device according to claim 14, comprising
a sense amplifier circuit disposed on the semiconductor substrate and, wherein
the first wiring is electrically connected to the sense amplifier circuit.

16. The semiconductor memory device according to claim 1, comprising
a plurality of seventh wirings arranged in the first direction, extending in a third direction intersecting with the first direction and the second direction, and connected to the plurality of second gate electrodes.

17. The semiconductor memory device according to claim 16, comprising
a plurality of eighth wirings arranged in the first direction, extending in the third direction, and connected to the plurality of third gate electrodes.

18. The semiconductor memory device according to claim 1, comprising:
a plurality of ninth conductive layers arranged in the first direction and disposed at end portions in a third direction intersecting with the first direction and the second direction of the plurality of first semiconductor layers;
a plurality of tenth conductive layers arranged in the first direction and opposed to the plurality of ninth conductive layers in the third direction; and
a plurality of insulating disposed between the plurality of ninth conductive layers and the plurality of tenth conductive layers.

19. The semiconductor memory device according to claim 18, comprising
an eleventh conductive layer extending in the first direction and connected to the plurality of tenth conductive layers.

\* \* \* \* \*